(12) United States Patent
Shin et al.

(10) Patent No.: US 11,793,007 B2
(45) Date of Patent: Oct. 17, 2023

(54) PHOTOELECTRIC CONVERSION DEVICES AND SENSORS AND ELECTRONIC DEVICES

(71) Applicant: Samsung Electronics Co., Ltd., Suwon-si (KR)

(72) Inventors: Jisoo Shin, Suwon-si (KR); Kyung Bae Park, Hwaseong-si (KR); Sung Jun Park, Yongin-si (KR); Jeong Il Park, Seongnam-si (KR); Seon-Jeong Lim, Yongin-si (KR); Youn Hee Lim, Suwon-si (KR); Yeong Suk Choi, Suwon-si (KR); Taejin Choi, Suwon-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 422 days.

(21) Appl. No.: 17/089,181

(22) Filed: Nov. 4, 2020

(65) Prior Publication Data

US 2021/0135136 A1    May 6, 2021

(30) Foreign Application Priority Data

Nov. 5, 2019 (KR) .......................... 10-2019-0140290
Nov. 4, 2020 (KR) .......................... 10-2020-0146152

(51) Int. Cl.
*H01L 23/00* (2006.01)
*H10K 30/30* (2023.01)
(Continued)

(52) U.S. Cl.
CPC .............. *H10K 30/30* (2023.02); *H10K 30/82* (2023.02); *H10K 39/32* (2023.02); *H10K 85/211* (2023.02);
(Continued)

(58) Field of Classification Search
CPC .... H10K 30/30; H10K 85/636; H10K 85/654; H10K 85/655; H10K 85/656; H10K 85/6572; H10K 85/6576
See application file for complete search history.

(56) References Cited

U.S. PATENT DOCUMENTS 6,300,612 B1   10/2001   Yu
7,129,466 B2   10/2006   Iwasaki
(Continued)

FOREIGN PATENT DOCUMENTS

EP   3252051 A1   12/2017
EP   3442022 A1   2/2019
(Continued)

OTHER PUBLICATIONS

Hokuto Seo, "Color Sensors with Three Vertically Stacked Organic Photodetectors" *Japanese Journal of Applied Physics*, vol. 46, No. 49, 2007, L1240-L1242.
(Continued)

*Primary Examiner* — Anthony Ho
(74) *Attorney, Agent, or Firm* — Harness, Dickey & Pierce, P.L.C.

(57) ABSTRACT

A photoelectric conversion device includes a first electrode and a second electrode and a photoelectric conversion layer between the first electrode and the second electrode. The photoelectric conversion layer includes a first material and a second material, the first material and the second material being configured to form a pn junction, and a third material different from the first material and the second material. The third material includes an electron withdrawing group.

31 Claims, 15 Drawing Sheets

(51) Int. Cl.
  *H10K 30/82* (2023.01)
  *H10K 39/32* (2023.01)
  *H10K 85/40* (2023.01)
  *H10K 85/20* (2023.01)
  *H10K 85/60* (2023.01)

(52) U.S. Cl.
  CPC ........... *H10K 85/40* (2023.02); *H10K 85/636* (2023.02); *H10K 85/654* (2023.02); *H10K 85/655* (2023.02); *H10K 85/656* (2023.02); *H10K 85/6572* (2023.02); *H10K 85/6576* (2023.02)

(56) References Cited

U.S. PATENT DOCUMENTS

| | | | |
|---|---|---|---|
| 7,973,307 | B2 | 7/2011 | Rand et al. |
| 8,035,708 | B2 | 10/2011 | Takizawa et al. |
| 8,426,727 | B2 | 4/2013 | Pfeiffer et al. |
| 8,525,577 | B2 | 9/2013 | Yofu et al. |
| 9,818,956 | B2 | 11/2017 | Ro et al. |
| 9,960,362 | B2 | 5/2018 | Bulliard et al. |
| 10,276,802 | B2 | 4/2019 | Shibuya et al. |
| 10,290,812 | B2 | 5/2019 | Lim et al. |
| 10,326,083 | B2 | 6/2019 | Yagi et al. |
| 10,461,256 | B2 | 10/2019 | Choi et al. |
| 10,566,544 | B2 | 2/2020 | Shibuya et al. |
| 2007/0012955 | A1 | 1/2007 | Ihama |
| 2012/0313088 | A1 | 12/2012 | Yofu et al. |
| 2016/0211465 | A1 | 7/2016 | Tadao et al. |
| 2017/0092868 | A1 | 3/2017 | Yagi et al. |
| 2018/0165005 | A1 | 6/2018 | Kwon et al. |
| 2019/0123285 | A1 | 4/2019 | Shin et al. |
| 2019/0172872 | A1 | 6/2019 | Tsutsumi et al. |

FOREIGN PATENT DOCUMENTS

| | | | |
|---|---|---|---|
| EP | 3451400 | A1 | 3/2019 |
| EP | 3493262 | A2 | 6/2019 |
| EP | 3493262 | A3 | 11/2019 |
| KR | 20160052448 | A | 5/2016 |
| KR | 2016-0062708 | A | 6/2016 |
| KR | 20170114839 | A | 10/2017 |
| KR | 20170126753 | A | 11/2017 |
| KR | 2017-0135449 | A | 12/2017 |
| KR | 20170137648 | A | 12/2017 |
| KR | 2019-0044555 | A | 4/2019 |
| WO | WO-2015/042609 | A1 | 3/2015 |
| WO | WO-2020/109822 | A1 | 6/2020 |

OTHER PUBLICATIONS

Mikio Ihama et al., 'CMOS Image Sensor with a Thin Overlaid Panchromatic Organic Photoconductive Layer for Sensors with Reduced Pixel Size' *IDW*, 2009, pp. 2123-2126.

Seon-Jeong Lim et al., "Organic-on-silicon complementary metal-oxide-semiconductorcolour image sensors" *Scientific Reports*, vol. 5, 7708, published Jan. 12, 2015, pp. 1-7.

Satoshi Aihara et al., "Stacked Image Sensor with Green-and Red-Sensitive Organic Photoconductive Films Applying Zinc Oxide Thin-Film Transistors to a Signal Readout Circuit" *IEEE Transactions on Electron Devices*, vol. 56, No. 11, Nov. 2009, pp. 2570-2576.

Paulette Muller et al. "Preparation and Some Reactions of Phenoxazine and Phenoselenazine", J. Org. Chem., 1959, 24, 37.

Y. Kitamoto et al. "Design and Synthesis of Efficient Blue Thermally Activated Delayed Fluorescence Molecules Bearing Triarylborane and 10,10-Dimethyl-5,10-dihydrophenazasiline Moieties", Tetrahedron Letters, 2016, 57, 4914-4917.

Paulette Muller et al. "Preparation and Some Reactions of Phenoxazine and Phenoselenazine", J. Org. Chem., 1959, 24, p. 37-39.

Takahashi, Kazuko et al., "Efficient Synthesis of 2-Iodo and 2-Dicyanomethyl Derivatives of Thiophene, Selenophene, Tellurophene, and Thieno[3,2-b] Thiophene", Heterocycles, vol. 43, No. 9, 1996, p. 1927-1935.

Extended European Search Report dated Mar. 29, 2021 for corresponding European Application No. 20205675.0.

Minwoo Nam et al., "Ternary blend organic solar cells with improved morphological stability", Journal of Materials Chemistry A, vol. 7, No. 16, pp. 9698-9707, 2019, DOI: 10.1039/c9ta00382g.

European Office Action dated Jan. 3, 2023 for corresponding European Application No. 20205675.0.

PHOTOELECTRIC CONVERSION DEVICES AND SENSORS AND ELECTRONIC DEVICES

CROSS-REFERENCE TO RELATED APPLICATIONS

This application claims priority to and the benefit of Korean Patent Application No. 10-2019-0140290 filed in the Korean Intellectual Property Office on Nov. 5, 2019 and Korean Patent Application No. 10-2020-0146152 filed in the Korean Intellectual Property Office on Nov. 4, 2020, the entire contents of each of which are incorporated herein by reference.

BACKGROUND

1. Field

Photoelectric conversion device, sensors, and electronic devices are disclosed.

2. Description of the Related Art

A photoelectric conversion device converts light into an electrical signal using photoelectric effects. The photoelectric conversion device includes a photodiode and a phototransistor, and like, and it may be applied to (e.g., included in) a sensor or a photodetector.

Sensors are increasingly demanding higher resolution, resulting in smaller pixel sizes. At present, silicon photodiodes are widely used, but they may have deteriorated sensitivity since silicon photodiodes have a smaller absorption area due to small pixels. Accordingly, an organic material that is capable of replacing silicon has been researched.

An organic material may have a high extinction coefficient and be configured to selectively absorb light in a particular wavelength spectrum depending on a molecular structure, and thus may simultaneously replace a photodiode and a color filter and resultantly improve sensitivity and contribute to high integration.

However, the organic material may be different from silicon due to its high binding energy and recombination behavior, and it may be difficult to accurately predict the characteristics of organic materials, which may make it difficult to easily control properties required for photoelectric conversion devices.

SUMMARY

Some example embodiments provide a photoelectric conversion device capable of reducing remaining charge carriers and improving charge carriers extraction characteristics.

Some example embodiments provide a sensor including the photoelectric conversion device.

Some example embodiments provide an electronic device including the photoelectric conversion device or the sensor.

According to some example embodiments, a photoelectric conversion device includes a first electrode and a second electrode, and a photoelectric conversion layer between the first electrode and the second electrode, wherein the photoelectric conversion layer includes a first material and a second material which collectively define a pn junction and a third material, the third material being different from the first material and the second material and including an electron withdrawing group.

In some example embodiments, the third material may be an organic material including an electron donating moiety, an electron accepting moiety, and a π-conjugated linking moiety linking the electron donating moiety with the electron accepting moiety, wherein at least one of the electron donating moiety, the electron accepting moiety, or the π-conjugated linking moiety may include the electron withdrawing group.

In some example embodiments, the electron withdrawing group may include a halogen; a cyano group; a nitro group; a C1 to C30 alkyl group substituted with a halogen, a cyano group, a nitro group, or a combination thereof; a C1 to C30 alkoxy group substituted with a halogen, a cyano group, a nitro group, or a combination thereof; a C3 to C30 cycloalkyl group substituted with a halogen, a cyano group, a nitro group, or a combination thereof; a C6 to C30 aryl group substituted with a halogen, a cyano group, a nitro group, or a combination thereof; or a C3 to C30 heteroaryl group substituted with a halogen, a cyano group, a nitro group, or a combination thereof.

In some example embodiments, the electron withdrawing group may include fluorine, a cyano group, or a combination thereof.

In some example embodiments, the electron donating moiety may include the electron withdrawing group and the electron withdrawing group may include a halogen; a cyano group; a nitro group; a C1 to C30 alkyl group substituted with a halogen, a cyano group, a nitro group, or a combination thereof; a C1 to C30 alkoxy group substituted with a halogen, a cyano group, a nitro group, or a combination thereof; a C3 to C30 cycloalkyl group substituted with a halogen, a cyano group, a nitro group, or a combination thereof; a C6 to C30 aryl group substituted with a halogen, a cyano group, a nitro group, or a combination thereof; or a C3 to C30 heteroaryl group substituted with a halogen, a cyano group, a nitro group, or a combination thereof.

In some example embodiments, the electron withdrawing group may include fluorine, a cyano group, or a combination thereof.

In some example embodiments, the third material may be represented by Chemical Formula 1-1.

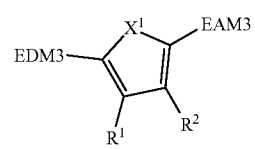

[Chemical Formula 1-1]

In Chemical Formula 1-1, $X^1$ is O, S, Se, Te, SO, $SO_2$, CO, CR'R", NR''', $SiR^aR^b$, or $GeR^cR^d$, EDM3 is the electron donating moiety, EAM3 is the electron accepting moiety, $R^1$, $R^2$, R', R", R''', and $R^a$, $R^b$, $R^c$, and $R^d$ are independently hydrogen, deuterium, a substituted or unsubstituted C1 to C30 alkyl group, a substituted or unsubstituted C1 to C30 alkoxy group, a substituted or unsubstituted C6 to C30 aryl group, a substituted or unsubstituted C3 to C30 heteroaryl group, a halogen, a cyano group, or a nitro group, and $R^1$ and $R^2$, R' and R", $R^a$ and $R^b$, and $R^c$ and $R^d$ are independently present or are linked with each other to form a ring, $X^1$, EDM3, $R^1$, $R^2$, and EAM3 are independently present or adjacent two are linked with each other to form a ring, and at least one of EDM3, EAM3, $R^1$, $R^2$, R', R", R''', $R^a$, $R^b$, $R^c$, or $R^d$ includes an electron withdrawing group.

In some example embodiments, the third material may be represented by one of Chemical Formulae 1-2 to 1-4.

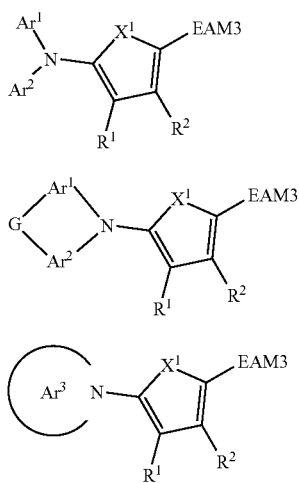

[Chemical Formula 1-2]

[Chemical Formula 1-3]

[Chemical Formula 1-4]

In Chemical Formulae 1-2 to 1-4, $X^1$ is O, S, Se, Te, SO, $SO_2$, CO, CR'R", NR''', $SiR^aR^b$, or $GeR^cR^d$, EAM3 is the electron accepting moiety, $Ar^1$ and $Ar^2$ are independently hydrogen, deuterium, a substituted or unsubstituted C1 to C30 alkyl group, a substituted or unsubstituted C1 to C30 alkoxy group, a substituted or unsubstituted C3 to C30 cycloalkyl group, a substituted or unsubstituted C6 to C30 aryl group, or a substituted or unsubstituted C3 to C30 heteroaryl group, at least one of $Ar^1$ or $Ar^2$ is a C1 to C30 alkyl group substituted with a halogen, a cyano group, a nitro group, or a combination thereof; a C1 to C30 alkoxy group substituted with a halogen, a cyano group, a nitro group, or a combination thereof; a C3 to C30 cycloalkyl group substituted with a halogen, a cyano group, a nitro group, or a combination thereof; a C6 to C30 aryl group substituted with a halogen, a cyano group, a nitro group, or a combination thereof; or a C3 to C30 heteroaryl group substituted with a halogen, a cyano group, a nitro group, or a combination thereof, $Ar^3$ is a nitrogen-containing cyclic group substituted with a halogen, a cyano group, a nitro group, or a combination thereof, G is a single bond, —O—, —S—, —Se—, —Te—, —N═, —$NR^e$—, —$(CR^fR^g)_{n2}$— (n2 is 1 or 2), —$SiR^hR^i$—, —$GeR^jR^k$—, —$(C(R^l)═C(R^m))$—, or $SnR^nR^o$, and $R^1$, $R^2$, R', R", R''', $R^a$, $R^b$, $R^c$, $R^d$, $R^e$, $R^f$, $R^g$, $R^h$, $R^i$, $R^j$, $R^k$, $R^l$, $R^m$, $R^n$, and $R^o$ are independently hydrogen, deuterium, a substituted or unsubstituted C1 to C30 alkyl group, a substituted or unsubstituted C1 to C30 alkoxy group, a substituted or unsubstituted C6 to C30 aryl group, a substituted or unsubstituted C3 to C30 heteroaryl group, a halogen, a cyano group, or a nitro group, and $R^1$ and $R^2$, R' and R", $R^a$ and $R^b$, $R^c$ and $R^d$, $R^f$ and $R^g$, $R^h$ and $R^i$, $R^j$ and $R^k$, $R^l$ and $R^m$, and $R^n$ and $R^o$ are independently present or are linked with each other to form a ring.

In some example embodiments, at least one of $Ar^1$ or $Ar^2$ of Chemical Formula 1-2 or 1-3 may be a phenyl group substituted with a halogen, a cyano group, a nitro group, or a combination thereof; a naphthyl group substituted with a halogen, a cyano group, a nitro group, or a combination thereof; an anthracenyl group substituted with a halogen, a cyano group, a nitro group, or a combination thereof; a phenanthrenyl group substituted with a halogen, a cyano group, a nitro group, or a combination thereof; a pyridinyl group substituted with a halogen, a cyano group, a nitro group, or a combination thereof; a pyridazinyl group substituted with a halogen, a cyano group, a nitro group, or a combination thereof; a pyrimidinyl group substituted with a halogen, a cyano group, a nitro group, or a combination thereof; a pyrazinyl group substituted with a halogen, a cyano group, a nitro group, or a combination thereof; a quinolinyl group substituted with a halogen, a cyano group, a nitro group, or a combination thereof; an isoquinolinyl group substituted with a halogen, a cyano group, a nitro group, or a combination thereof; a naphthyridinyl group substituted with a halogen, a cyano group, a nitro group, or a combination thereof; a cinnolinyl group substituted with a halogen, a cyano group, a nitro group, or a combination thereof; a quinazolinyl group substituted with a halogen, a cyano group, a nitro group, or a combination thereof; a phthalazinyl group substituted with a halogen, a cyano group, a nitro group, or a combination thereof; a benzotriazinyl group substituted with a halogen, a cyano group, a nitro group, or a combination thereof; a pyridopyrazinyl group substituted with a halogen, a cyano group, a nitro group, or a combination thereof; a pyridopyrimidinyl group substituted with a halogen, a cyano group, a nitro group, or a combination thereof; or a pyridopyridazinyl group substituted with a halogen, a cyano group, a nitro group, or a combination thereof.

In some example embodiments, at least one of $Ar^1$ or $Ar^2$ of Chemical Formula 1-2 or 1-3 may be a fluorine-substituted phenyl group, a fluorine-substituted naphthyl group, a fluorine-substituted anthracenyl group, a fluorine-substituted phenanthrenyl group, a fluorine-substituted pyridinyl group, a fluorine-substituted pyridazinyl group, a fluorine-substituted pyrimidinyl group, a fluorine-substituted pyrazinyl group, a fluorine-substituted quinolinyl group, a fluorine-substituted isoquinolinyl group, a fluorine-substituted naphthyridinyl group, a fluorine-substituted cinnolinyl group, fluorine-substituted quinazolinyl group, a fluorine-substituted phthalazinyl group, a fluorine-substituted benzotriazinyl group, a fluorine-substituted pyridopyrazinyl group, a fluorine-substituted pyridopyrimidinyl group, or a fluorine-substituted pyridopyridazinyl group.

In some example embodiments, the third material may be represented by Chemical Formulae 1-2a or 1-3a.

[Chemical Formula 1-2a]

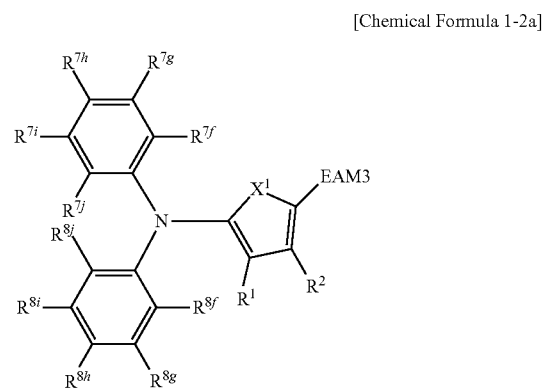

-continued

[Chemical Formula 1-3a]

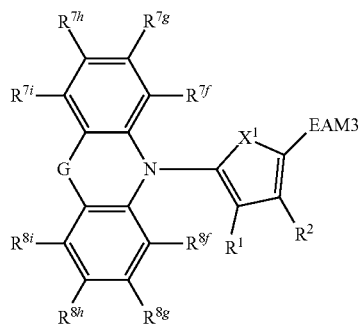

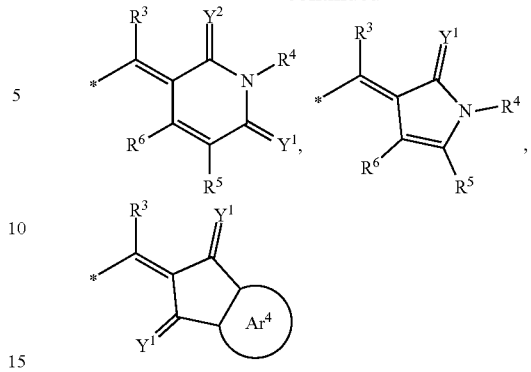

In Chemical Formula 1-2a or 1-3a, $X^1$ is O, S, Se, Te, SO, $SO_2$, CO, CR'R", NR'", $SiR^aR^b$, or $GeR^cR^d$, EAM3 is the electron accepting moiety, G is a single bond, —O—, —S—, —Se—, —Te—, —N=, —$NR^e$—, —$(CR^fR^g)_{n2}$— (n2 is 1 or 2), —$SiR^hR^i$—, —$GeR^jR^k$—, —$(C(R^l)=C(R^m))$—, or $SnR^nR^o$, $R^1$, $R^2$, R', R", R'", $R^a$, $R^b$, $R^c$, $R^d$, $R^e$, $R^f$, $R^g$, $R^h$, $R^i$, $R^j$, $R^k$, $R^l$, $R^m$, $R^n$, $R^o$, $R^{7f}$, $R^{7g}$, $R^{7h}$, $R^{7i}$, $R^{7j}$, $R^{8f}$, $R^{8g}$, $R^{8h}$, $R^{8i}$, or $R^{8j}$ are independently hydrogen, deuterium, a substituted or unsubstituted C1 to C30 alkyl group, a substituted or unsubstituted C1 to C30 alkoxy group, a substituted or unsubstituted C6 to C30 aryl group, a substituted or unsubstituted C3 to C30 heteroaryl group, a halogen, a cyano group, or a nitro group, $R^{7f}$, $R^{7g}$, $R^{7h}$, $R^{7i}$, and $R^{7j}$ are independently present or adjacent two thereof are linked with each other to form a fused ring, $R^{8f}$, $R^{8g}$, $R^{8h}$, $R^{8i}$, and $R^{8j}$ are independently present or adjacent two thereof are linked with each other to form a fused ring, and at least one of $R^{7f}$, $R^{7g}$, $R^{7h}$, $R^{7i}$, $R^{7j}$, $R^{8f}$, $R^{8g}$, $R^{8h}$, $R^{8i}$, or $R^{8j}$ is an electron withdrawing group, the electron withdrawing group including a halogen; a cyano; a nitro group; a C1 to C30 alkyl group substituted with a halogen, cyano group, a nitro group, or a combination thereof a C1 to C30 alkoxy group substituted with a halogen, a cyano group, a nitro group, or a combination thereof; a C3 to C30 cycloalkyl group substituted with a halogen, a cyano group, a nitro group, or a combination thereof; a C6 to C30 aryl group substituted with a halogen, a cyano group, a nitro group, or a combination thereof; or a C3 to C30 heteroaryl group substituted with a halogen, a cyano group, a nitro group, or a combination thereof.

In some example embodiments, the EAM3 may be one group of a set of groups listed in Group 1.

[Group 1]

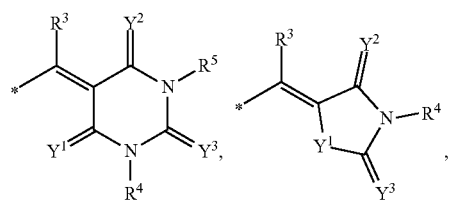

In Group 1, $Y^1$, $Y^2$, and $Y^3$ are independently O, S, Se, Te, or $C(R^p)(CN)$ (wherein $R^p$ is hydrogen, a cyano group, or a C1 to C10 alkyl group), $Ar^4$ is a substituted or unsubstituted C6 to C30 aromatic ring, a substituted or unsubstituted C3 to C30 heteroaromatic ring, or a fused ring of two or more of the substituted or unsubstituted C6 to C30 aromatic ring and the substituted or unsubstituted C3 to C30 heteroaromatic ring, $R^3$, $R^4$, $R^5$, and $R^6$ are independently hydrogen, deuterium, a substituted or unsubstituted C1 to C30 alkyl group, a substituted or unsubstituted C1 to C30 alkoxy group, a substituted or unsubstituted C6 to C30 aryl group, a substituted or unsubstituted C3 to C30 heteroaryl group, a halogen, a cyano group, or a nitro group, and

* is a linking point.

In some example embodiments, at least one of the first material or the second material may be an organic material.

In some example embodiments, the first material may be an organic material that does not include an electron withdrawing group.

In some example embodiments, the first material may be an organic material that does not include any fluorine.

In some example embodiments, a HOMO energy level of the third material may be between a HOMO energy level of the first material and a HOMO energy level of the second material.

In some example embodiments, the HOMO energy level of the first material may be about 5.0 eV to about 5.8 eV, the HOMO energy level of the second material may be about 6.2 eV to about 7.2 eV, and the HOMO energy level of the third material may be about 5.1 eV to about 6.5 eV.

In some example embodiments, the photoelectric conversion layer may include a mixture of the first material, the second material, and the third material.

In some example embodiments, the photoelectric conversion layer in the photoelectric conversion device may include a first thin film layer, the first thin film layer including the first material and the third material, and a second thin film layer, the second thin film layer including the second material and the third material.

In some example embodiments, the third material may be included in an amount of less than or equal to about 50% by volume based on a total volume of the first material and the third material.

In some example embodiments, an absorption spectrum of the photoelectric conversion layer may have a maximum absorption wavelength in a first wavelength spectrum which is one of a blue wavelength spectrum, a green wavelength spectrum, a red wavelength spectrum, or an infra-red wavelength spectrum, and each of the first material and the third material may be a light-absorbing material having a maximum absorption wavelength in the first wavelength spectrum.

In some example embodiments, a full width at half maximum (FWHM) of the absorption spectrum of the photoelectric conversion layer may be smaller than a FWHM of the absorption spectrum of the thin film formed of the first material and the second material.

In some example embodiments, the photoelectric conversion layer may be a ternary system consisted of the first material, the second material, and the third material.

According to some example embodiments, a sensor including the photoelectric conversion device is provided.

According to some example embodiments, the sensor may be an image sensor, and the image sensor may further include a semiconductor substrate stacked on the photoelectric conversion device.

According to some example embodiments, an electronic device including the photoelectric conversion device or the sensor is provided.

Charge carrier extraction characteristics may be improved by increasing the wavelength selectivity of the photoelectric conversion device and reducing remaining charge carriers.

According to some example embodiments, a photoelectric conversion device may include a first material and a second material, the first material and the second material configured to collectively define a pn junction. The photoelectric conversion device may further include a third material different from the first material and the second material, the third material including an electron withdrawing group.

The photoelectric conversion device may further include a first thin film layer including one material of the first material, the second material, or the third material and excluding another material of the first material, the second material, or the third material. The photoelectric conversion device may further include a second thin film layer on the first thin film layer, the second thin film layer including the other material of the first material, the second material, or the third material and excluding the one material of the first material, the second material, or the third material.

The one material may be the first material, and the other material may be the second material. The first and second thin film layers may both include the third material.

The first thin film layer may include both the first and second materials and exclude the third material, and the second thin film layer may include the third material and exclude the first and second materials.

The second thin film layer may be in direct contact with the first thin film layer.

The photoelectric conversion device may further include separate first, second and third thin film layers, each separate thin film layer of the first, second, and third thin film layers including a different material of the first material, the second material, or the third material.

DETAILED DESCRIPTION

Figure 1A:
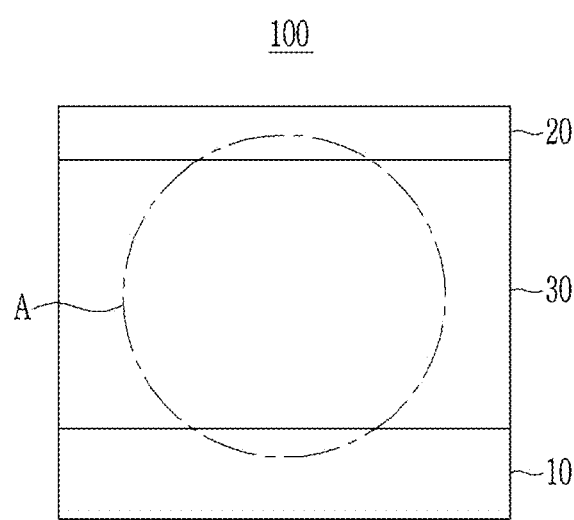
FIG. 1A is a cross-sectional view showing an example of a photoelectric conversion device according to some example embodiments.

Example embodiments will hereinafter be described in detail, and may be easily performed by a person skilled in the related art. However, this disclosure may be embodied in many different forms and is not to be construed as limited to the example embodiments set forth herein.

In the drawings, the thickness of layers, films, panels, regions, etc., are exaggerated for clarity.

It will be understood that when an element such as a layer, film, region, or substrate is referred to as being "on" another element, it may be directly on the other element or intervening elements may also be present. In contrast, when an element is referred to as being "directly on" another element, there are no intervening elements present.

Hereinafter, as used herein, when a definition is not otherwise provided, "substituted" refers to replacement of hydrogen of a compound or a group by a substituent selected from a halogen atom, a hydroxy group, an alkoxy group, a nitro group, a cyano group, an amino group, an azido group, an amidino group, a hydrazino group, a hydrazono group, a carbonyl group, a carbamyl group, a thiol group, an ester group, a carboxyl group or a salt thereof, a sulfonic acid group or a salt thereof, a phosphoric acid group or a salt thereof, a silyl group, a C1 to C20 alkyl group, a C2 to C20 alkenyl group, a C2 to C20 alkynyl group, a C6 to C30 aryl group, a C7 to C30 arylalkyl group, a C1 to C30 alkoxy group, a C1 to C20 heteroalkyl group, a C3 to C20 heteroaryl group, a C3 to C20 heteroarylalkyl group, a C3 to C30 cycloalkyl group, a C3 to C15 cycloalkenyl group, a C6 to C15 cycloalkynyl group, a C3 to C30 heterocycloalkyl group, and a combination thereof.

As used herein, when specific definition is not otherwise provided, "hetero" refers to one including 1 to 4 heteroatoms selected from N, O, S, Se, Te, Si, and P.

Hereinafter, "combination" refers to a mixture or a stacked structure of two or more.

As used herein, when specific definition is not otherwise provided, an energy level refers to the highest occupied molecular orbital (HOMO) energy level and the lowest unoccupied molecular orbital (LUMO) energy level.

Hereinafter, a work function or an energy level is expressed as an absolute value from a vacuum level. In addition, when the work function or the energy level is referred to be deep, high, or large, it may have a large absolute value based on "0 eV" of the vacuum level while when the work function or the energy level is referred to be shallow, low, or small, it may have a small absolute value based on "0 eV" of the vacuum level.

Hereinafter, a photoelectric conversion device according to some example embodiments are described with reference to the drawings.

Figure 1B:
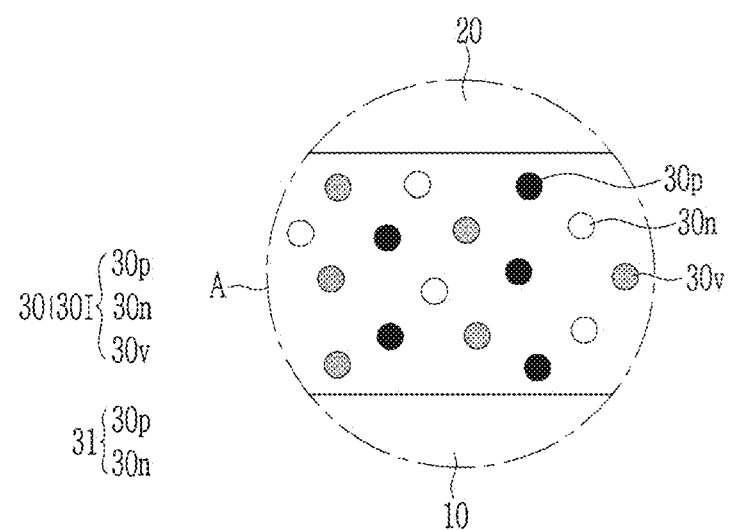
FIG. 1B is an expanded view of region A of FIG. 1A according to some example embodiments.
Figure 1C:
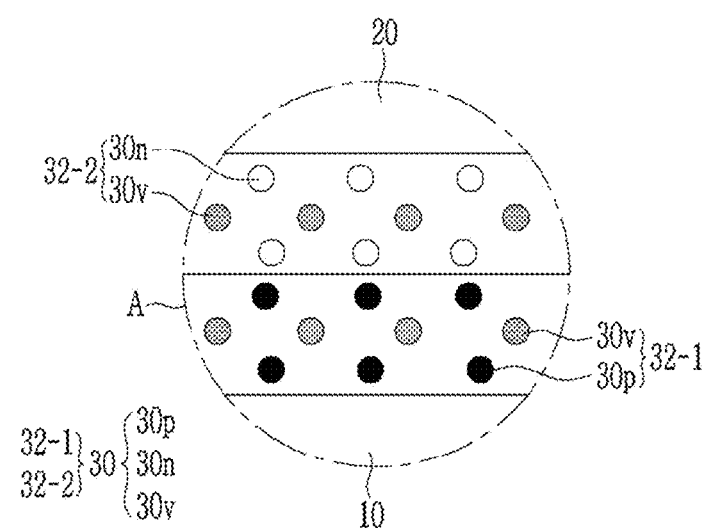
FIG. 1C is an expanded view of region A of FIG. 1A according to some example embodiments.

FIG. 1A is a cross-sectional view showing an example of a photoelectric conversion device according to some example embodiments, and FIGS. 1B and 1C are expanded views of region A of FIG. 1A according to some example embodiments.

Referring to FIG. 1A, a photoelectric conversion device 100 according to some example embodiments includes a first electrode 10, a second electrode 20, and a photoelectric conversion layer 30 between the first electrode 10 and the second electrode 20. In some example embodiments, the first and second electrodes 10 and 20 may be absent from the photoelectric conversion device. For example, in some example embodiments, the photoelectric conversion device may include only the photoelectric conversion layer 30, only the photoelectric conversion layer and one or more auxiliary layers 40 and/or 50, or the like.

A substrate (not shown) may be disposed at the side of (e.g., in contact with a surface of) the first electrode 10 or the second electrode 20. The substrate may be for example a glass plate, an inorganic substrate such as a silicon wafer, or an organic substrate made of (e.g., may at least partially comprise) an organic material such as polycarbonate, polymethylmethacrylate, polyethyleneterephthalate, polyethylenenaphthalate, polyamide, polyethersulfone, or a combination thereof. The substrate may be omitted.

One of the first electrode 10 or the second electrode 20 is an anode and the other is a cathode. In some example embodiments, the first electrode 10 may be an anode and the second electrode 20 may be a cathode. In some example embodiments, the first electrode 10 may be a cathode and the second electrode 20 may be an anode.

At least one of the first electrode 10 or the second electrode 20 may be a transparent electrode. Herein, the transparent electrode may have a high light transmittance of greater than or equal to about 80%. The transparent electrode may include for example at least one of an oxide conductor, a carbon conductor, or a metal thin film. The oxide conductor may include for example at least one of indium tin oxide (ITO), indium zinc oxide (IZO), zinc tin oxide (ZTO), aluminum tin oxide (AlTO), or aluminum zinc oxide (AZO), the carbon conductor may include at least one of graphene or carbon nanostructures, and the metal thin film may be a very thin film including aluminum (Al), magnesium (Mg), silver (Ag), gold (Au), an alloy thereof, or a combination thereof.

One of the first electrode 10 or the second electrode 20 may be a reflective electrode. Herein, the reflective electrode may have, in some example embodiments, a light transmittance of less than about 10% or high reflectance of greater than or equal to about 5%. The reflective electrode may include a reflective conductor such as a metal and may include, for example aluminum (Al), silver (Ag), gold (Au), or an alloy thereof.

In some example embodiments, each of the first electrode 10 and the second electrode 20 may be a transparent electrode, and one of the first electrode 10 and the second electrode 20 may be a light-receiving electrode disposed at a light-receiving side.

In some example embodiments, the first electrode 10 may be a transparent electrode (e.g., having a light transmittance of greater than or equal to about 80%), the second electrode 20 may be a reflective electrode (e.g., having a light transmittance of less than about 10%), and the first electrode 10 may be a light-receiving electrode.

When the terms "about" or "substantially" are used in this specification in connection with a numerical value, it is intended that the associated numerical value include a tolerance of ±10% around the stated numerical value. When ranges are specified, the range includes all values therebetween such as increments of 0.1%.

In some example embodiments, the first electrode 10 may be a reflective electrode, the second electrode 20 may be a transparent electrode, and the second electrode 20 may be a light-receiving electrode.

The photoelectric conversion layer 30 may be disposed (e.g., located) between the first electrode 10 and the second electrode 20.

The photoelectric conversion layer 30 may be configured to absorb light in at least one part in a wavelength spectrum and may be configured to convert the absorbed light into an electrical signal. The photoelectric conversion layer 30 may be configured to convert, in some example embodiments, a portion of light in a blue wavelength spectrum (hereinafter, referred to as "blue light"), light in a green wavelength spectrum (hereinafter, referred to as "green light"), light in a red wavelength spectrum (hereinafter, referred to as "red light"), or light in an infra-red wavelength spectrum (hereinafter, referred to as "infra-red light") into an electrical signal. Restated, the absorption spectrum of the photoelectric conversion layer 30 may have a maximum absorption wavelength in a first wavelength spectrum which is one of a blue wavelength spectrum, a green wavelength spectrum, a red wavelength spectrum, or an infra-red wavelength spectrum.

In some example embodiments, the photoelectric conversion layer 30 may be configured to selectively absorb at least one of the blue light, the green light, the red light, or the infra-red light and to convert the selectively absorbed light into an electrical signal. Herein, the selective absorption of at least one of the blue light, the green light, the red light, or the infra-red light means that an absorption spectrum has a maximum absorption wavelength ($\lambda_{max}$) in one of greater than or equal to about 380 nm and less than about 500 nm, about 500 nm to about 600 nm, greater than about 600 nm and less than or equal to about 700 nm, or greater than about 700 nm and less than or equal to about 3000 nm, and an absorption spectrum in the corresponding wavelength spectrum is remarkably higher than those in the other wavelength spectra. Herein "significantly high" means that about 70% to about 100%, about 75% to about 100%, about 80% to about 100%, about 85% to about 100%, about 90% to about 100%, or about 95% to about 100% relative to a total area of the absorption spectrum may belong to the corresponding wavelength spectrum.

Referring to FIG. 1B, the photoelectric conversion layer 30 may include a first material 30$p$ and a second material 30$n$ that collectively form (e.g., define, establish, etc.) a pn junction 31, and the first material 30$p$ and the second material 30$n$ may be configured to absorb incident light to generate excitons. The generated excitons may be separated into holes and electrons. Each of the first material 30p and the second material 30n may be a semiconductor and in some example embodiments, the first material 30p may be a p-type semiconductor and the second material 30n may be an n-type semiconductor.

In some example embodiments, each of the first material 30p and the second material 30n may independently be a light-absorbing material that absorbs light in a particular (or, alternatively, predetermined) wavelength spectrum, and in some example embodiments, at least one of the first material 30p or the second material 30n may be an organic light-absorbing material. In some example embodiments, at least one of the first material 30p or the second material 30n may be a light-absorbing material having wavelength selectivity which be configured to selectively absorb light in a particular (or, alternatively, predetermined) wavelength spectrum. In some example embodiments, at least one of the first material 30p or the second material 30n may be an organic light-absorbing material having wavelength selectivity. The absorption spectrum of the first material 30p and the second material 30n may have a maximum absorption wavelength ($\lambda_{max}$) in the same or different wavelength spectra.

In some example embodiments, the absorption spectra of the first material 30p and the second material 30n may be independently in one of blue light, green light, red light, or infra-red light. The maximum absorption wavelengths ($\lambda_{max}$) of the absorption spectra of the first material 30p and the second material 30n may be present in one of greater than or equal to about 380 nm and less than about 500 nm, about 500 nm to about 600 nm, greater than about 600 nm and less than or equal to about 700 nm, or greater than about 700 nm and less than or equal to about 3000 nm.

In some example embodiments, at least one of the first material 30p and/or the second material 30n may be an organic material.

In some example embodiments, the first material 30p and/or the second material 30n may be a small molecule (a low molecular weight compound).

In some example embodiments, the first material 30p and/or the second material 30n may be a depositable compound.

In some example embodiments, the first material 30p may be an organic material that has a core structure including an electron donating moiety (EDM), a π-conjugated linking moiety (LM), and an electron accepting moiety (EMA). The first material 30p may be an organic material that does not comprise an electron withdrawing group (e.g., does not include any electron withdrawing group, excludes any electron withdrawing group, etc.)

The first material 30p may be for example represented by Chemical Formula A, but is not limited thereto.

EDM1-LM1-EAM1          [Chemical Formula A]

In Chemical Formula A,

EDM1 may be an electron donating moiety,

EAM1 may be an electron accepting moiety, and

LM1 may be a π-conjugated linking moiety that links the electron donating moiety with the electron accepting moiety.

In some example embodiments, the first material 30p represented by Chemical Formula A may be represented by Chemical Formula A-1, but is not limited thereto.

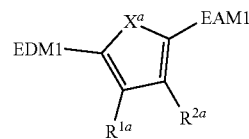

[Chemical Formula A-1]

In Chemical Formula A-1,

EDM1 may be an electron donating moiety,

EAM1 may be an electron accepting moiety, $X^a$ may be O, S, Se, Te, SO, $SO_2$, $SiR^{a1}R^{b1}$, or $GeR^{c1}R^{d1}$, and $R^{1a}$, $R^{2a}$, and $R^{a1}$, $R^{b1}$, $R^{c1}$, and $R^{d1}$ may independently be hydrogen, deuterium, a substituted or unsubstituted C1 to C30 alkyl group, a substituted or unsubstituted C1 to C30 alkoxy group, a substituted or unsubstituted C6 to C30 aryl group, a substituted or unsubstituted C3 to C30 heteroaryl group, a halogen, a cyano group, or a nitro group, and $R^{1a}$ and $R^{2a}$, $R^{a1}$ and $R^{b1}$, and $R^{c1}$ and $R^{d1}$ may independently be present or may be linked with each other to form a ring.

In some example embodiments, the first material 30p represented by Chemical Formula A-1 may be, for example represented by one of Chemical Formulae A-2 to A-4, but is not limited thereto.

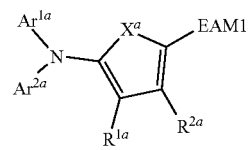

[Chemical Formula A-2]

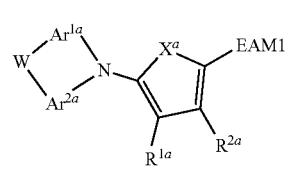

[Chemical Formula A-3]

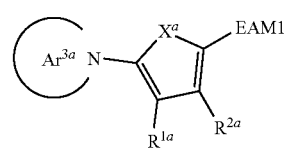

[Chemical Formula A-4]

In Chemical Formulae A-2 to A-4, $X^a$, $R^{1a}$, $R^{2a}$, and EAM1 are the same as described above, $Ar^{1a}$ and $Ar^{2a}$ may independently be hydrogen, deuterium, a substituted or unsubstituted C1 to C30 alkyl group, a substituted or unsubstituted C1 to C30 alkoxy group, a substituted or unsubstituted C3 to C30 cycloalkyl group, a substituted or unsubstituted C6 to C30 aryl group, or a substituted or unsubstituted C3 to C30 heteroaryl group, $Ar^{3a}$ may be a nitrogen-containing cyclic group, W may be a single bond, —O—, —S—, —Se—, —Te—, —N=, —$NR^{e1}$—, —$(CR^{f1}R^{g1})_{n1}$— (n1 is 1 or 2), —$SiR^{h1}R^{i1}$—, —$GeR^{j1}R^{k1}$—, —$(C(R^{l1})=C(R^{m1}))$—, or $SnR^{n1}R^{o1}$, and $R^{e1}$ to $R^{o1}$ may independently be hydrogen, deuterium, a substituted or unsubstituted C1 to C30 alkyl group, a substituted or unsubstituted C1 to C30 alkoxy group, a substituted or unsubstituted C6 to C30 aryl group, a substituted or unsubstituted C3 to C30 heteroaryl group, a halogen, a cyano group, or a nitro group, and $R^{f1}$ and $R^{g1}$, $R^{h1}$ and $R^{i1}$, $R^{j1}$ and $R^{k1}$, $R^{l1}$ and $R^{m1}$, and $R^{n1}$ and $R^{o1}$ may independently be present or may be linked with each other to form a ring.

In some example embodiments, $Ar^{1a}$ and $Ar^{2a}$ may independently be one of a substituted or unsubstituted phenyl group, a substituted or unsubstituted naphthyl group, a substituted or unsubstituted anthracenyl group, a substituted or unsubstituted phenanthrenyl group, a substituted or unsubstituted pyridinyl group, a substituted or unsubstituted pyridazinyl group, a substituted or unsubstituted pyrimidinyl group, a substituted or unsubstituted pyrazinyl group, a substituted or unsubstituted quinolinyl group, a substituted or unsubstituted isoquinolinyl group, a substituted or unsubstituted naphthyridinyl group, a substituted or unsubstituted cinnolinyl group, a substituted or unsubstituted quinazolinyl group, a substituted or unsubstituted phthalazinyl group, a substituted or unsubstituted benzotriazinyl group, a substituted or unsubstituted pyridopyrazinyl group, a substituted or unsubstituted pyridopyrimidinyl group, or a substituted or unsubstituted pyridopyridazinyl group.

In some example embodiments, the first material 30p represented by Chemical Formula A-2 may be represented by Chemical Formula A-2a, and the first material 30p represented by Chemical Formula A-3 may be represented by Chemical Formula A-3a, but they are not limited thereto.

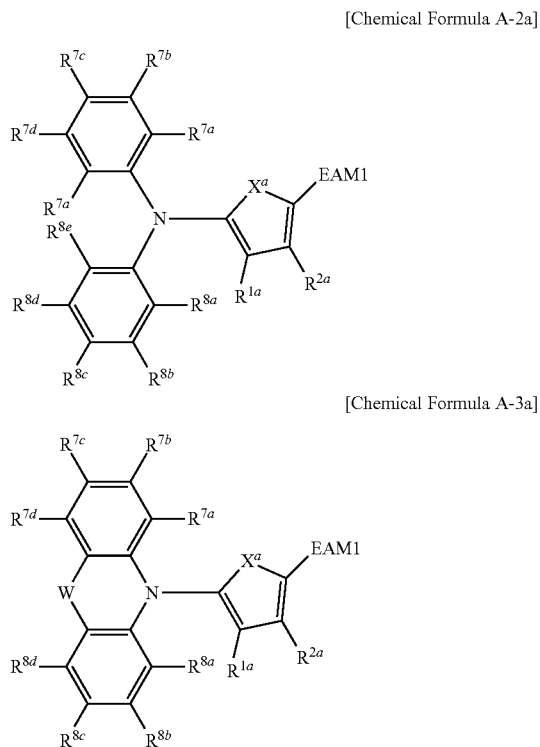

[Chemical Formula A-2a]

[Chemical Formula A-3a]

In Chemical Formula A-2a or A-3a,

EAM1, $X^a$, W, $R^{1a}$, and $R^{2a}$ are the same as described above, $R^{7a}$ to $R^{7e}$ and $R^{8a}$ to $R^{8e}$ may independently be hydrogen, deuterium, a substituted or unsubstituted C1 to C30 alkyl group, a substituted or unsubstituted C1 to C30 alkoxy group, a substituted or unsubstituted C6 to C30 aryl group, a substituted or unsubstituted C3 to C30 heteroaryl group, a halogen, a cyano group, or a nitro group, $R^{7a}$ to $R^{7e}$ may independently be present or adjacent two thereof may be linked with each other to form a fused ring, and $R^{8a}$ to $R^{8e}$ may independently be present or adjacent two thereof may be linked with each other to form a fused ring.

In some example embodiments, EAM1 may be one group of a set of groups of Group A, but is not limited thereto.

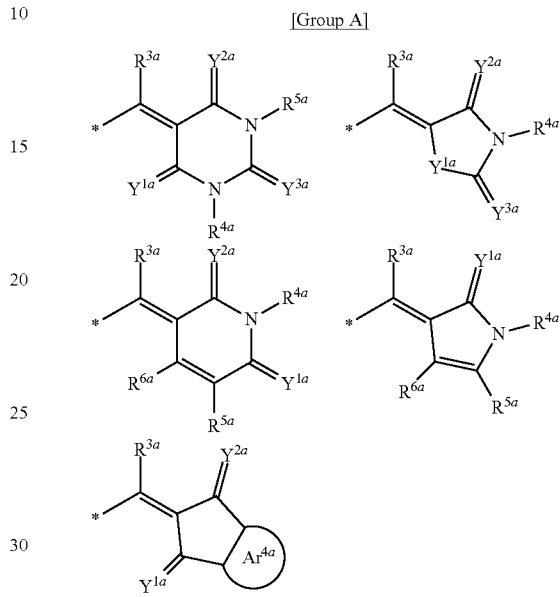

[Group A]

In Group A, $Y^{1a}$, $Y^{2a}$, and $Y^{3a}$ may independently be O, S, Se, Te, or $C(R^{p1})(CN)$ (wherein $R^{p1}$ is hydrogen, a cyano group, or a C1 to C10 alkyl group), $Ar^{4a}$ may be a substituted or unsubstituted C6 to C30 aromatic ring, a substituted or unsubstituted C3 to C30 heteroaromatic ring, or a fused ring of the foregoing two or more (e.g., two or more of the substituted or unsubstituted C6 to C30 aromatic ring and the substituted or unsubstituted C3 to C30 heteroaromatic ring), $R^{3a}$, $R^{4a}$, $R^{5a}$, and $R^{6a}$ may independently be hydrogen, deuterium, a substituted or unsubstituted C1 to C30 alkyl group, a substituted or unsubstituted C1 to C30 alkoxy group, a substituted or unsubstituted C6 to C30 aryl group, a substituted or unsubstituted C3 to C30 heteroaryl group, a halogen, a cyano group, or a nitro group, and

* is a linking point.

In some example embodiments, two of $Y^{1a}$ to $Y^{3a}$ of Group A may be O.

In some example embodiments, each of $Y^{1a}$ and $Y^{2a}$ of Group A may be O.

In some example embodiments, each of $Y^{1a}$ and $Y^{2a}$ of Group A may be O and $Y^{3a}$ may be S.

In some example embodiments, each of $Y^{2a}$ and $Y^{3a}$ of Group A may be O.

In some example embodiments, $Ar^{4a}$ of Group A may be a substituted or unsubstituted benzene, a substituted or unsubstituted naphthalene, a substituted or unsubstituted anthracene, a substituted or unsubstituted thiophene, a substituted or unsubstituted selenophene, a substituted or unsubstituted tellurophene, a substituted or unsubstituted pyridine, a substituted or unsubstituted pyrimidine, or a fused ring of the foregoing two or more.

In some example embodiments, $R^{3a}$ of Group A may be hydrogen, deuterium, or a methyl group.

In some example embodiments, the first material 30p may not include (e.g., may exclude) an electron withdrawing group such as a halogen, a cyano group, and/or a nitro group and, in some example embodiments, may not include (e.g., may exclude) any electron withdrawing groups. In some example embodiments, the first material 30p may not include fluorine (e.g., may not include any fluorine).

In some example embodiments, the first material 30p may be one selected from listed in Group A1:

[Group A1]

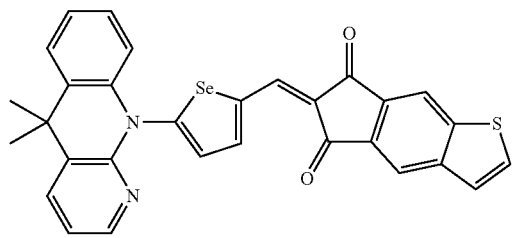

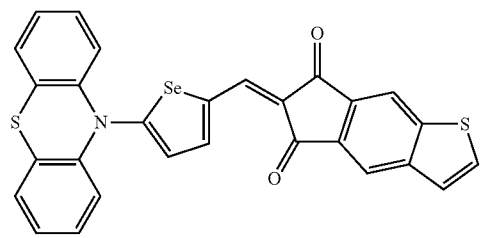

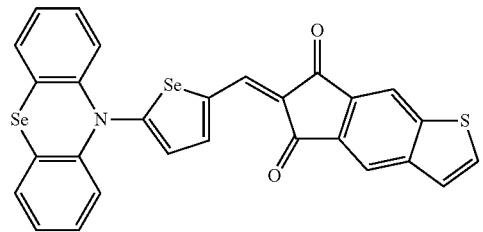

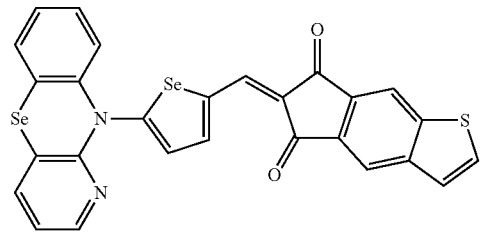

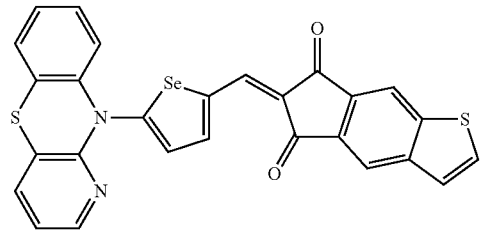

-continued

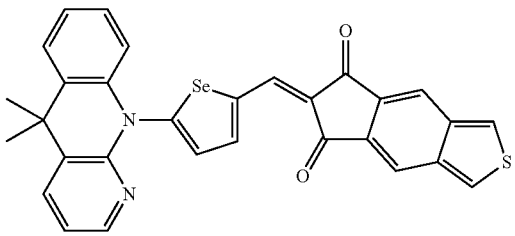

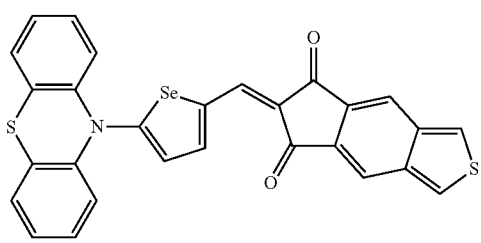

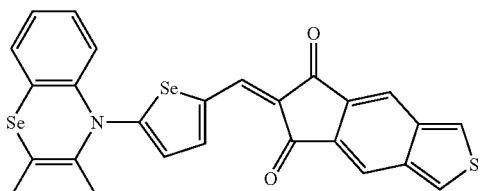

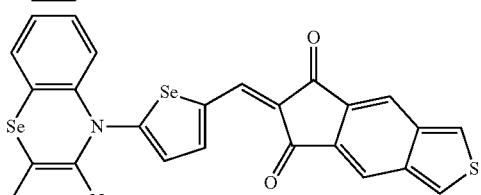

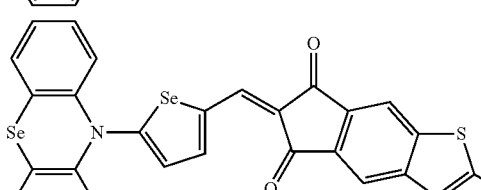

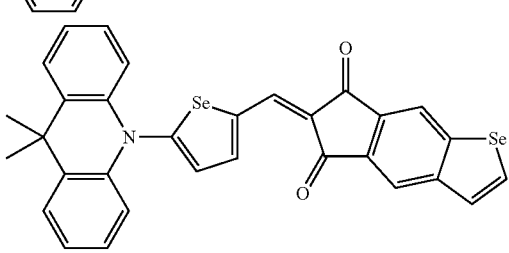

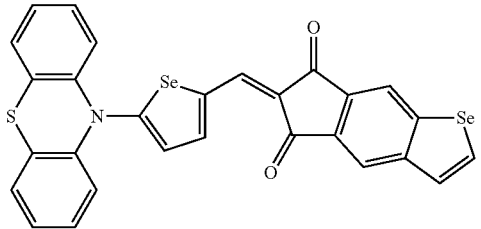

-continued
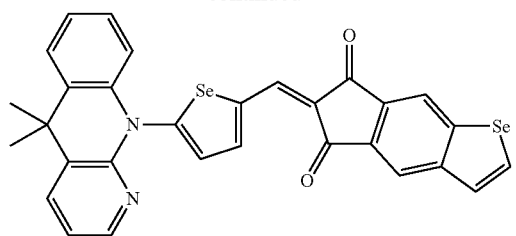
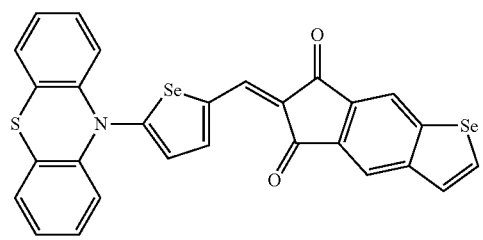
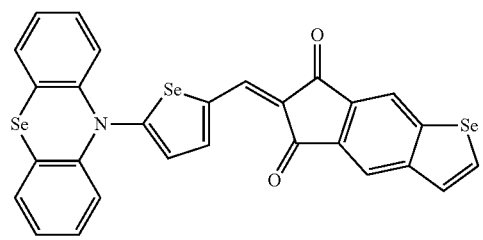
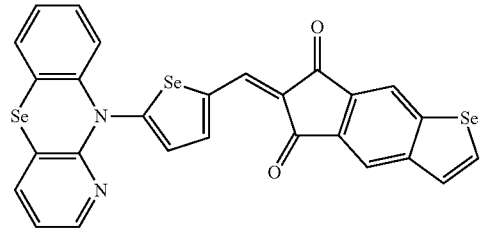
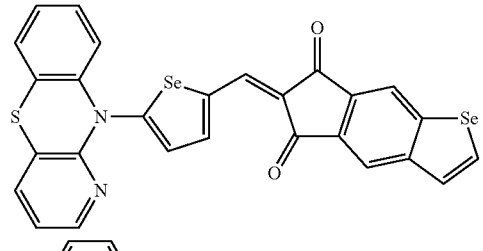
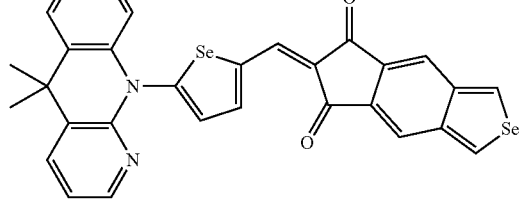
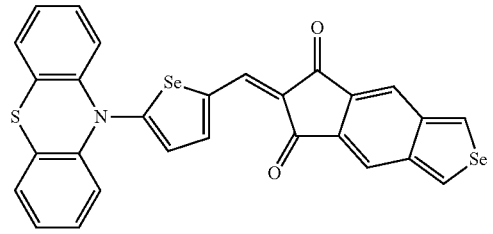
-continued
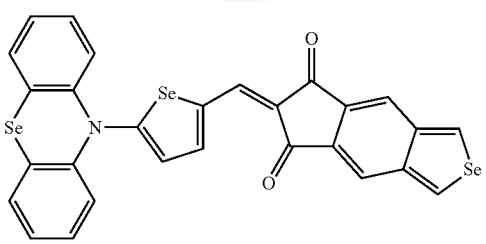
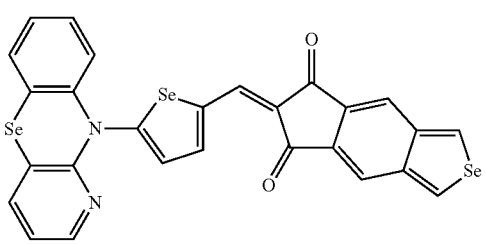
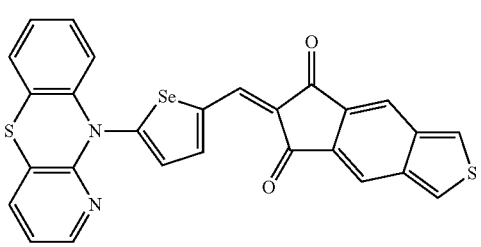
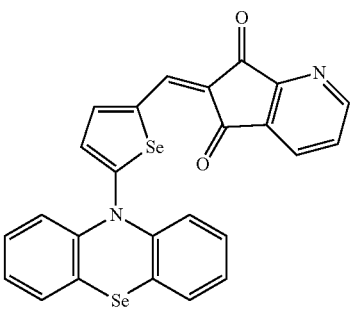
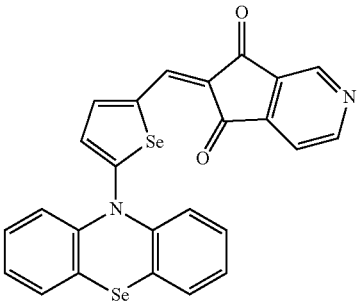
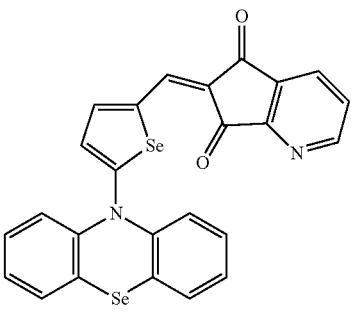

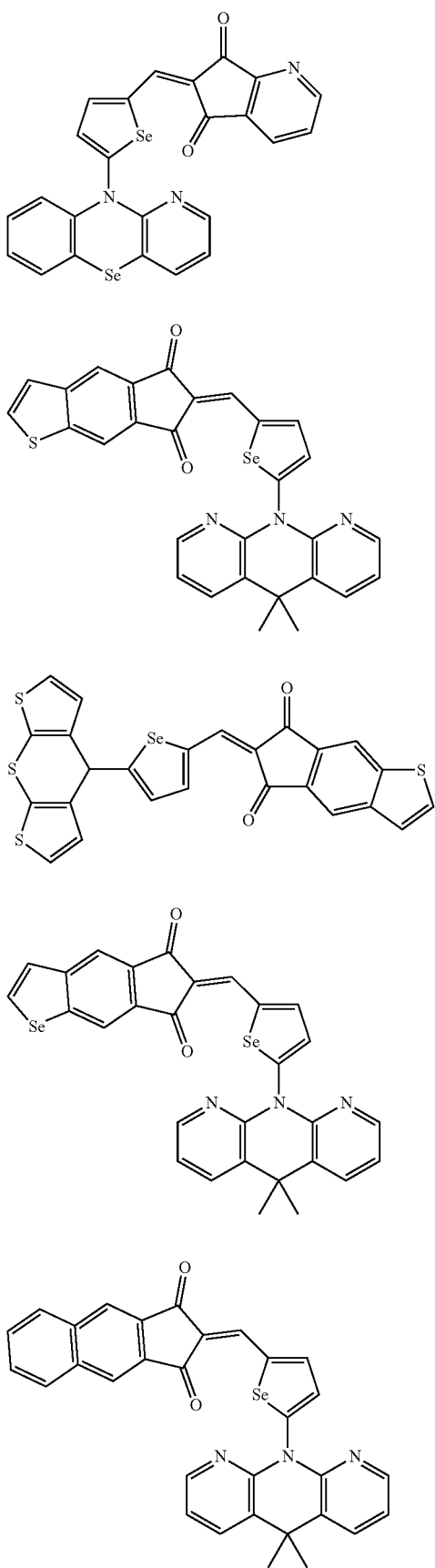
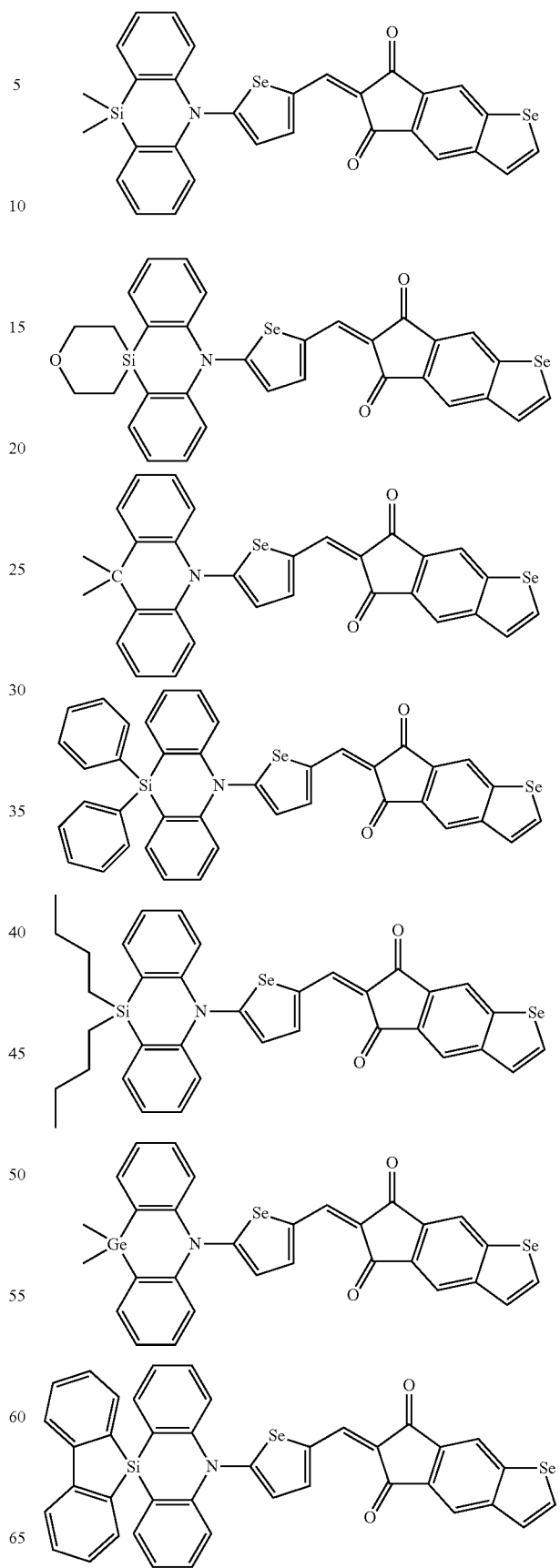

-continued
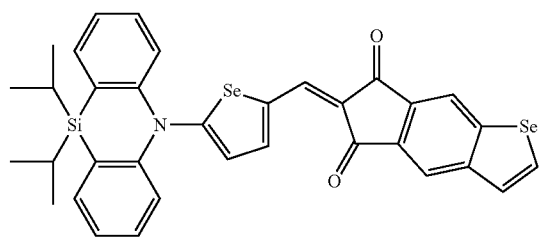
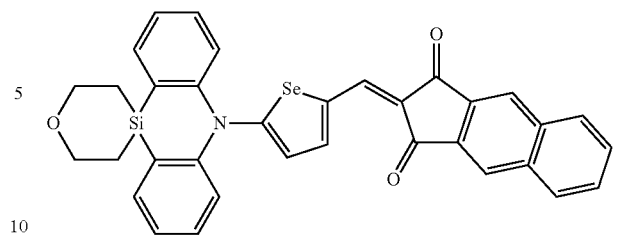
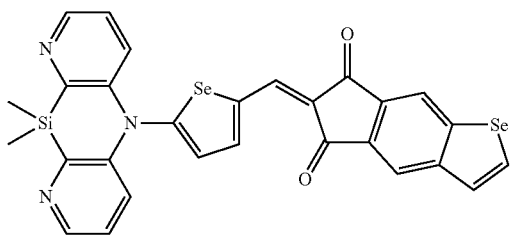
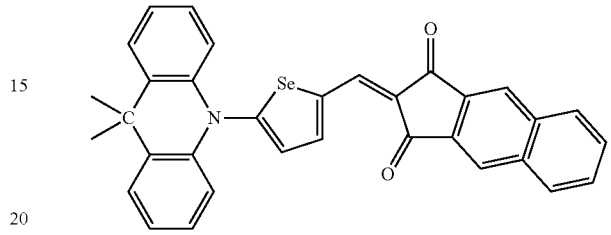
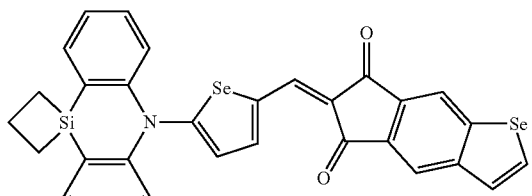
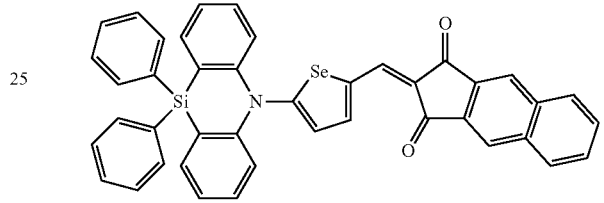
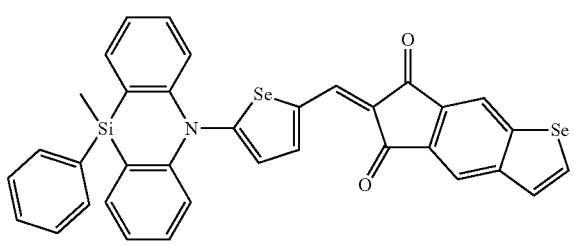
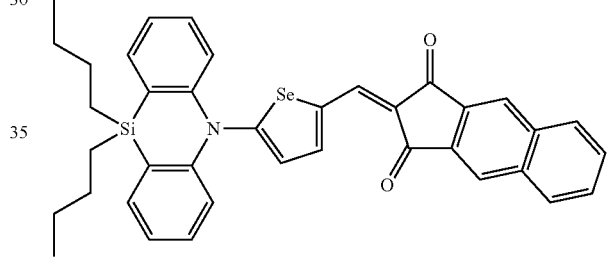
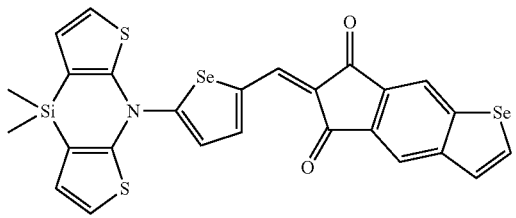
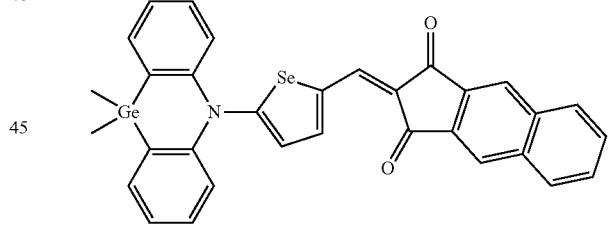
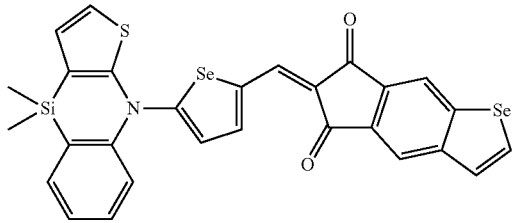
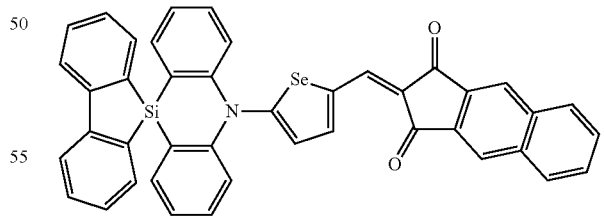
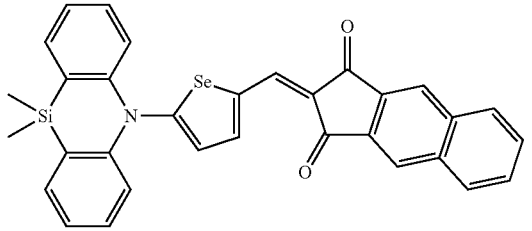
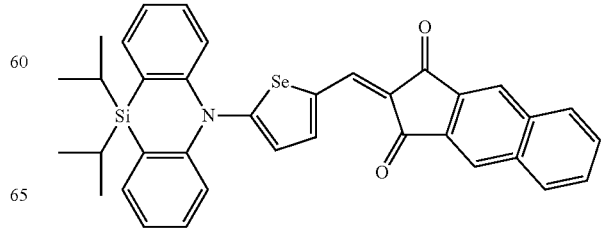

-continued
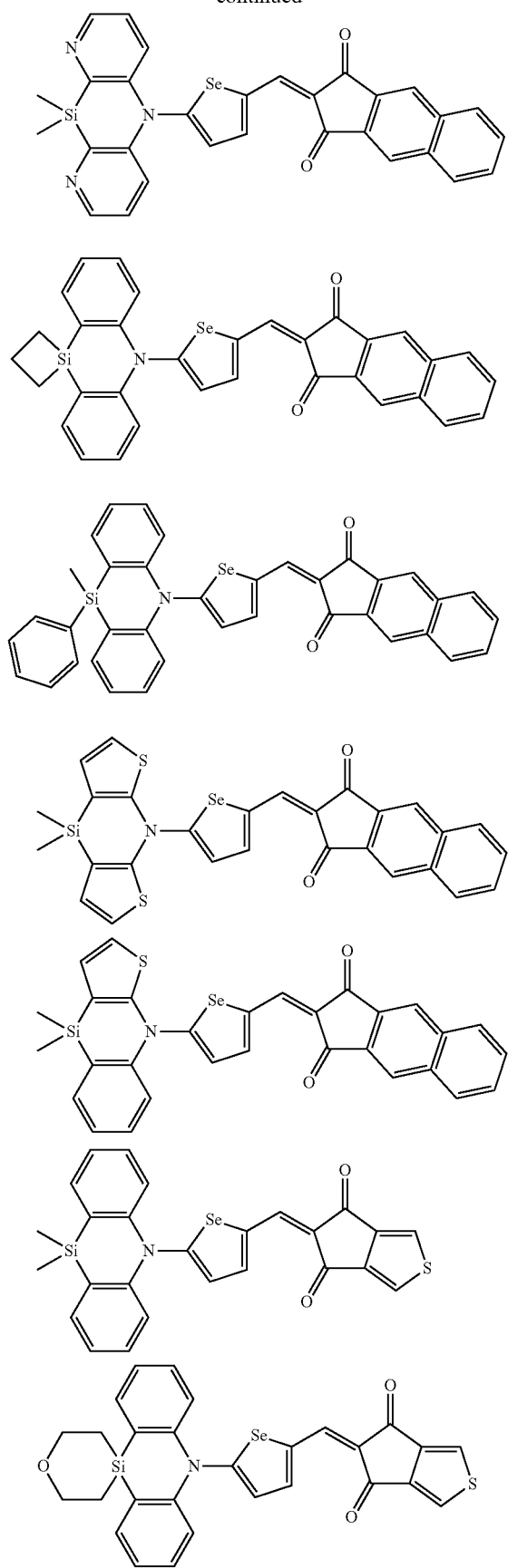
-continued
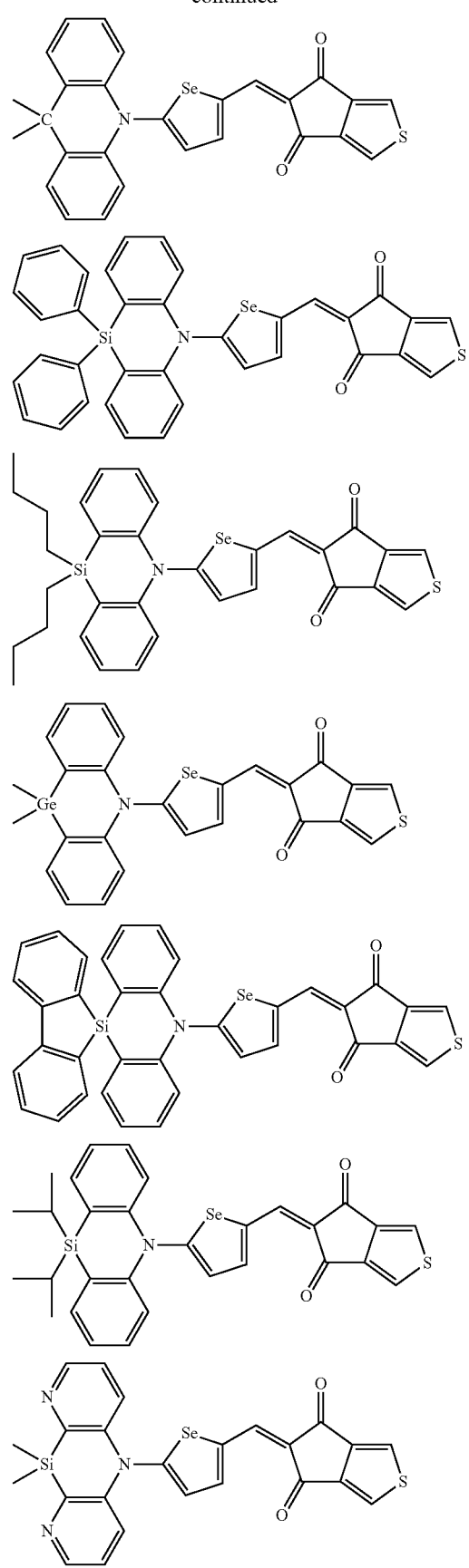

25
-continued
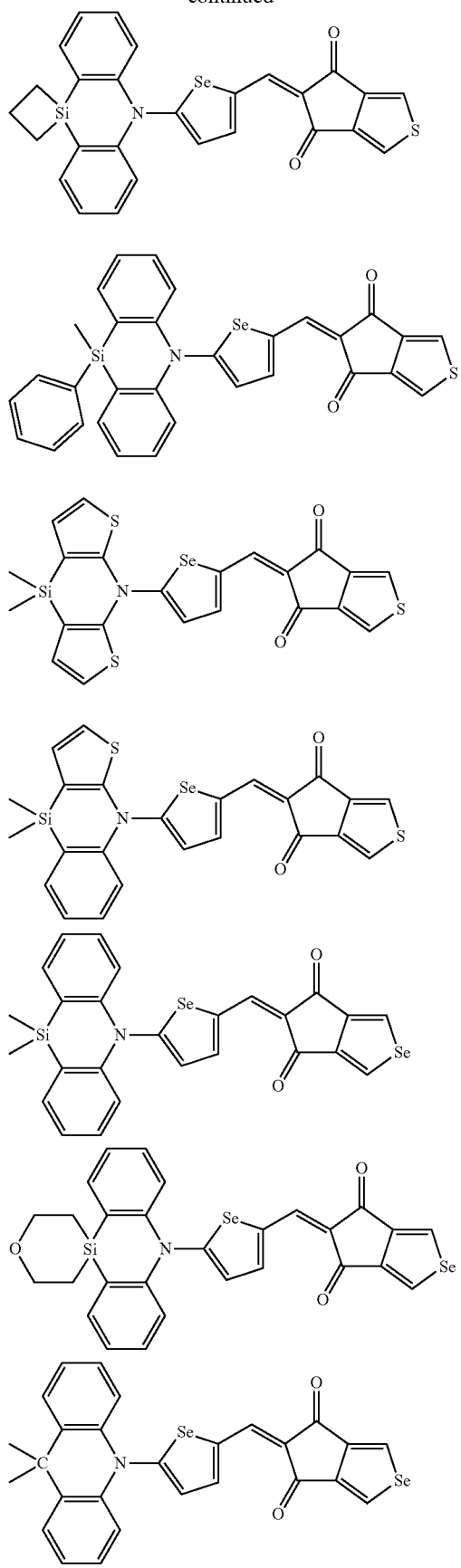
26
-continued
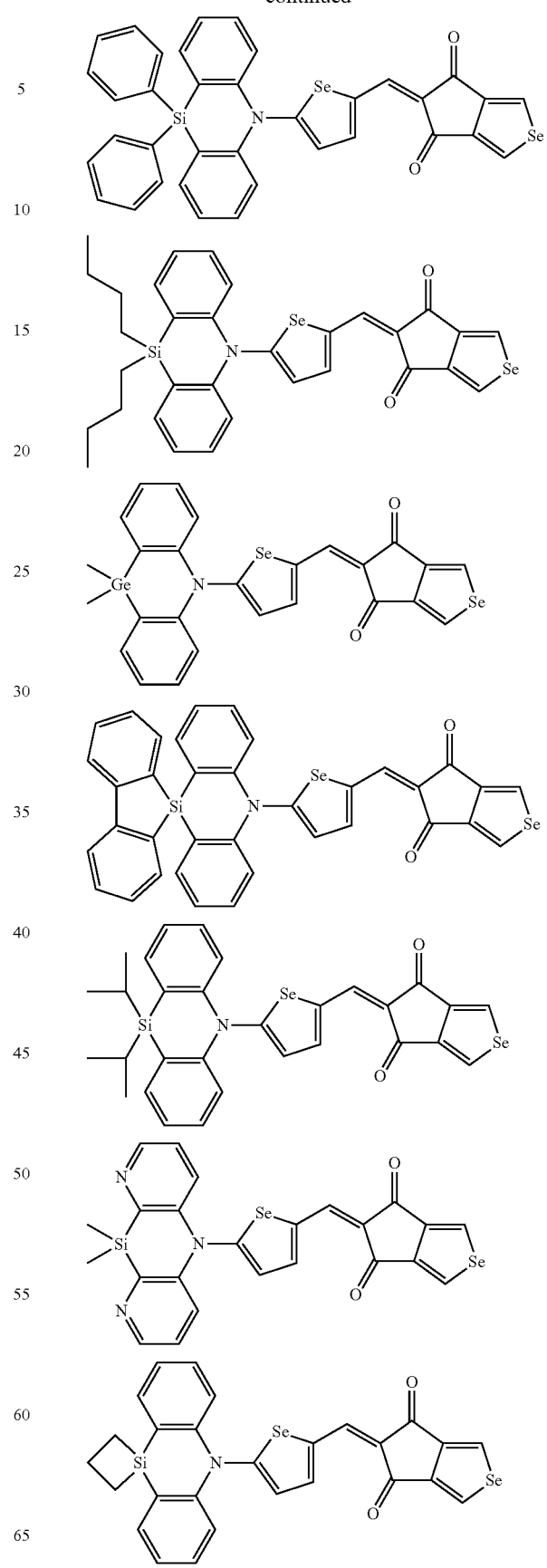

27
-continued
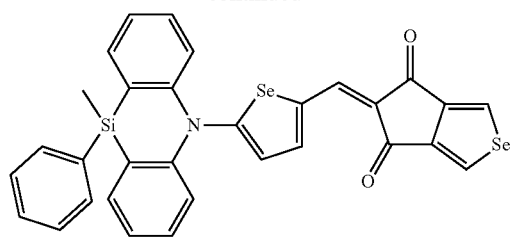
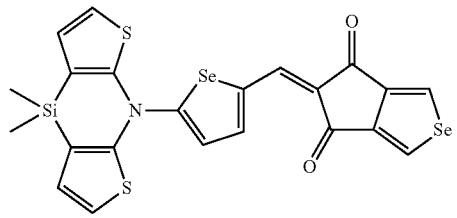
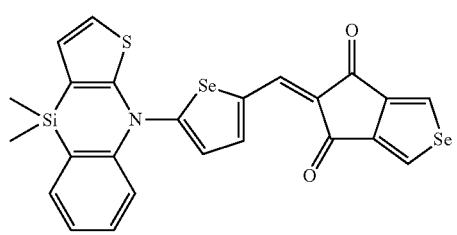
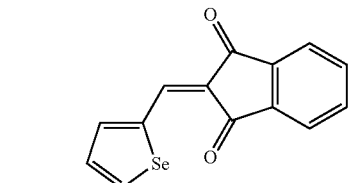
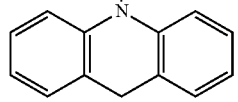
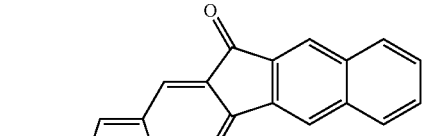
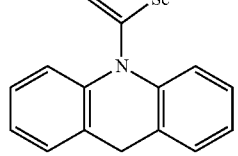
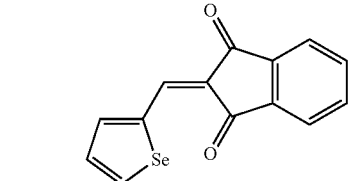
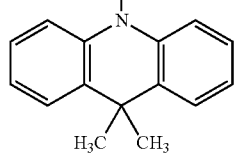
28
-continued
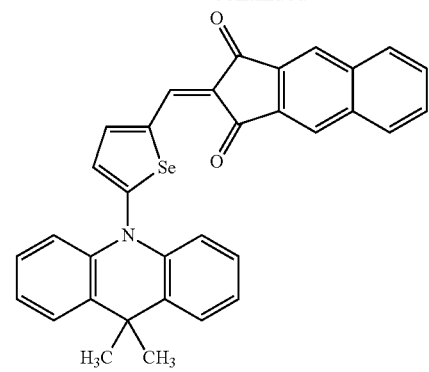
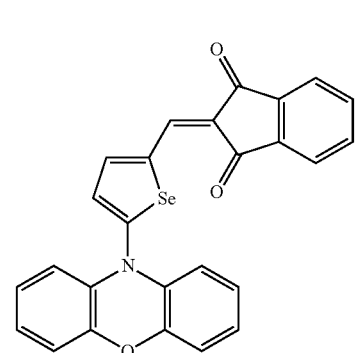
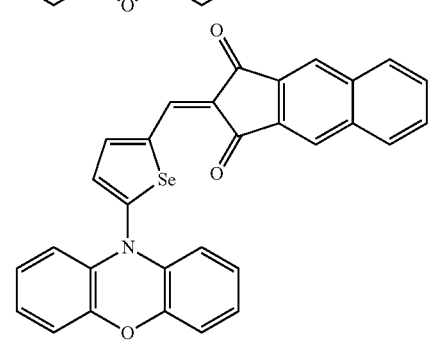
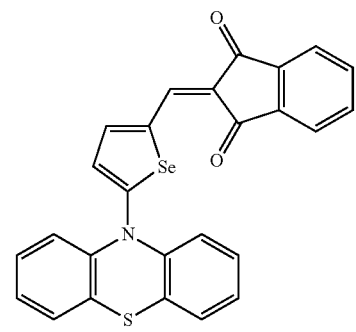
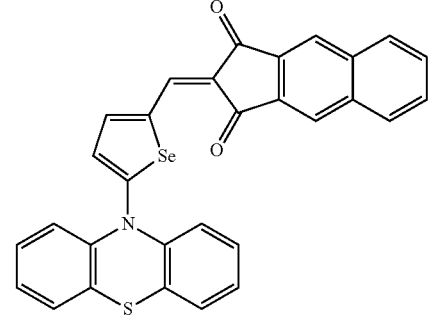

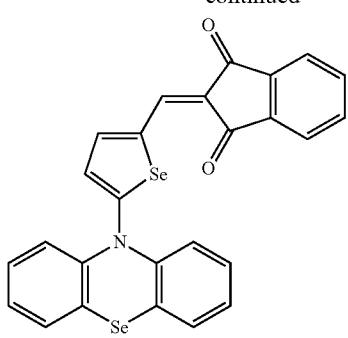
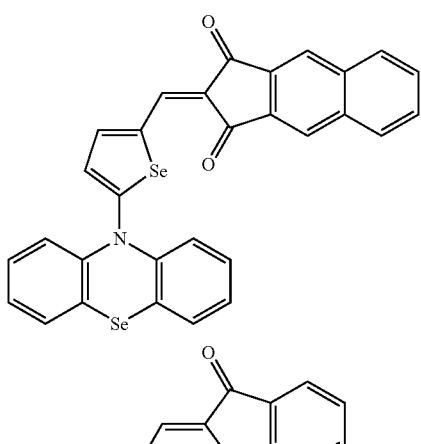
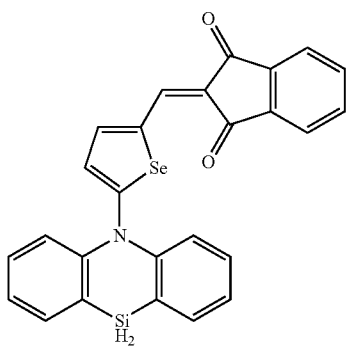
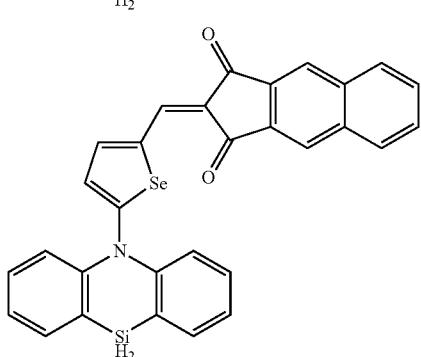
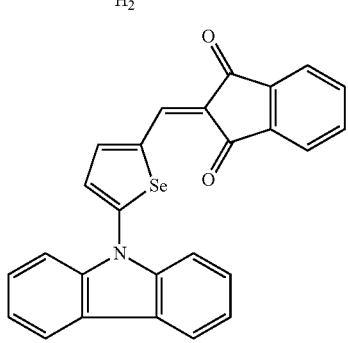
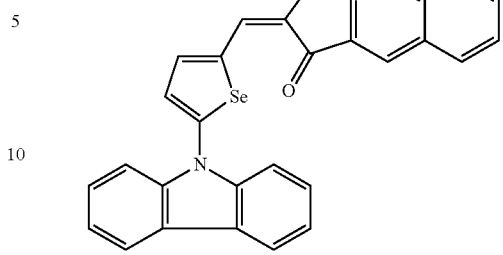
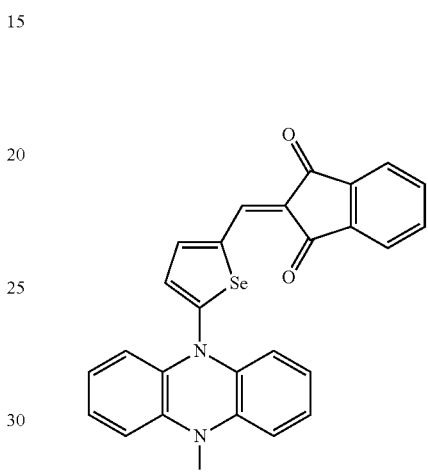
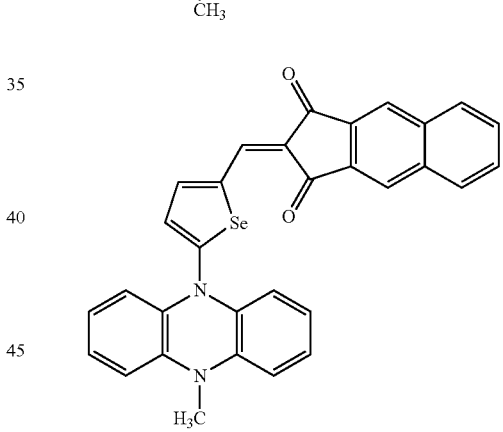
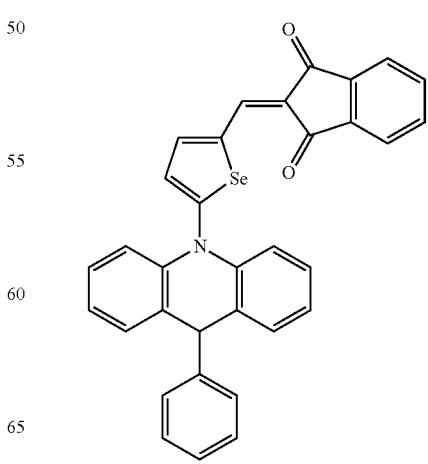

-continued
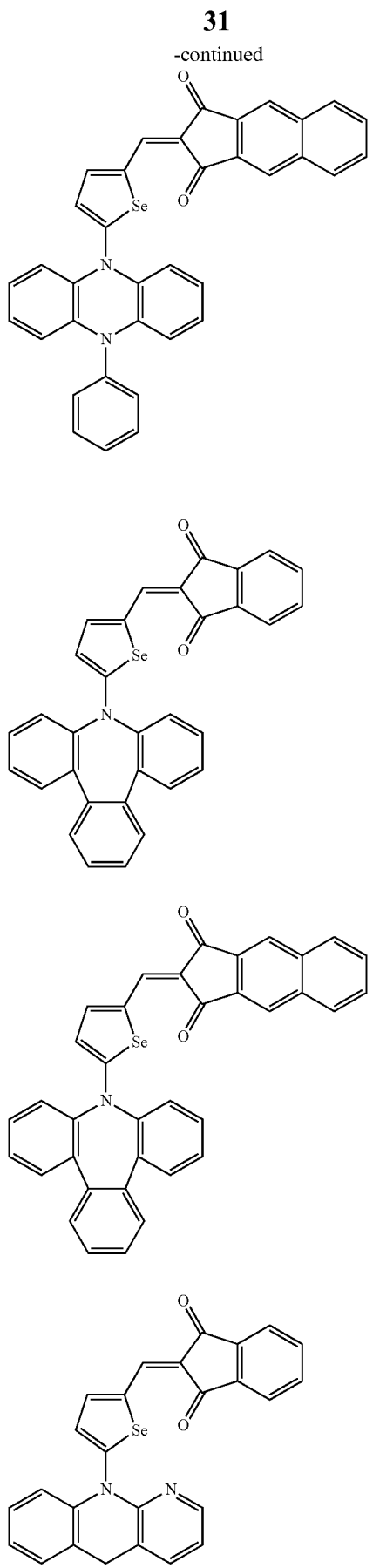
-continued
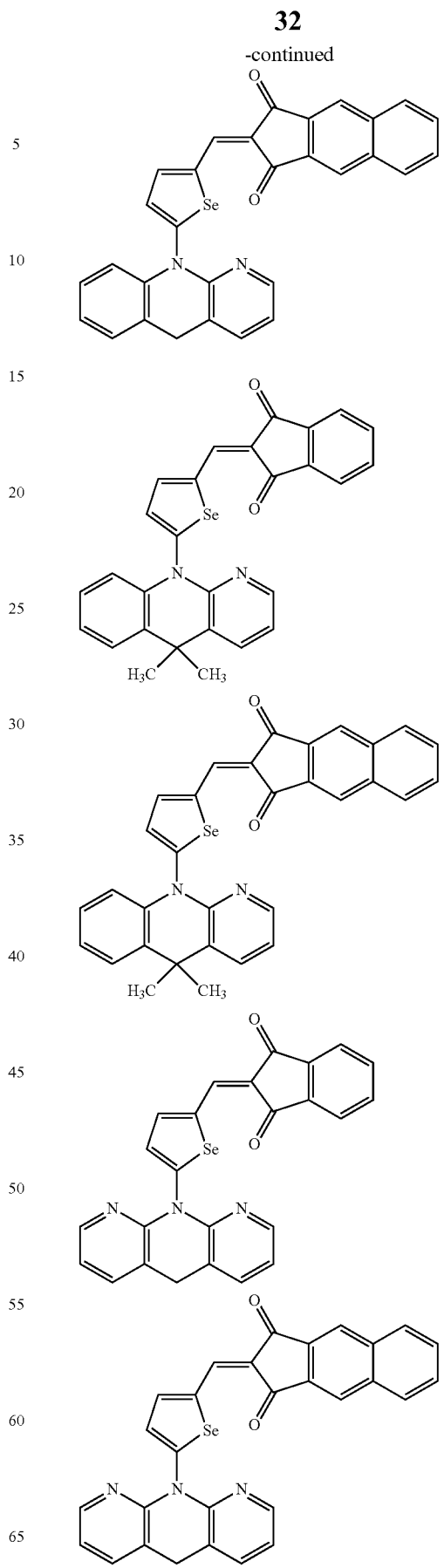

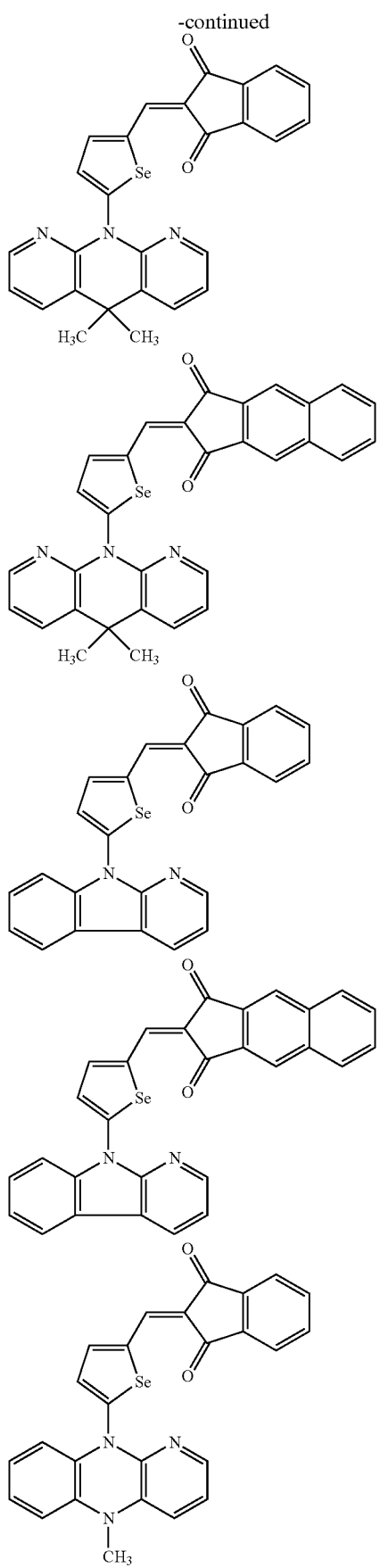

-continued
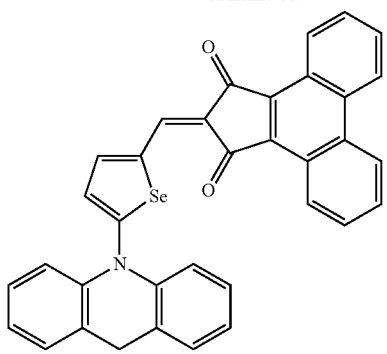
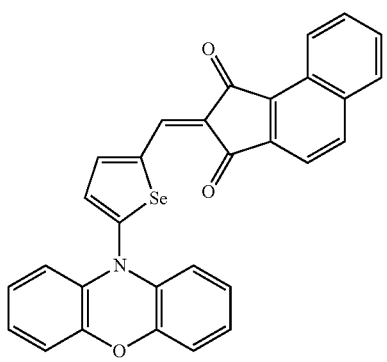
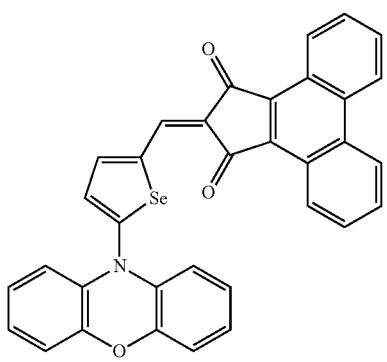
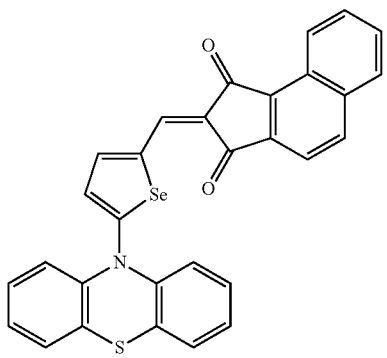
-continued
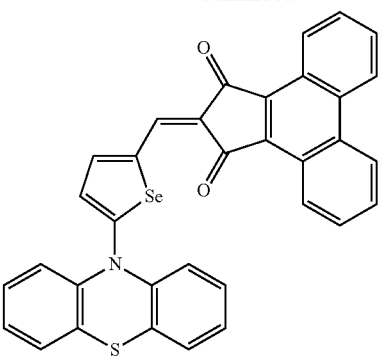
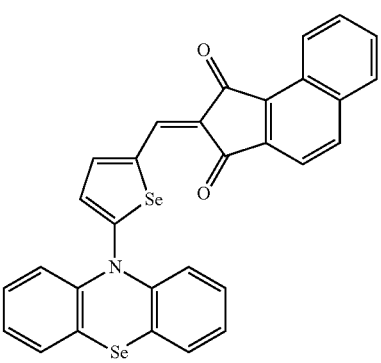
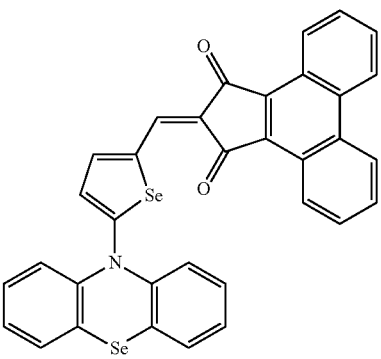
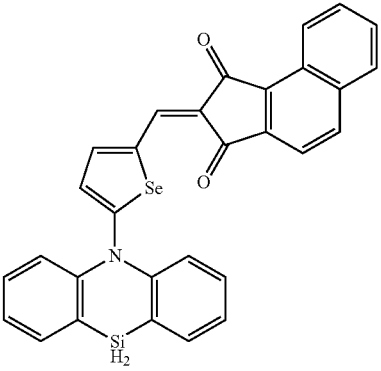

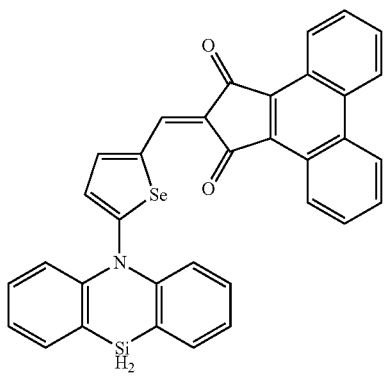
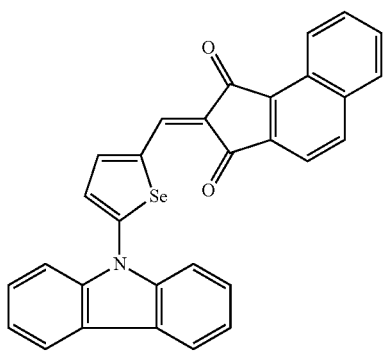
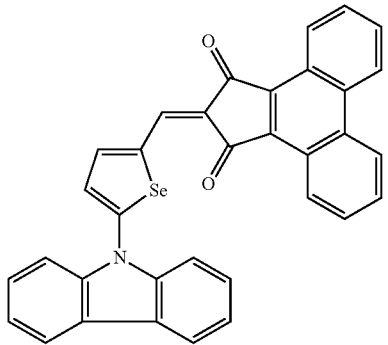
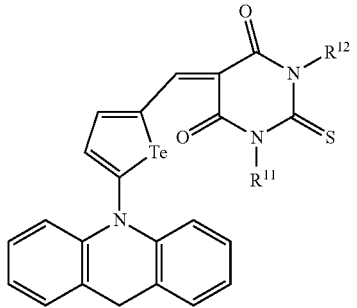
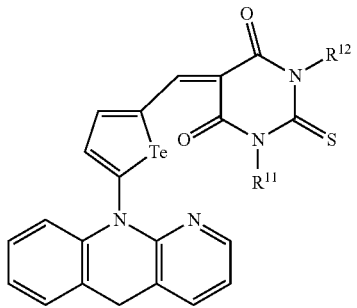
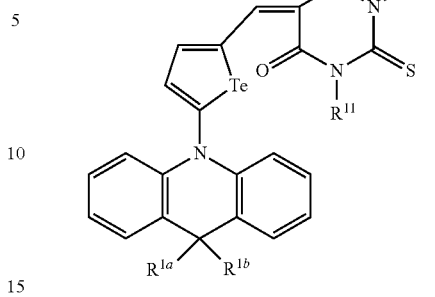
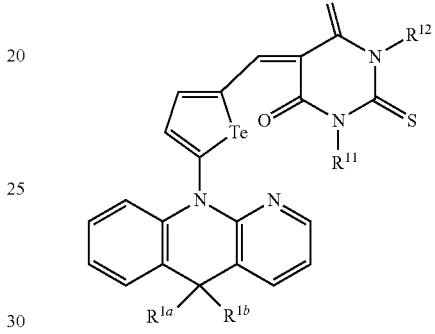
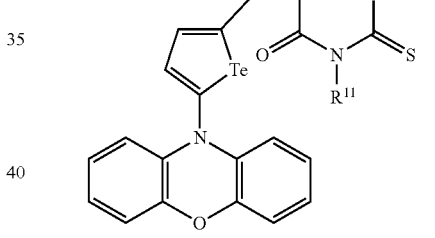
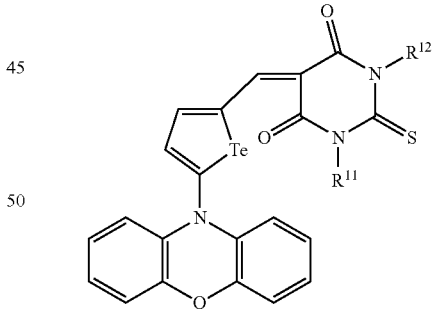
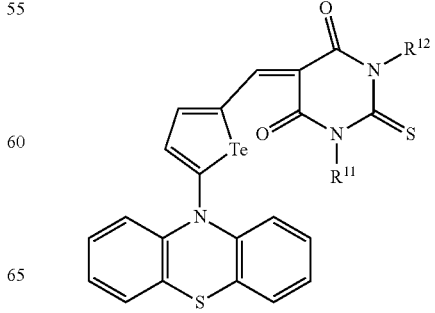

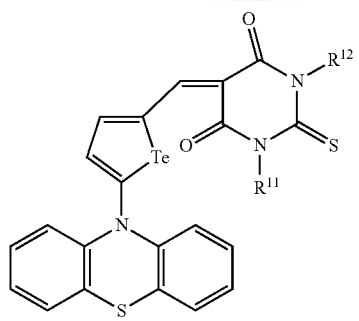
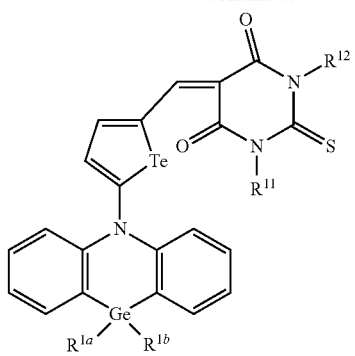
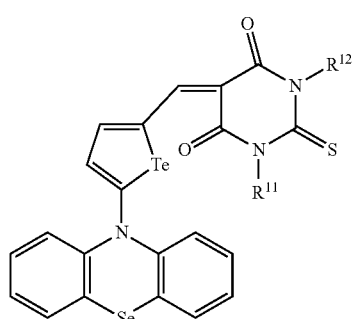
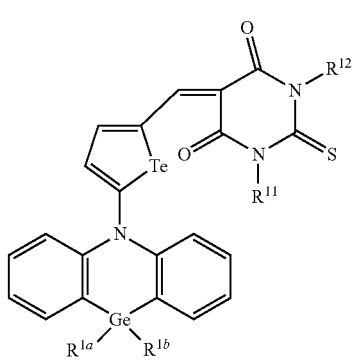
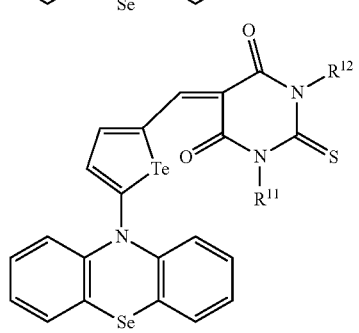
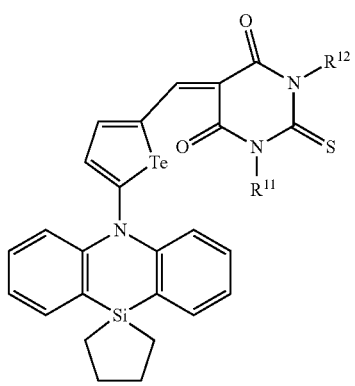
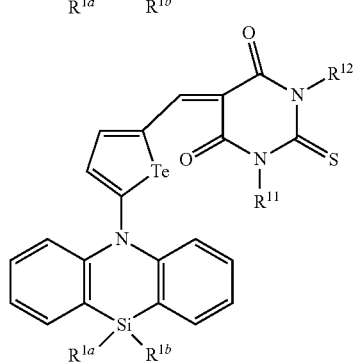
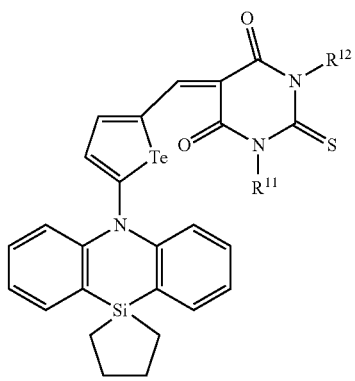

-continued
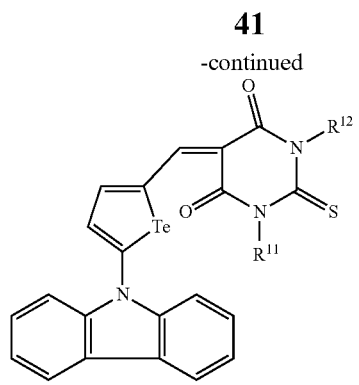
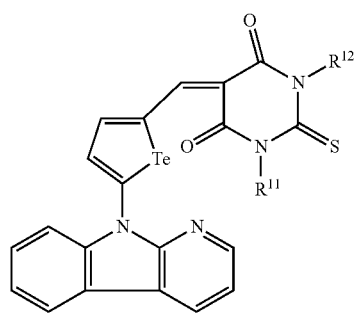
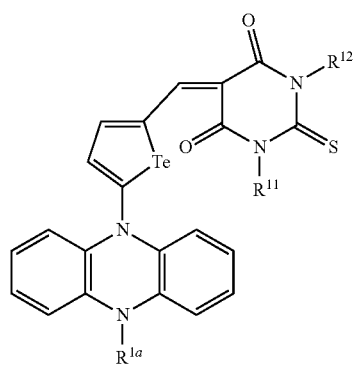
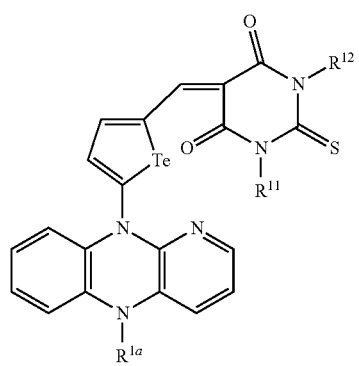
-continued
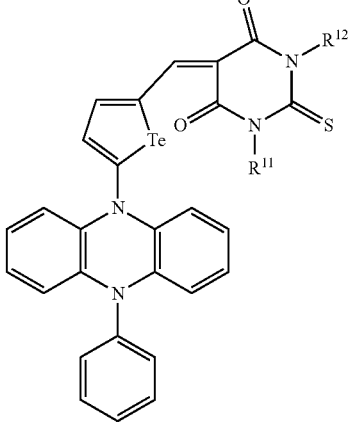
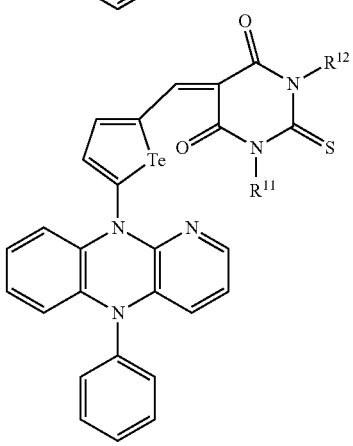
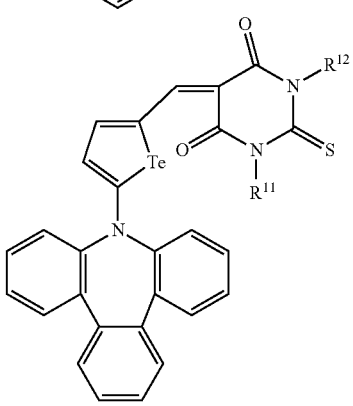
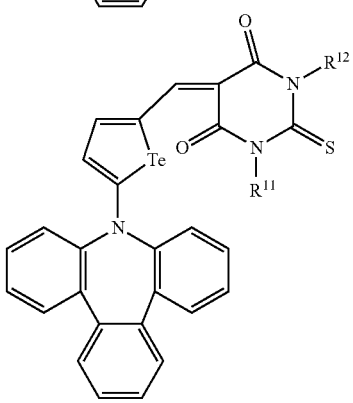
In Group A1, $R^{1a}$, $R^{1b}$, $R^{11}$ and $R^{12}$ may independently be hydrogen, deuterium, a substituted or unsubstituted C1 to C30 alkyl group, a substituted or unsubstituted C1 to C30 alkoxy group, a substituted or unsubstituted C6 to C30 aryl group, a substituted or unsubstituted C3 to C30 heteroaryl group, a halogen, a cyano group, or a nitro group, and $R^{1a}$ and $R^{1b}$ may independently be present or may be linked with each other to form a ring. The second material 30n may include, in some example embodiments, an organic material, an inorganic material and/or organic/inorganic material, and may be, in some example embodiments, thiophene or a thiophene derivative, fullerene or a fullerene derivative, but is not limited thereto.

The photoelectric conversion layer 30 further includes a third material 30v, in addition to the aforementioned first material 30p and second material 30n. The third material 30v may be a different material from the first material 30p and the second material 30n, and may be for example a dopant capable of modifying physical properties of the photoelectric conversion layer 30.

The third material 30v may be an organic material, for example a small molecule (a low molecular weight compound), for example a depositable organic compound. In some example embodiments, the photoelectric conversion layer 30 may be a co-deposited thin film of the first material 30p, the second material 30n, and the third material 30v (e.g., a single layer that includes a mixture of the first to third materials 30p, 30n, and 30v).

The third material 30v may be, in some example embodiments, a light-absorbing material, and may be, in some example embodiments, a light-absorbing material that be configured to selectively absorb one of light in a blue wavelength spectrum, a green wavelength spectrum, a red wavelength spectrum, or an infra-red wavelength spectrum.

In some example embodiments, each of the absorption spectra of the first material 30p and the third material 30v may have a maximum absorption wavelength ($\lambda_{max}$) that in common belongs to one of a blue wavelength spectrum, a green wavelength spectrum, a red wavelength spectrum, or an infra-red wavelength spectrum. In some example embodiments, the absorption spectra of the first material 30p and the third material 30v may have each maximum absorption wavelength ($\lambda_{max}$) in a blue wavelength spectrum of greater than or equal to about 380 nm and less than about 500 nm. In some example embodiments, the absorption spectra of the first material 30p and the third material 30v may have each maximum absorption wavelength ($\lambda_{max}$) in a green wavelength spectrum of about 500 nm to about 600 nm. In some example embodiments, the absorption spectra of the first material 30p and the third material 30v may have each maximum absorption wavelength ($\lambda_{max}$) in a red wavelength spectrum of greater than about 600 nm and less than or equal to about 700 nm. In some example embodiments, the absorption spectra of the first material 30p and the third material 30v may have each maximum absorption wavelength ($\lambda_{max}$) in an infra-red wavelength spectrum of greater than about 700 nm and less than or equal to about 3000 nm. In some example embodiments, where the absorption spectrum of the photoelectric conversion layer 30 has a maximum absorption wavelength in a first wavelength spectrum which is one of a blue wavelength spectrum, a green wavelength spectrum, a red wavelength spectrum, or an infra-red wavelength spectrum, each of the first material 30p and the third material 30v may be a light-absorbing material having a maximum absorption wavelength in the first wavelength spectrum.

The third material 30v may be a small molecule (a low molecular weight compound) including an electron withdrawing group, for example a small molecule (a low molecular weight compound) including a halogen (F, Cl, Br, and/or I), a cyano group, and/or a nitro group. The electron withdrawing group may be an atom or group that draws electron density from neighboring atoms towards itself, for example based on resonance or inductive effects. The third material 30v may be, in some example embodiments, a small molecule (a low molecular weight compound) including fluorine and/or a cyano group, and may be, in some example embodiments, a small molecule (a low molecular weight compound) including fluorine.

Herein, the electron withdrawing group may include a halogen; a cyano group; a nitro group; and/or a monovalent functional group substituted with a halogen, a cyano group, a nitro group, or a combination thereof, for example a halogen; a cyano group; a nitro group; a C1 to C30 alkyl group substituted with a halogen, a cyano group, a nitro group, or a combination thereof; a C1 to C30 alkoxy group substituted with a halogen, a cyano group, a nitro group, or a combination thereof; a C3 to C30 cycloalkyl group substituted with a halogen, a cyano group, a nitro group, or a combination thereof; a C6 to C30 aryl group substituted with a halogen, a cyano group, a nitro group, or a combination thereof; or a C3 to C30 heteroaryl group substituted with a halogen, a cyano group, a nitro group, or a combination thereof. The electron withdrawing group may include fluorine, a cyano group, or a combination thereof.

In some example embodiments, the third material 30v may be a small molecule (a low molecular weight compound) including fluorine, a monovalent functional group substituted with fluorine, a cyano group, a monovalent functional group substituted with a cyano group, or a combination thereof.

In some example embodiments, the third material 30v may be an organic material including an electron donating moiety, an electron accepting moiety, and a π-conjugated linking moiety that links the electron donating moiety with the electron accepting moiety, and at least one of the electron donating moiety, the electron accepting moiety, or the π-conjugated linking moiety may include an electron withdrawing group according to any of the example embodiments. In some example embodiments, the at least one of the electron donating moiety, the electron accepting moiety, or the π-conjugated linking moiety may include a halogen; a cyano group; a nitro group; and/or a monovalent functional group substituted with a halogen, a cyano group, a nitro group, or a combination thereof, for example a halogen; a cyano group; a nitro group; a C1 to C30 alkyl group substituted with a halogen, a cyano group, a nitro group, or a combination thereof; a C1 to C30 alkoxy group substituted with a halogen, a cyano group, a nitro group, or a combination thereof; a C3 to C30 cycloalkyl group substituted with a halogen, a cyano group, a nitro group, or a combination thereof; a C6 to C30 aryl group substituted with a halogen, a cyano group, a nitro group, or a combination thereof; or a C3 to C30 heteroaryl group substituted with a halogen, a cyano group, a nitro group, or a combination thereof.

In some example embodiments, at least one of the electron donating moiety, the electron accepting moiety, or the π-conjugated linking moiety may include fluorine; a monovalent functional group substituted with fluorine; a cyano group; a monovalent functional group substituted with a cyano group; or a combination thereof.

In some example embodiments, the electron donating moiety may include fluorine or a monovalent functional group substituted with fluorine.

In some example embodiments, the electron accepting moiety may include fluorine or a monovalent functional group substituted with fluorine.

In some example embodiments, the π-conjugated linking moiety may include fluorine or a monovalent functional group substituted with fluorine.

In some example embodiments, the electron donating moiety, the electron accepting moiety, and the π-conjugated linking moiety may include 1 to 5 fluorines (e.g., fluorine atoms).

In some example embodiments, the monovalent functional group substituted with fluorine may include a fluorine-substituted C1 to C30 alkyl group, a fluorine-substituted C1 to C30 alkoxy group, a fluorine-substituted C3 to C30 cycloalkyl group, a fluorine-substituted C6 to C30 aryl group, and/or a fluorine-substituted C3 to C30 heteroaryl group, but is not limited thereto.

In some example embodiments, the electron donating moiety may include a cyano group or a monovalent functional group substituted with a cyano group.

In some example embodiments, the electron accepting moiety may include a cyano group or a monovalent functional group substituted with a cyano group.

In some example embodiments, the π-conjugated linking moiety may include a cyano group or a monovalent functional group substituted with a cyano group.

In some example embodiments, the electron donating moiety, the electron accepting moiety, and the π-conjugated linking moiety may include 1 to 5 cyano groups.

In some example embodiments, the monovalent functional group substituted with the cyano group may include a cyano-substituted C1 to C30 alkyl group, a cyano-substituted C1 to C30 alkoxy group, a cyano-substituted C3 to C30 cycloalkyl group, a cyano-substituted C6 to C30 aryl group, and/or a cyano-substituted C3 to C30 heteroaryl group, but is not limited thereto.

In some example embodiments, the third material 30v may be represented by Chemical Formula 1.

EDM3-LM3-EAM3     [Chemical Formula 1]

In Chemical Formula 1,

EDM3 may be an electron donating moiety,

EAM3 may be an electron accepting moiety,

LM3 may be a π-conjugated linking moiety that links the electron donating moiety with the electron accepting moiety, and at least one of EDM3, EAM3, or LM3 may include an electron withdrawing group.

In some example embodiments, the third material 30v represented by Chemical Formula 1 may be represented by Chemical Formula 1-1, but is not limited thereto.

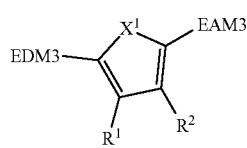

[Chemical Formula 1-1]

In Chemical Formula 1-1, $X^1$ may be O, S, Se, Te, SO, $SO_2$, CO, CR'R", NR''', $SiR^aR^b$, or $GeR^cR^d$, EDM3 may be an electron donating moiety, EAM3 may be an electron accepting moiety, $R^1$, $R^2$, R', R", R''', $R^a$, $R^b$, $R^c$, and $R^d$ may independently be hydrogen, deuterium, a substituted or unsubstituted C1 to C30 alkyl group, a substituted or unsubstituted C1 to C30 alkoxy group, a substituted or unsubstituted C6 to C30 aryl group, a substituted or unsubstituted C3 to C30 heteroaryl group, a halogen, a cyano group, or a nitro group, and $R^1$ and $R^2$, R' and R", $R^a$ and $R^b$, and $R^c$ and $R^d$ may independently be present or may be linked with each other to form a ring, $X^1$, EDM3, $R^1$, $R^2$, and EAM3 may independently be present or adjacent two thereof may be linked with each other to form a ring, and at least one of EDM3, EAM3, $R^1$, $R^2$, R', R", R''', $R^a$, $R^b$, $R^c$, or $R^d$ may include an electron withdrawing group.

In some example embodiments, in Chemical Formula 1-1, EDM3 may include an electron withdrawing group. In some example embodiments, the third material 30v represented by Chemical Formula 1-1 may be, in some example embodiments, represented by one of Chemical Formulae 1-2 to 1-4.

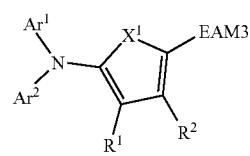

[Chemical Formula 1-2]

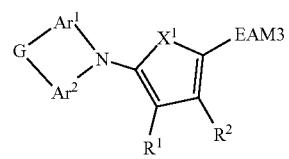

[Chemical Formula 1-3]

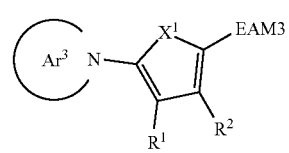

[Chemical Formula 1-4]

In Chemical Formulae 1-2 to 1-4, $X^1$, $R^1$, $R^2$, and EAM3 are the same as described above, $Ar^1$ and $Ar^2$ may independently be hydrogen, deuterium, a substituted or unsubstituted C1 to C30 alkyl group, a substituted or unsubstituted C1 to C30 alkoxy group, a substituted or unsubstituted C3 to C30 cycloalkyl group, a substituted or unsubstituted C6 to C30 aryl group, or a substituted or unsubstituted C3 to C30 heteroaryl group, at least one of $Ar^1$ or $Ar^2$ may be a C1 to C30 alkyl group substituted with a halogen, a cyano group, a nitro group, or a combination thereof; a C1 to C30 alkoxy group substituted with a halogen, a cyano group, a nitro group, or a combination thereof; a C3 to C30 cycloalkyl group substituted with a halogen, a cyano group, a nitro group, or a combination thereof; a C6 to C30 aryl group substituted with a halogen, a cyano group, a nitro group, or a combination thereof; or a C3 to C30 heteroaryl group substituted with a halogen, a cyano group, a nitro group, or a combination thereof, $Ar^3$ may be a nitrogen-containing cyclic group substituted with a halogen, a cyano group, a nitro group, or a combination thereof, G is a single bond, —O—, —S—, —Se—, —Te—, —N=, —$NR^e$—, —$(CR^fR^g)_{n2}$— (n2 is 1 or 2), —$SiR^hR^i$—, —$GeR^jR^k$—, —$(C(R^l)=C(R^m))$—, or $SnR^nR^o$, and $R^1$, $R^2$, R', R", R''', $R^a$, $R^b$, $R^c$, $R^d$, $R^e$, $R^f$, $R^g$, $R^h$, $R^i$, $R^j$, $R^k$, $R^l$, $R^m$, $R^n$, and $R^o$ may independently be hydrogen, deuterium, a substituted or unsubstituted C1 to C30 alkyl group, a substituted or unsubstituted C1 to C30 alkoxy group, a substituted or unsubstituted C6 to C30 aryl group, a substituted or unsubstituted C3 to C30 heteroaryl group, a halogen, a cyano group, or a nitro group, and $R^f$ and $R^g$, $R^h$ and $R^i$, $R^j$ and $R^k$, $R^l$ and $R^m$, and $R^n$ and $R^o$ may independently be present or may be linked with each other to form a ring.

In some example embodiments, at least one of $Ar^1$ or $Ar^2$ may be a C6 to C30 aryl group substituted with a halogen, a cyano group, a nitro group, or a combination thereof or a C3 to C30 heteroaryl group substituted with a halogen, a cyano group, a nitro group, or a combination thereof, for example a phenyl group substituted with a halogen, a cyano group, a nitro group, or a combination thereof; a naphthyl group substituted with a halogen, a cyano group, a nitro group, or a combination thereof; an anthracenyl group substituted with a halogen, a cyano group, a nitro group, or a combination thereof; a phenanthrenyl group substituted with a halogen, a cyano group, a nitro group, or a combination thereof; a pyridinyl group substituted with a halogen, a cyano group, a nitro group, or a combination thereof; a pyridazinyl group substituted with a halogen, a cyano group, a nitro group, or a combination thereof; a pyrimidinyl group substituted with a halogen, a cyano group, a nitro group, or a combination thereof; a pyrazinyl group substituted with a halogen, a cyano group, a nitro group, or a combination thereof; a quinolinyl group substituted with a halogen, a cyano group, a nitro group, or a combination thereof; an isoquinolinyl group substituted with a halogen, a cyano group, a nitro group, or a combination thereof; a naphthyridinyl group substituted with a halogen, a cyano group, a nitro group, or a combination thereof; a cinnolinyl group substituted with a halogen, a cyano group, a nitro group, or a combination thereof; a quinazolinyl group substituted with a halogen, a cyano group, a nitro group, or a combination thereof; a phthalazinyl group substituted with a halogen, a cyano group, a nitro group, or a combination thereof; a benzotriazinyl group substituted with a halogen, a cyano group, a nitro group, or a combination thereof; a pyridopyrazinyl group substituted with a halogen, a cyano group, a nitro group, or a combination thereof; a pyridopyrimidinyl group substituted with a halogen, a cyano group, a nitro group, or a combination thereof; or a pyridopyridazinyl group substituted with a halogen, a cyano group, a nitro group, or a combination thereof.

In some example embodiments, at least one of $Ar^1$ or $Ar^2$ may be a fluorine-substituted C6 to C30 aryl group or a fluorine-substituted C3 to C30 heteroaryl group, for example a fluorine-substituted phenyl group, a fluorine-substituted naphthyl group, a fluorine-substituted anthracenyl group, a fluorine-substituted phenanthrenyl group, a fluorine-substituted pyridinyl group, a fluorine-substituted pyridazinyl group, a fluorine-substituted pyrimidinyl group, a fluorine-substituted pyrazinyl group, a fluorine-substituted quinolinyl group, a fluorine-substituted isoquinolinyl group, a fluorine-substituted naphthyridinyl group, a fluorine-substituted cinnolinyl group, fluorine-substituted quinazolinyl group, a fluorine-substituted phthalazinyl group, a fluorine-substituted benzotriazinyl group, a fluorine-substituted pyridopyrazinyl group, a fluorine-substituted pyridopyrimidinyl group, or a fluorine-substituted pyridopyridazinyl group.

In some example embodiments, the third material 30v represented by Chemical Formula 1-2 may be, in some example embodiments, represented by Chemical Formula 1-2a, and the third material 30v represented by Chemical Formula 1-3 may be, for example represented by Chemical Formula 1-3a, such that the third material 30v may be represented by Chemical Formula 1-2a or Chemical Formula 1-3a, but example embodiments are not limited thereto.

[Chemical Formula 1-2a]

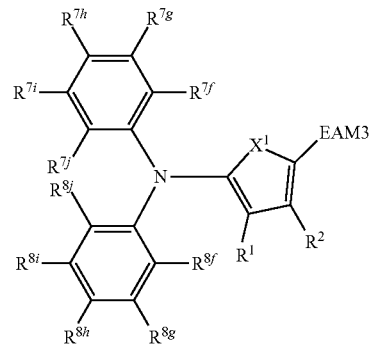

[Chemical Formula 1-3a]

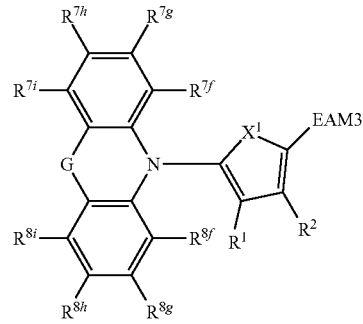

In Chemical Formula 1-2a or 1-3a,

EAM3, $X^1$, $R^1$, $R^2$, and G are the same as described above, $R^{7f}$, $R^{7g}$, $R^{7h}$, $R^{7i}$, $R^{7j}$, $R^{8f}$, $R^{8g}$, $R^{8h}$, $R^{8i}$, and $R^{8j}$ may independently be hydrogen, deuterium, a substituted or unsubstituted C1 to C30 alkyl group, a substituted or unsubstituted C1 to C30 alkoxy group, a substituted or unsubstituted C6 to C30 aryl group, a substituted or unsubstituted C3 to C30 heteroaryl group, a halogen, a cyano group, or a nitro group, $R^{7f}$ to $R^{7j}$ may independently be present or adjacent two thereof may be linked with each other to form a fused ring, $R^{8f}$ to $R^{8j}$ may independently be present or adjacent two thereof may be linked with each other to form a fused ring, and at least one of $R^{7f}$, $R^{7g}$, $R^{7h}$, $R^{7i}$, $R^{7j}$, $R^{8f}$, $R^{8g}$, $R^{8h}$, $R^{8i}$, or $R^{8j}$ may be an electron withdrawing group, wherein the electron withdrawing group may include a halogen; a cyano group; a nitro group; a C1 to C30 alkyl group substituted with a halogen, a cyano group, a nitro group, or a combination thereof; a C1 to C30 alkoxy group substituted with a halogen, a cyano group, a nitro group, or a combination thereof; a C3 to C30 cycloalkyl group substituted with a halogen, a cyano group, a nitro group, or a combination thereof; a C6 to C30 aryl group substituted with a halogen, a cyano group, a nitro group, or a combination thereof; or a C3 to C30 heteroaryl group substituted with a halogen, a cyano group, a nitro group, or a combination thereof.

In some example embodiments, one of $R^{7f}$ to $R^{7j}$ may be an electron withdrawing group.

In some example embodiments, one of $R^{8f}$ to $R^{8j}$ may be an electron withdrawing group.

In some example embodiments, two of $R^{7f}$ to $R^{7j}$ may be an electron withdrawing group.

In some example embodiments, two of $R^{8f}$ to $R^{8j}$ may be an electron withdrawing group.

In some example embodiments, one of $R^{7f}$ to $R^{7j}$ and one of $R^{8f}$ to $R^{8j}$ may be an electron withdrawing group.

In some example embodiments, $R^{7f}$ may be an electron withdrawing group.

In some example embodiments, $R^{7g}$ may be an electron withdrawing group.

In some example embodiments, $R^{7h}$ may be an electron withdrawing group.

In some example embodiments, $R^{7i}$ may be an electron withdrawing group.

In some example embodiments, $R^{7j}$ may be an electron withdrawing group.

In some example embodiments, $R^{8f}$ may be an electron withdrawing group.

In some example embodiments, $R^{8g}$ may be an electron withdrawing group.

In some example embodiments, $R^{8h}$ may be an electron withdrawing group.

In some example embodiments, $R^{8i}$ may be an electron withdrawing group.

In some example embodiments, $R^{8j}$ may be an electron withdrawing group.

In some example embodiments, one of $R^{7f}$ to $R^{7j}$ may be fluorine or a fluorine-containing group.

In some example embodiments, one of $R^{8f}$ to $R^{8j}$ may be fluorine or a fluorine-containing group.

In some example embodiments, two of $R^{7f}$ to $R^{7j}$ may be fluorine or a fluorine-containing group.

In some example embodiments, two of $R^{8f}$ to $R^{8j}$ may be fluorine or a fluorine-containing group.

In some example embodiments, one of $R^{8f}$ to $R^{8j}$ and one of $R^{8f}$ to $R^{8j}$ may be fluorine or a fluorine-containing group.

In some example embodiments, $R^{7f}$ may be fluorine or a fluorine-containing group.

In some example embodiments, $R^{7g}$ may be fluorine or a fluorine-containing group.

In some example embodiments, $R^{7h}$ may be fluorine or a fluorine-containing group.

In some example embodiments, $R^{7i}$ may be fluorine or a fluorine-containing group.

In some example embodiments, $R^{7j}$ may be fluorine or a fluorine-containing group.

In some example embodiments, $R^{8f}$ may be fluorine or a fluorine-containing group.

In some example embodiments, $R^{8g}$ may be fluorine or a fluorine-containing group.

In some example embodiments, $R^{8h}$ may be fluorine or a fluorine-containing group.

In some example embodiments, $R^{8i}$ may be fluorine or a fluorine-containing group.

In some example embodiments, $R^{8j}$ may be fluorine or a fluorine-containing group.

In some example embodiments, one of $R^{7f}$ to $R^{7j}$ may be a cyano group or a cyano-containing group.

In some example embodiments, one of $R^{8f}$ to $R^{8j}$ may be a cyano group or a cyano-containing group.

In some example embodiments, two of $R^{7f}$ to $R^{7j}$ may be a cyano group or a cyano-containing group.

In some example embodiments, two of $R^{8f}$ to $R^{8j}$ may be a cyano group or a cyano-containing group.

In some example embodiments, one of $R^{7f}$ to $R^{7j}$ and one of $R^{8f}$ to $R^{8j}$ may be a cyano group or a cyano-containing group.

In some example embodiments, $R^{7f}$ may be a cyano group or a cyano-containing group.

In some example embodiments, $R^{7g}$ may be a cyano group or a cyano-containing group.

In some example embodiments, $R^{7h}$ may be a cyano group or a cyano-containing group.

In some example embodiments, $R^{7i}$ may be a cyano group or a cyano-containing group.

In some example embodiments, $R^{7j}$ may be a cyano group or a cyano-containing group.

In some example embodiments, $R^{8f}$ may be a cyano group or a cyano-containing group.

In some example embodiments, $R^{8g}$ may be a cyano group or a cyano-containing group.

In some example embodiments, $R^{8h}$ may be a cyano group or a cyano-containing group.

In some example embodiments, $R^{8i}$ may be a cyano group or a cyano-containing group.

In some example embodiments, $R^{8j}$ may be a cyano group or a cyano-containing group.

In some example embodiments, EAM3 may be one group of a set of groups listed in Group 1, but is not limited thereto.

[Group 1]

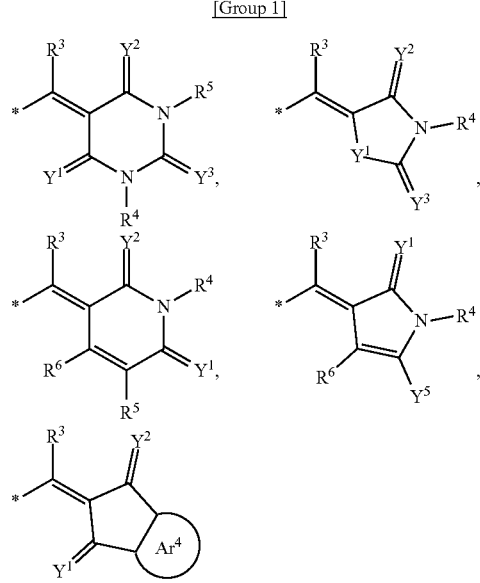

In Group 1, $Y^1$, $Y^2$, and $Y^3$ may independently be O, S, Se, Te, or $C(R^p)(CN)$, wherein $R^p$ is hydrogen, a cyano group, or a C1 to C10 alkyl group, $Ar^4$ may be a substituted or unsubstituted C6 to C30 aromatic ring, a substituted or unsubstituted C3 to C30 heteroaromatic ring, or a fused ring of the foregoing two or more (e.g., two or more of the substituted or unsubstituted C6 to C30 aromatic ring and the substituted or unsubstituted C3 to C30 heteroaromatic ring), $R^3$, $R^4$, $R^5$, and $R^6$ may independently be hydrogen, deuterium, a substituted or unsubstituted C1 to C30 alkyl group, a substituted or unsubstituted C1 to C30 alkoxy group, a substituted or unsubstituted C6 to C30 aryl group, a substituted or unsubstituted C3 to C30 heteroaryl group, a halogen, a cyano group, or a nitro group, and

* may be a linking point.

In some example embodiments, two of $Y^1$ to $Y^3$ of Group 1 may be O.

In some example embodiments, each of $Y^1$ and $Y^2$ of Group 1 may be O.

In some example embodiments, each of $Y^1$ and $Y^2$ of Group 1 may be O and $Y^3$ may be S.

In some example embodiments, each of $Y^2$ and $Y^3$ of Group 1 may be O.

In some example embodiments, $Ar^4$ of Group 1 may be a substituted or unsubstituted benzene, a substituted or unsubstituted naphthalene, a substituted or unsubstituted anthracene, a substituted or unsubstituted thiophene, a substituted or unsubstituted selenophene, a substituted or unsubstituted tellurophene, a substituted or unsubstituted pyridine, a substituted or unsubstituted pyrimidine or a fused ring of the foregoing two or more.

In some example embodiments, $R^3$ of Group 1 may be hydrogen, deuterium, or a methyl group.

In some example embodiments, the third material 30v may be one selected from listed in Group A2:

[Group A2]

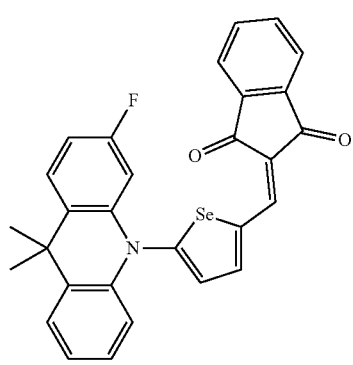

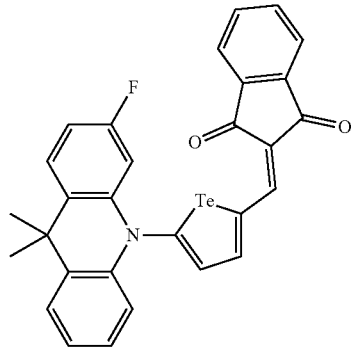

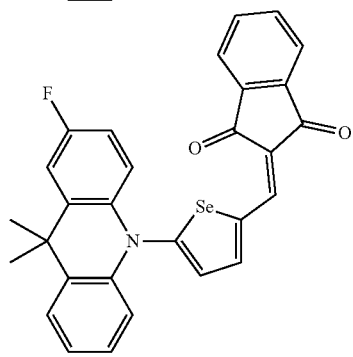

-continued

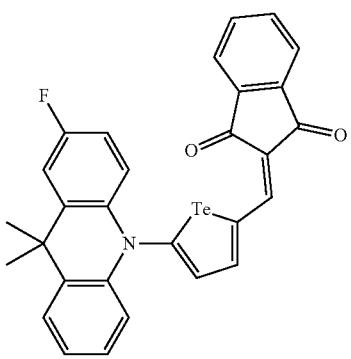

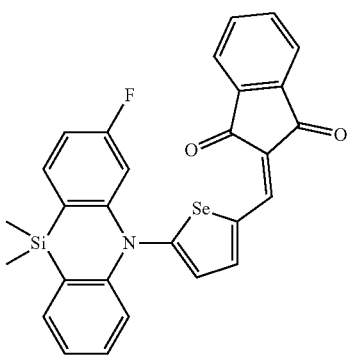

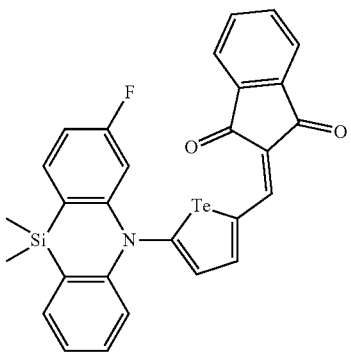

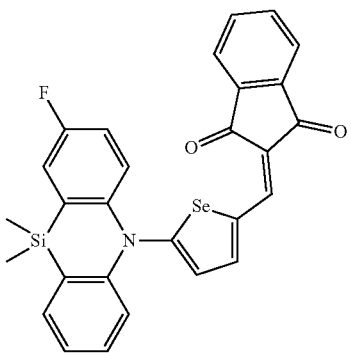

-continued
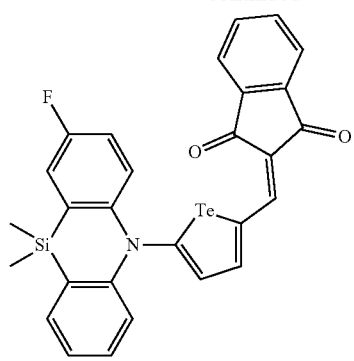
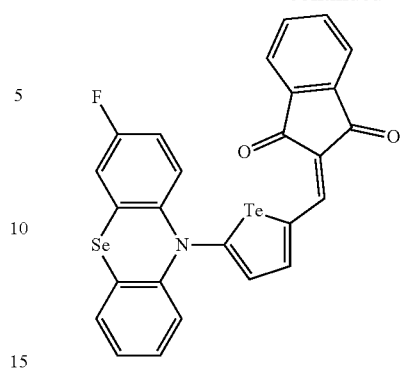
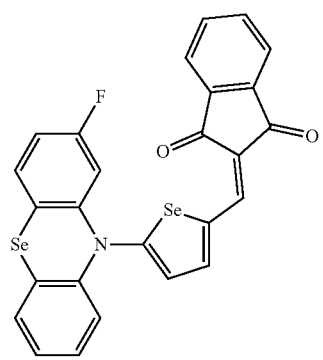
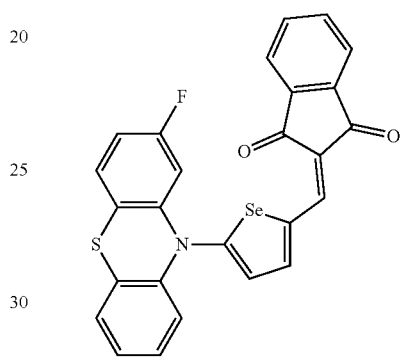
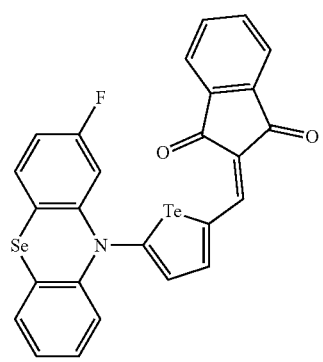
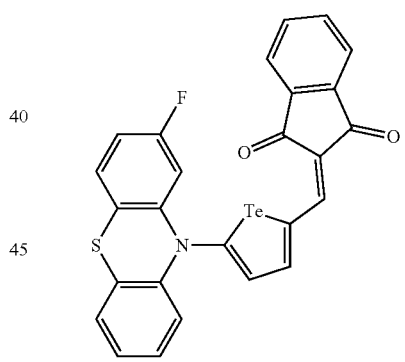
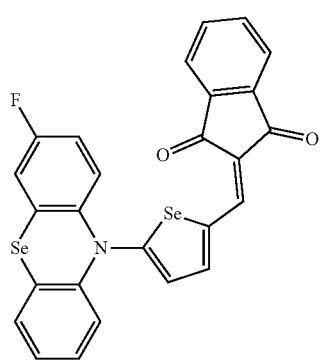
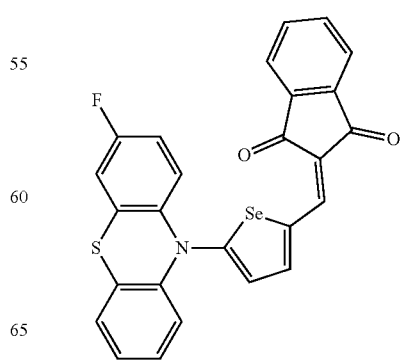

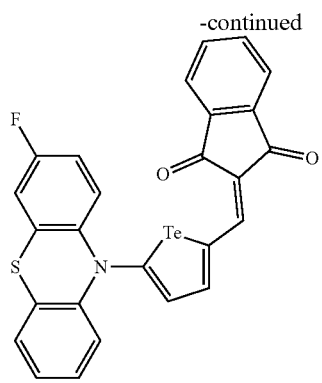
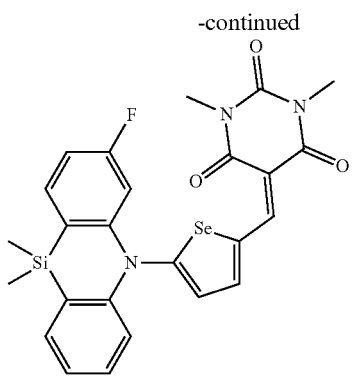
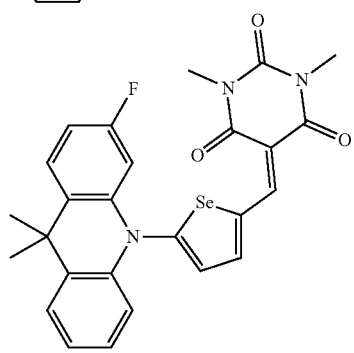
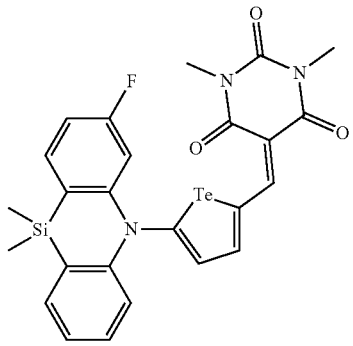
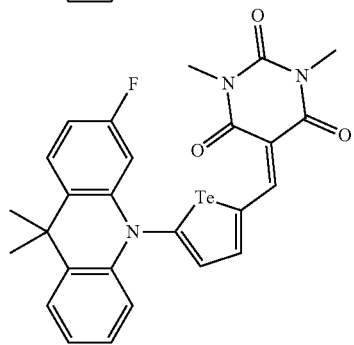
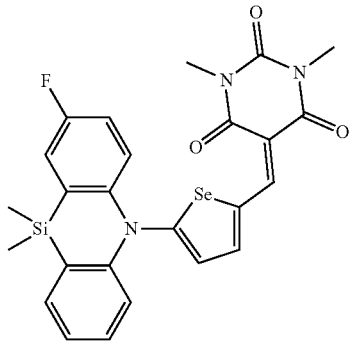
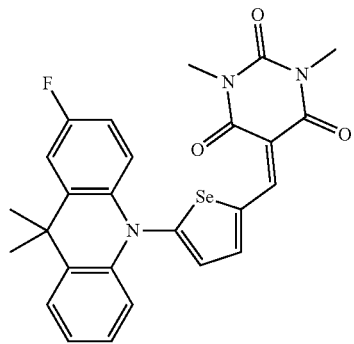
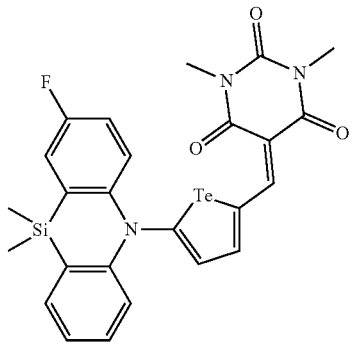
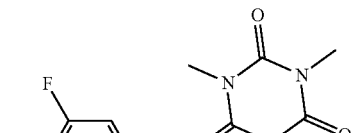
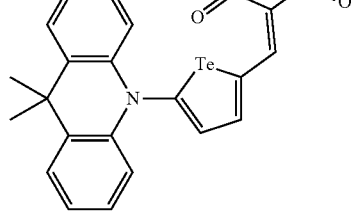
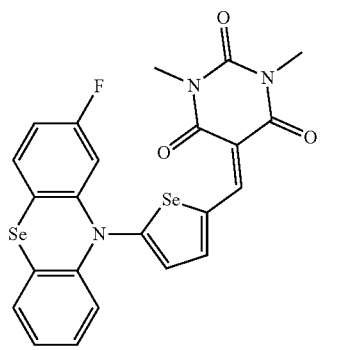

-continued
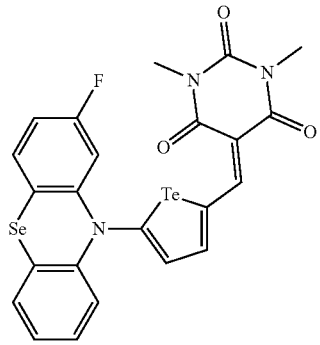
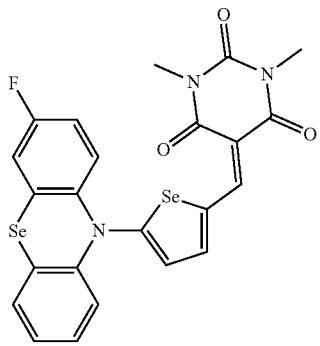
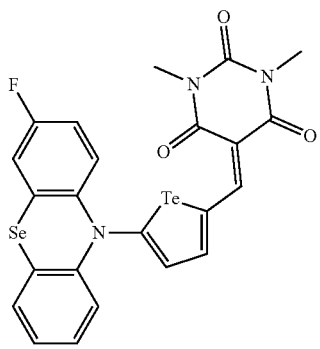
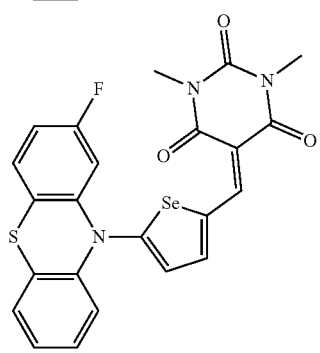
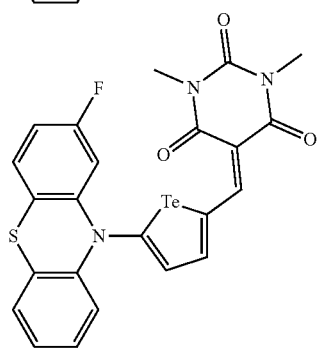
-continued
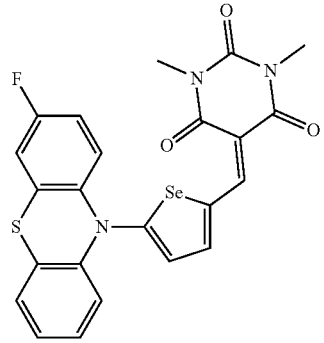
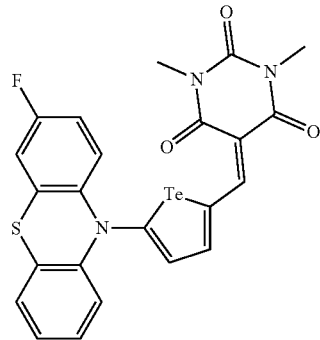
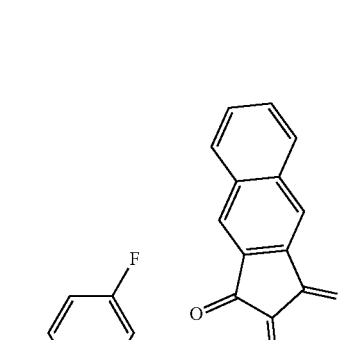
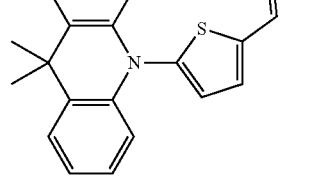
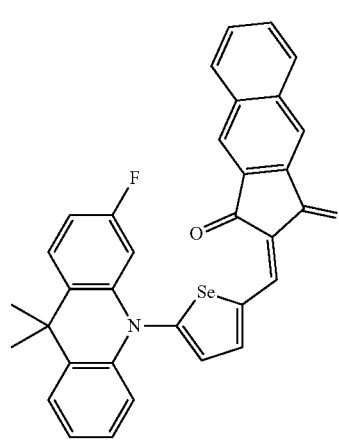

59
-continued
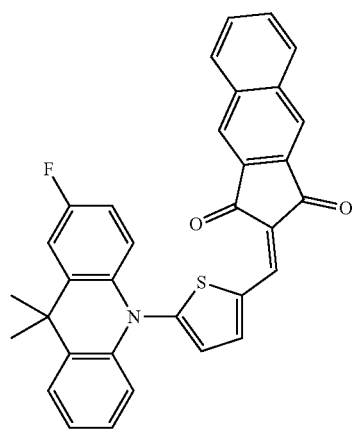
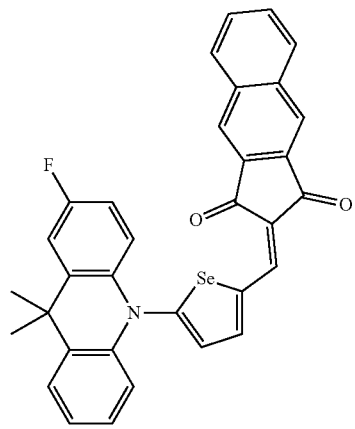
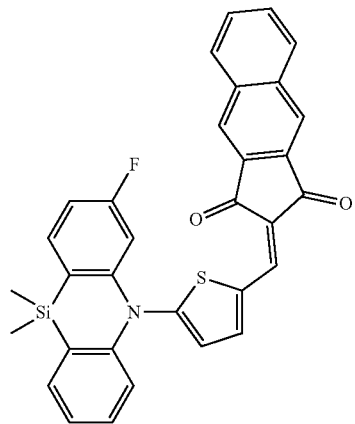
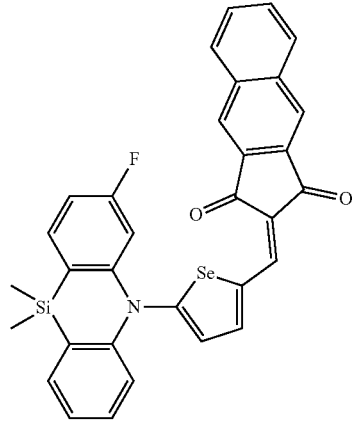
60
-continued
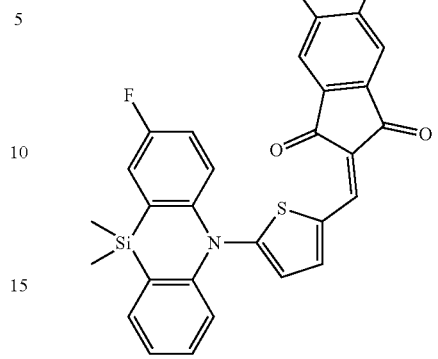
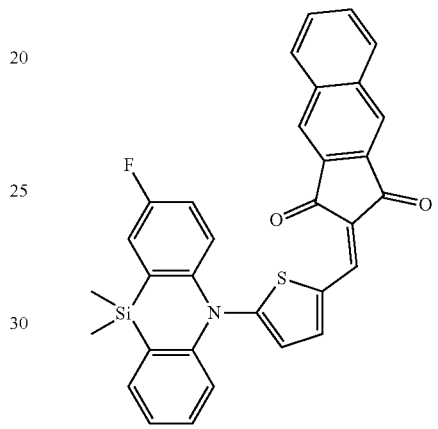
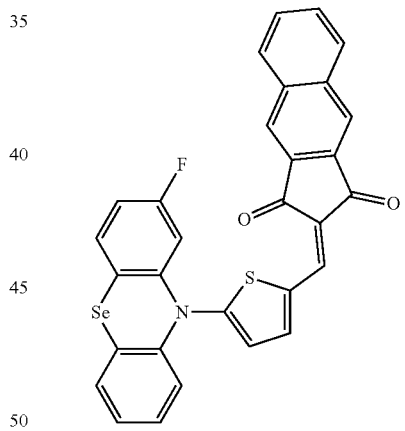
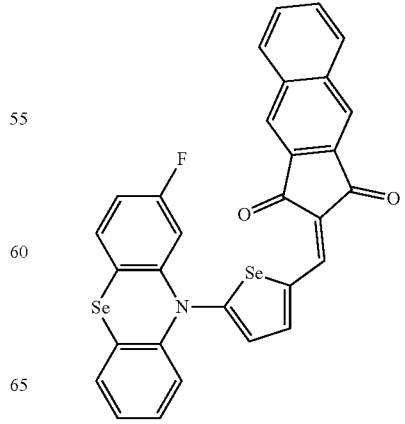

61
-continued
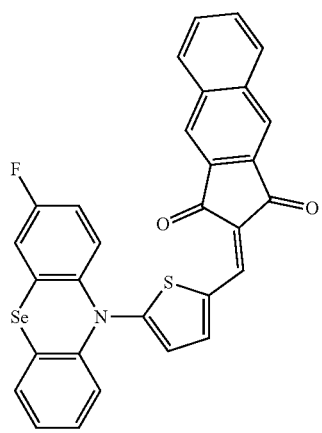
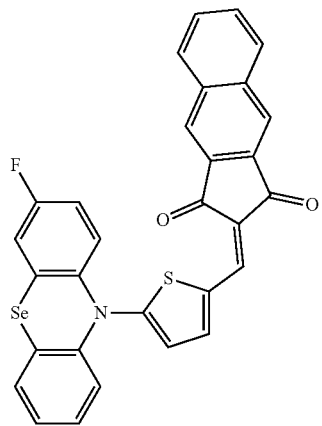
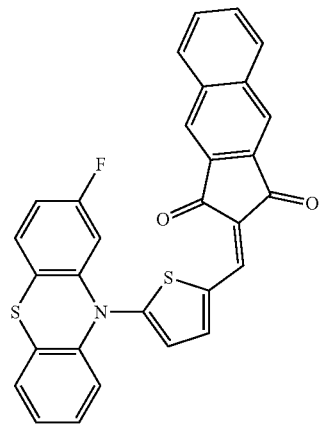
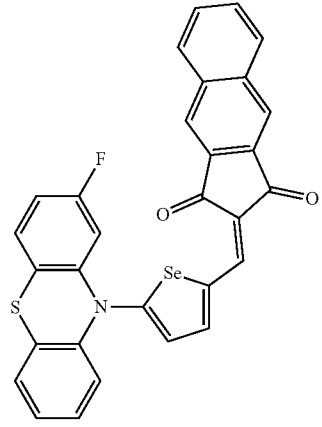
62
-continued
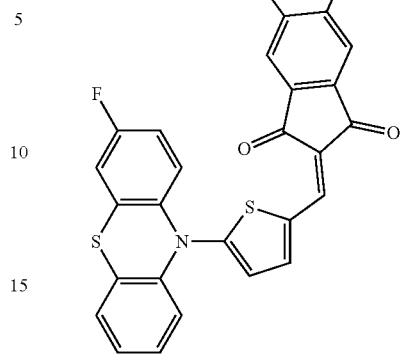
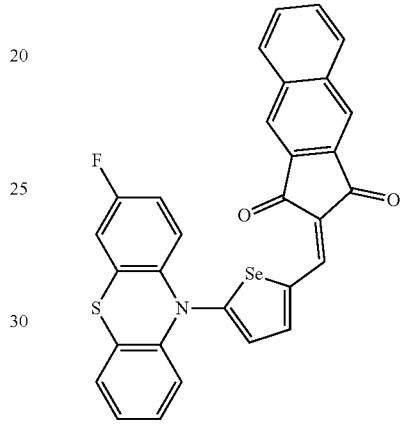
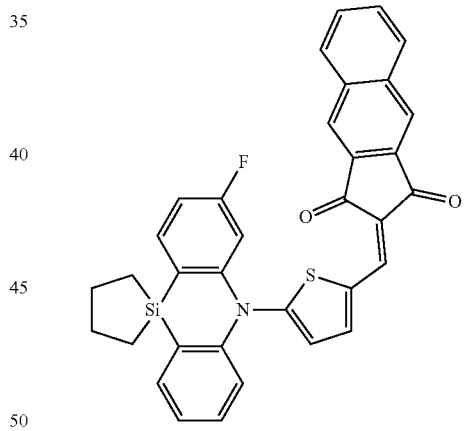

-continued
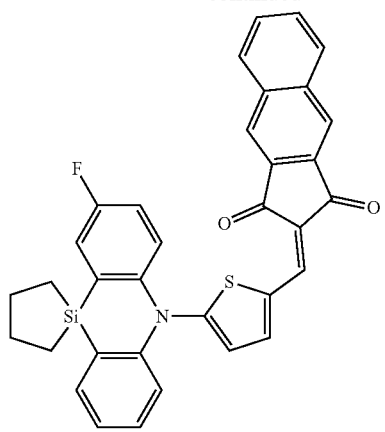
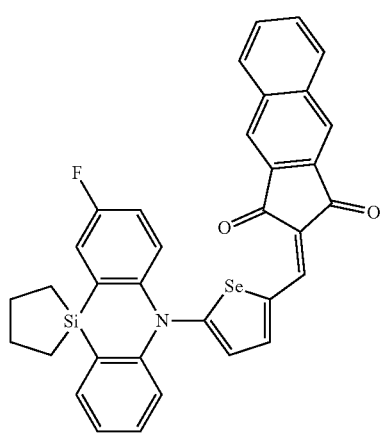
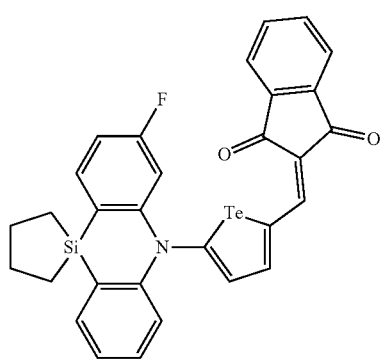
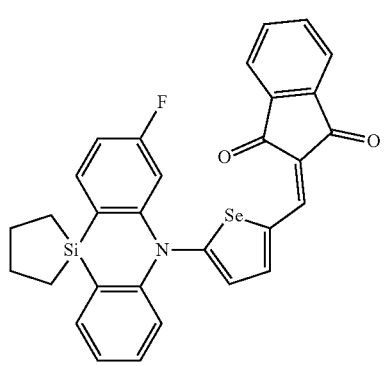
-continued
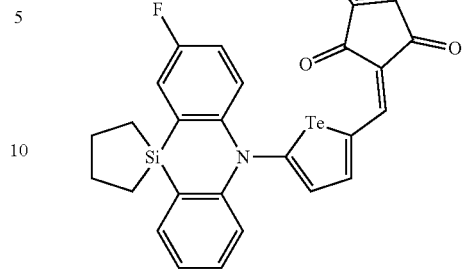
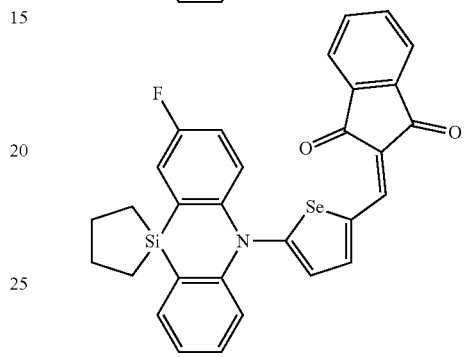
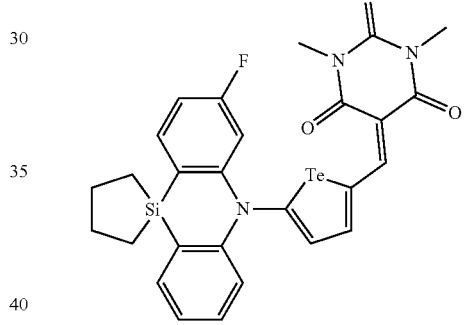
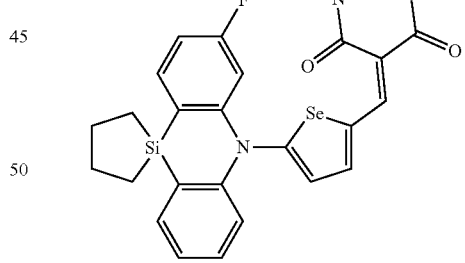
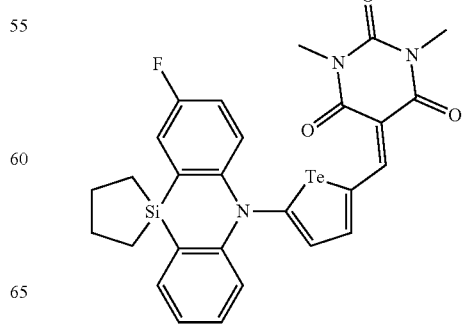

65
-continued
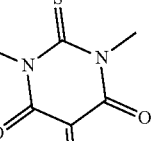
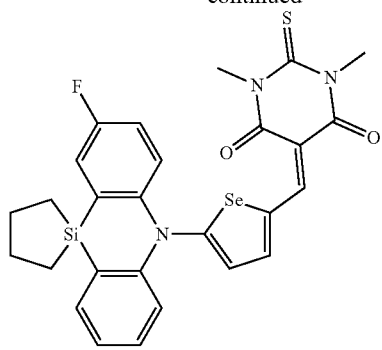
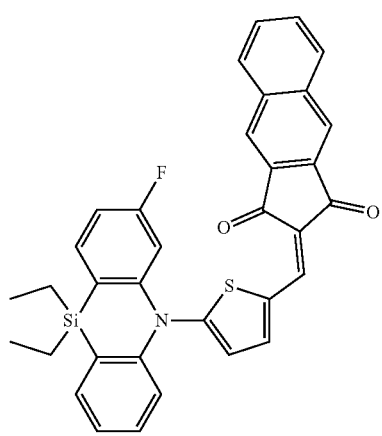
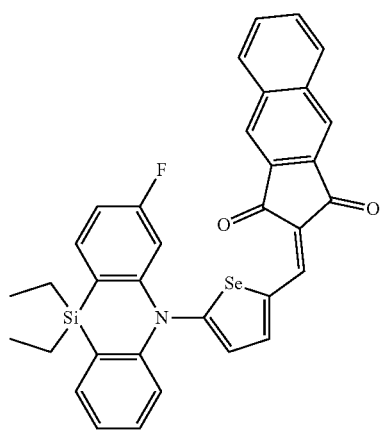
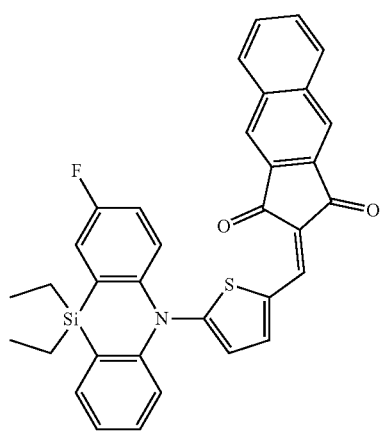
66
-continued
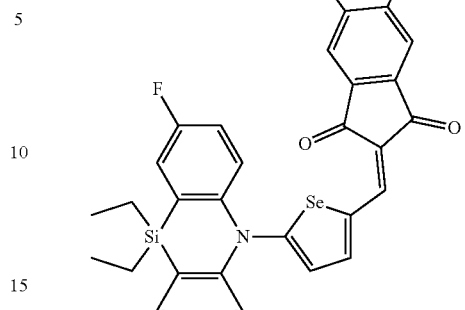
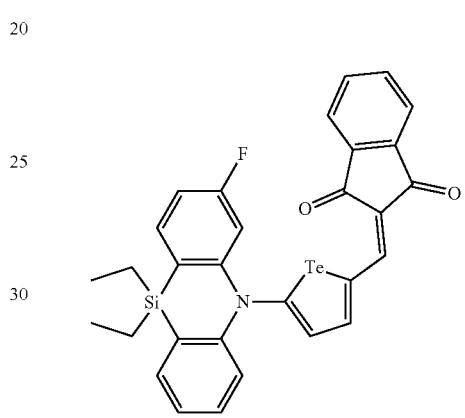

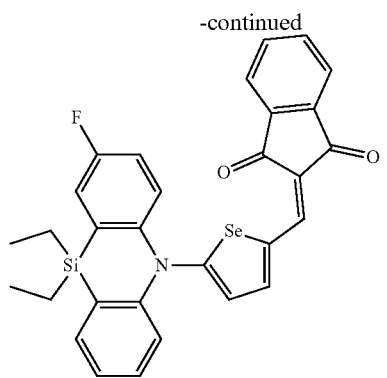
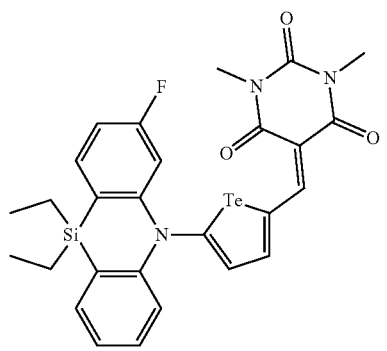
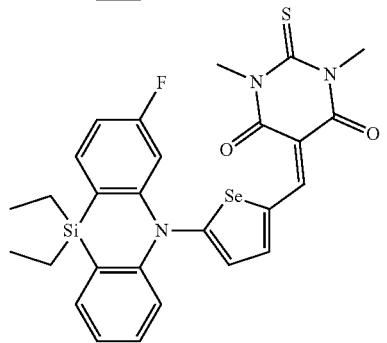
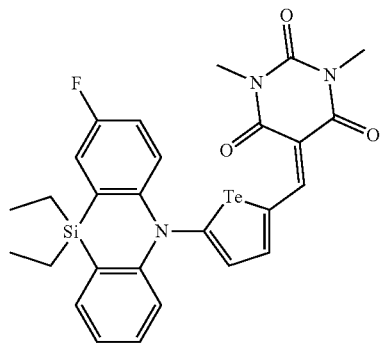
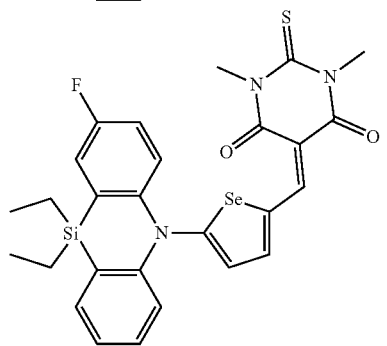
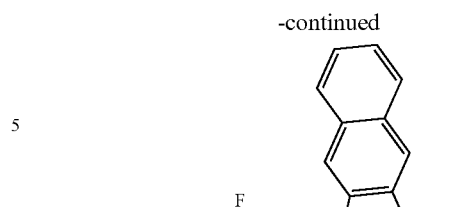
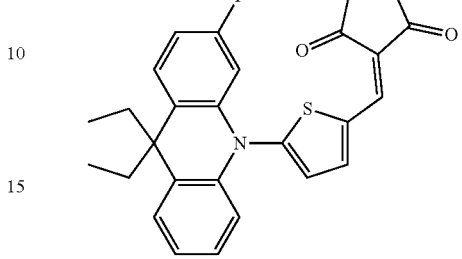
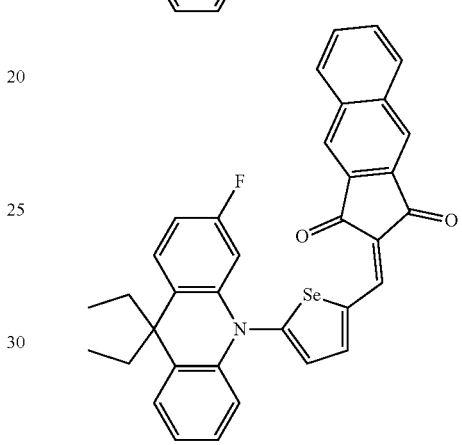
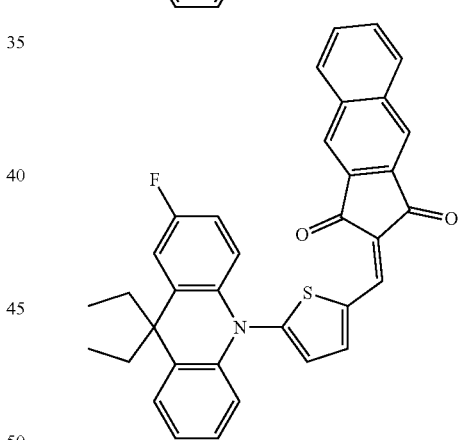
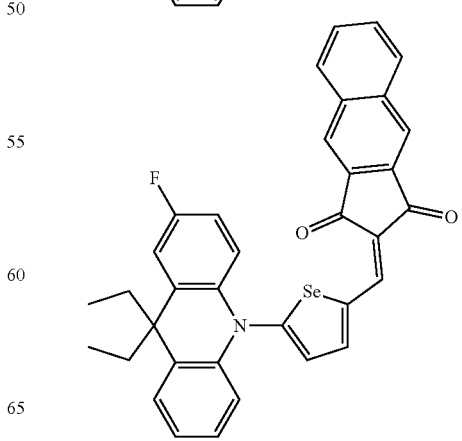

-continued
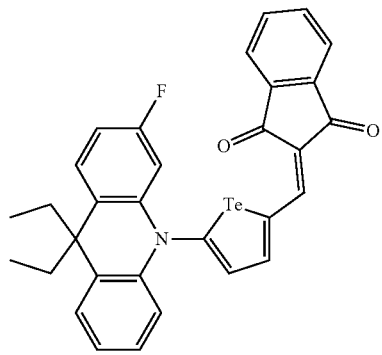
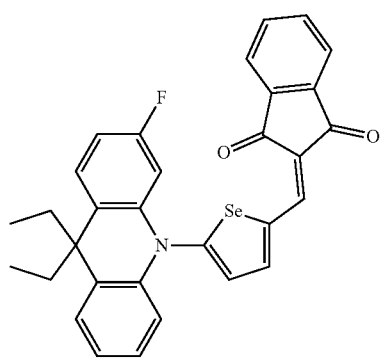
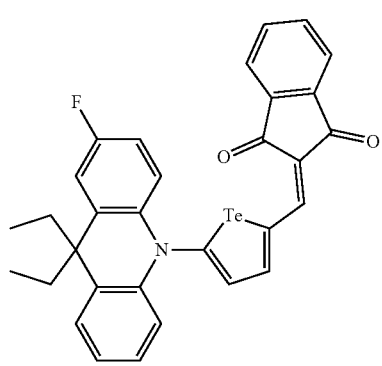
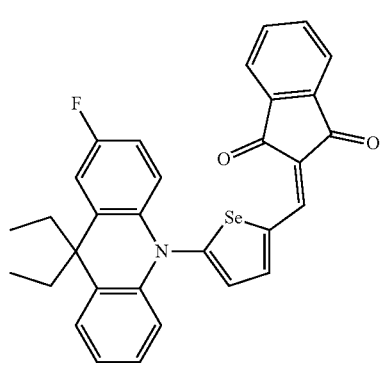
-continued
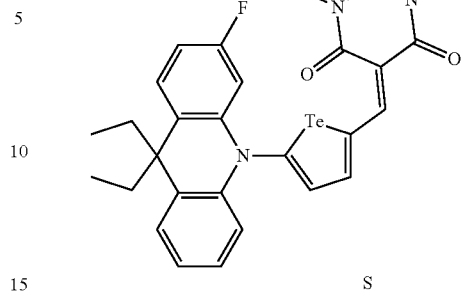
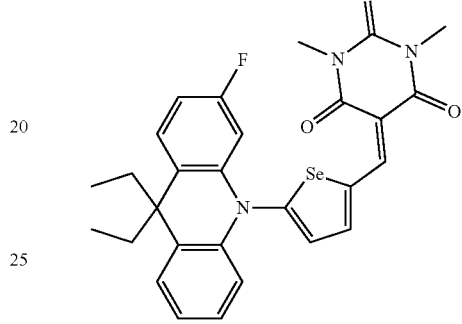
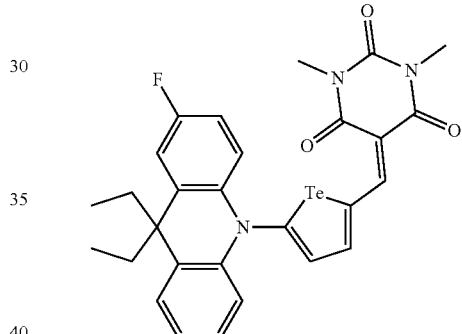
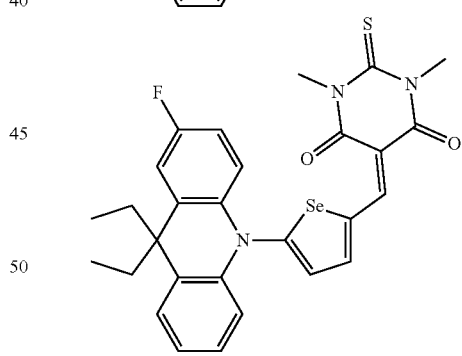
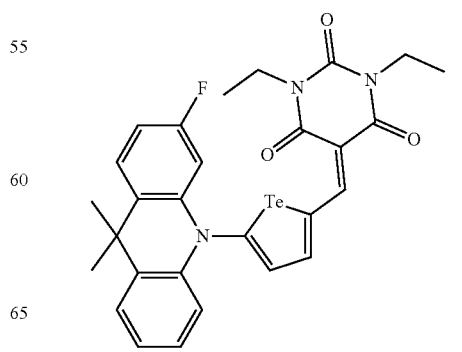

71
-continued
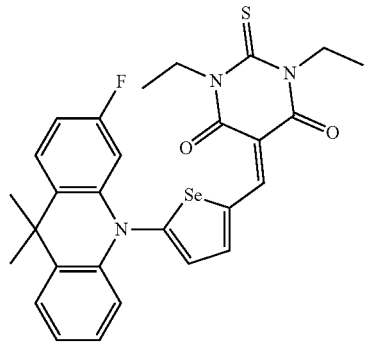
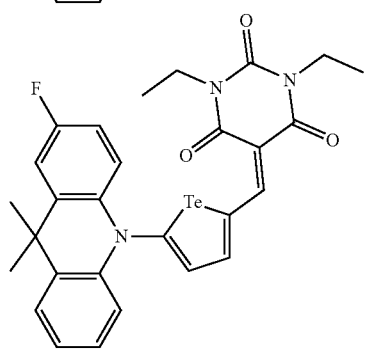
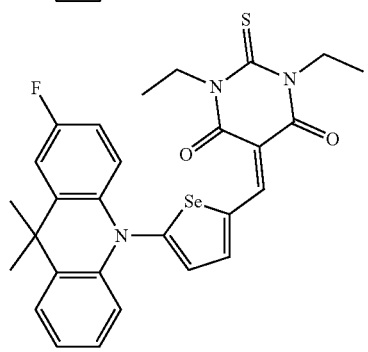
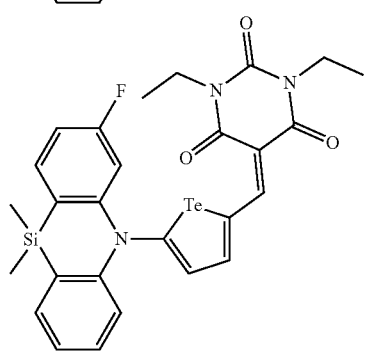
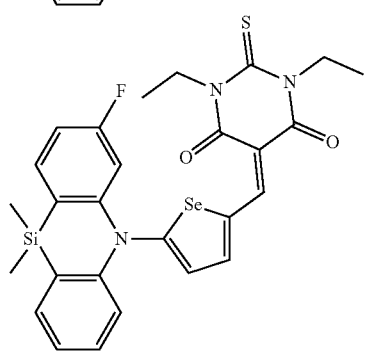
72
-continued
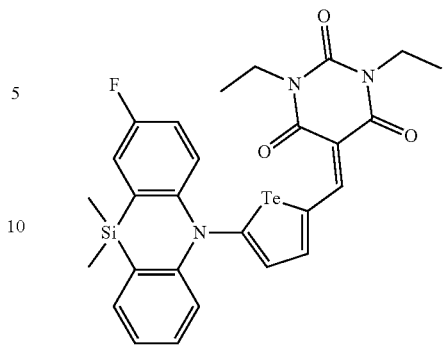
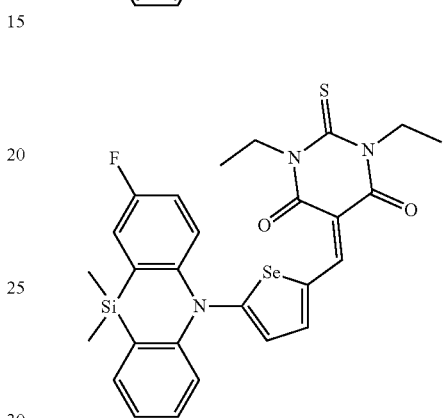
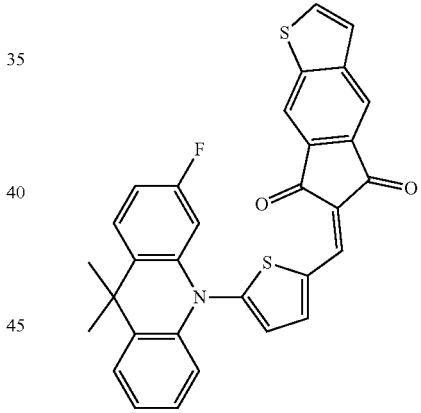
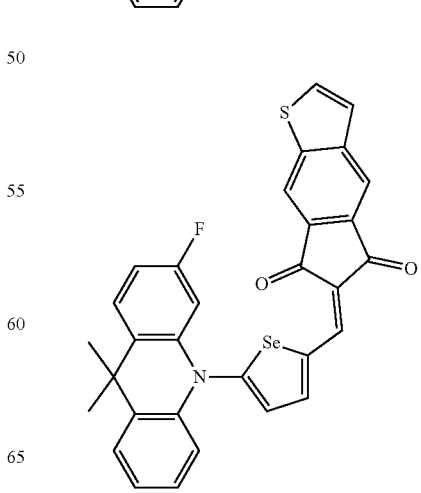

-continued
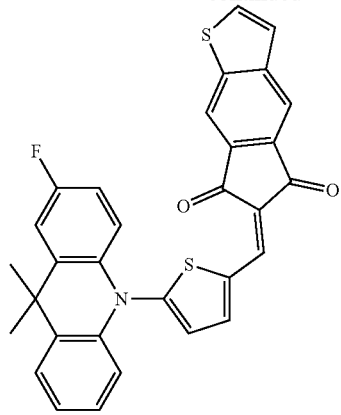
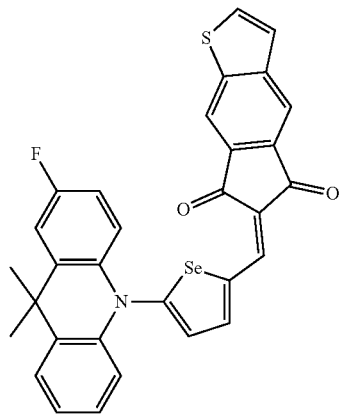
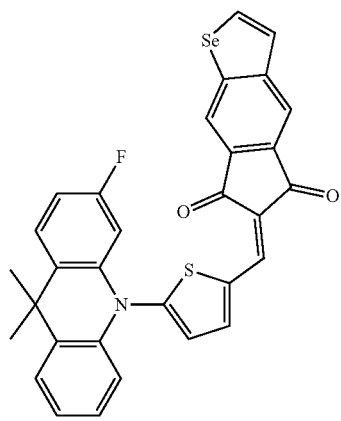
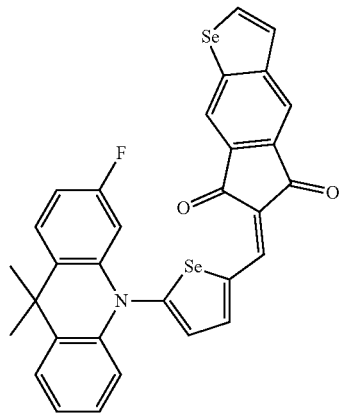
-continued
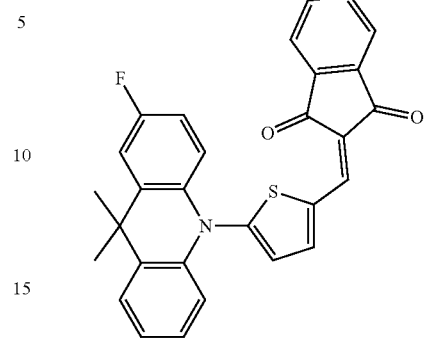
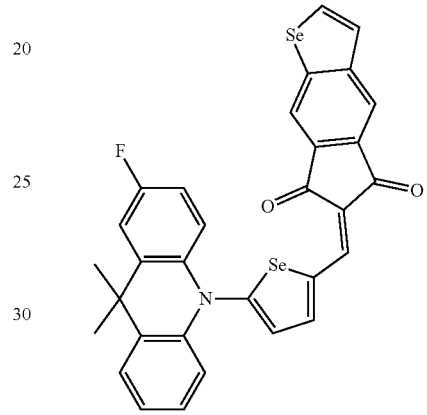
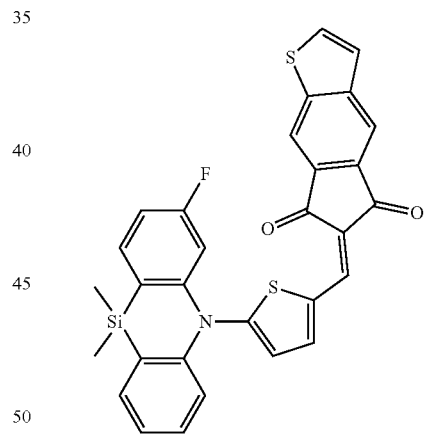
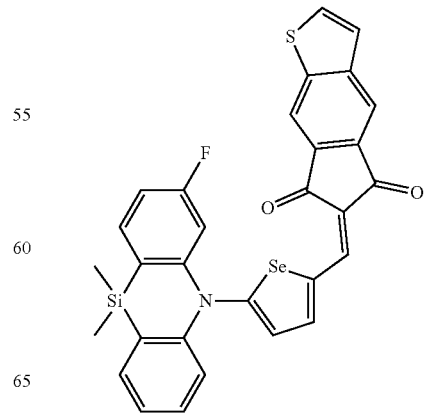

-continued
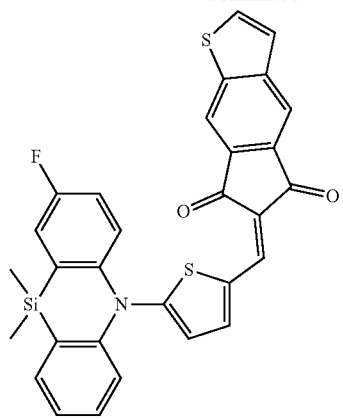
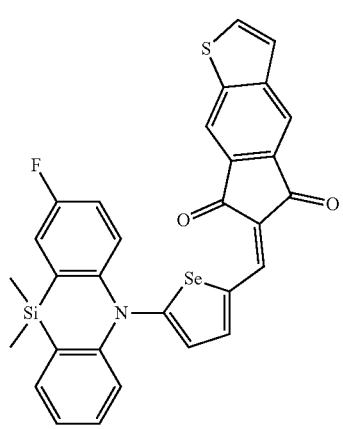
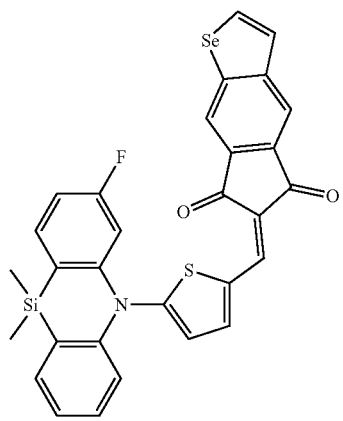
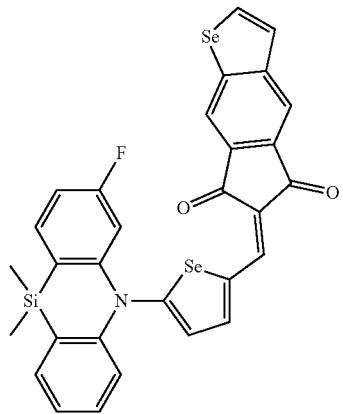
-continued
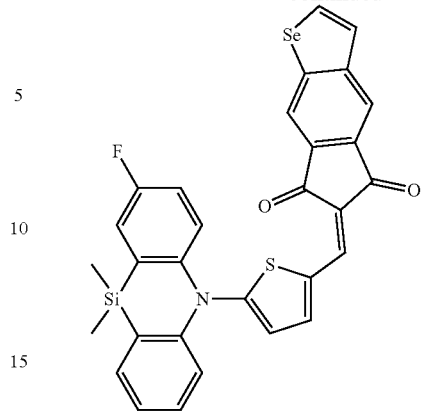
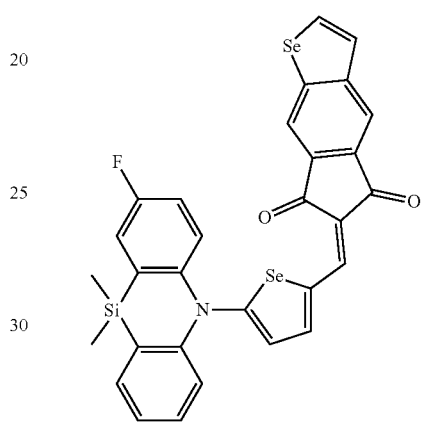
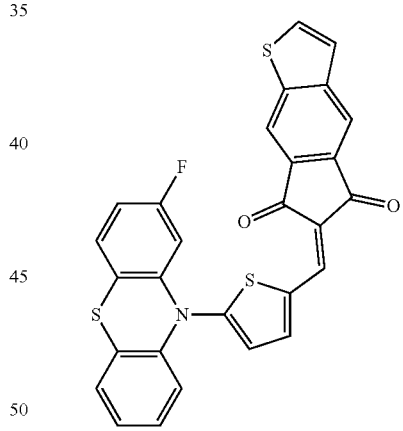
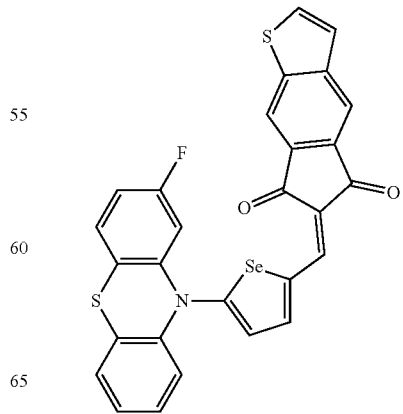

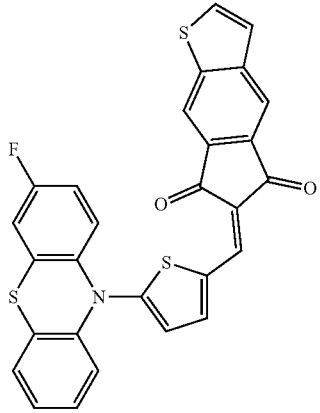
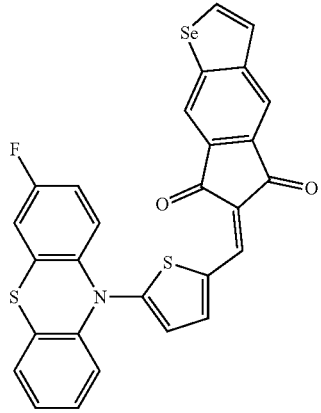
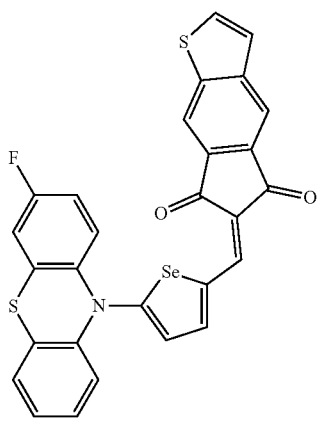
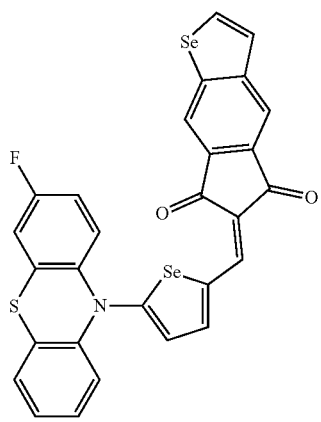
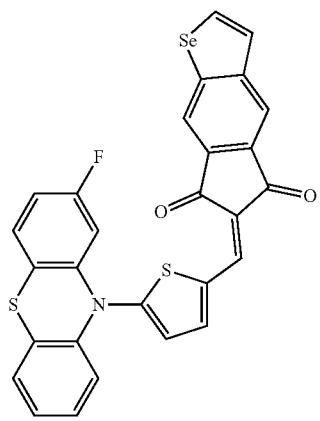
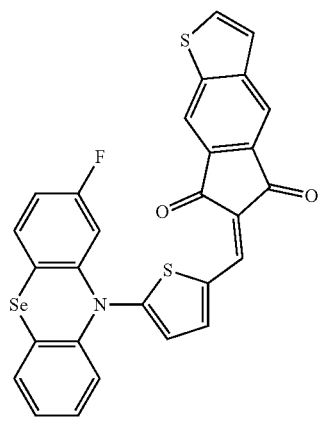
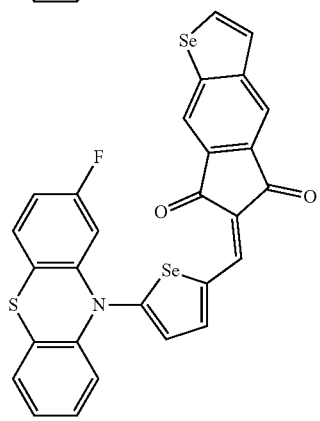
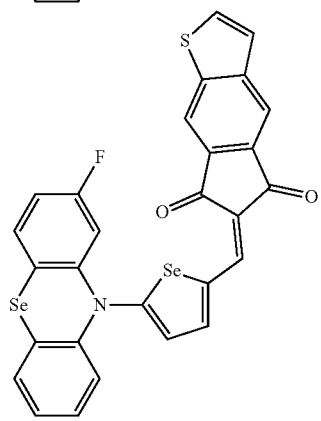

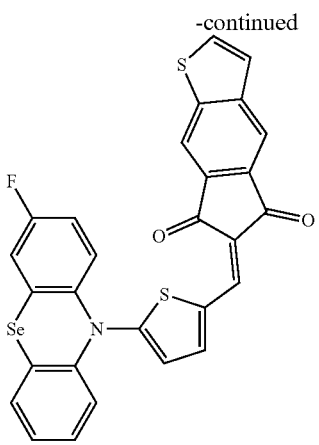
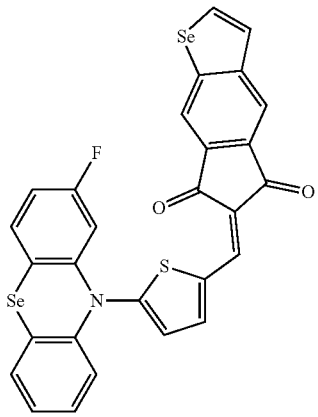
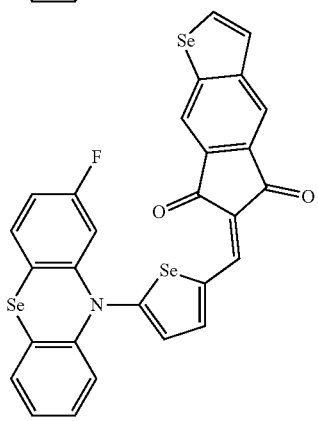
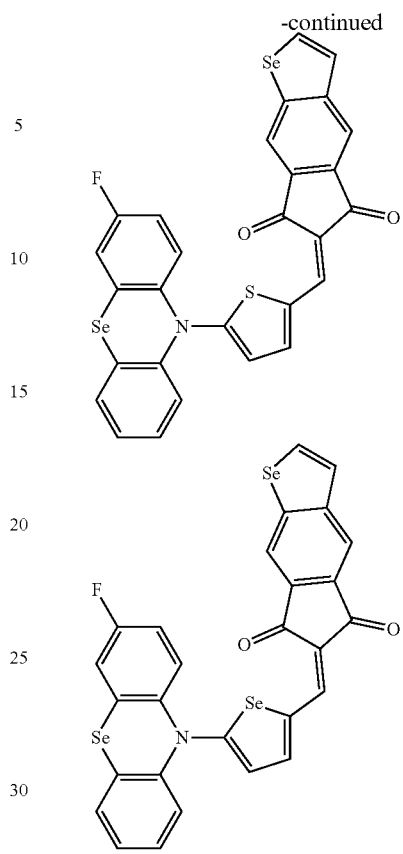

The third material 30v may be included in an amount that does not affect the molecular stability of the first material 30p and the second material 30n and characteristics required in the photoelectric conversion layer 30, and may be, in some example embodiments, in an amount of equal to or less than the first material 30p or the second material 30n. In some example embodiments, the third material 30v may be included in an amount of less than or equal to about 50 volume % (based on a total volume of the first material 30p and the third material 30v), within the range about 1 volume % to about 50 volume %, about 1 volume % to about 40 volume %, about 1 volume % to about 30 volume %, about 1 volume % to about 25 volume %, about 1 volume % to about 20 volume %, about 1 volume % to about 15 volume %, about 1 volume % to about 10 volume %, about 3 volume % to about 50 volume %, about 3 volume % to about 40 volume %, about 3 volume % to about 30 volume %, about 3 volume % to about 25 volume %, about 3 volume % to about 20 volume %, about 3 volume % to about 15 volume %, or about 3 volume % to about 10 volume % based on a total amount of the first material 30p and the third material 30v.

The third material 30v may be admixed with the first material 30p and the second material 30n. Accordingly, the photoelectric conversion layer 30 may include a mixture of the first material 30p, the second material 30n, and the third material 30v. The third material 30v may be in contact with the first material 30p and/or the second material 30n in an atomic scale to modify morphologies or molecular conformations of the first material 30p and/or the second material 30n which form a pn junction. Accordingly, diversities of the morphology and molecular conformation of the photoelectric conversion layer 30 including the first material 30p, the second material 30n, and the third material 30v may be different from diversities the morphology and molecular conformation of the thin film composed of the first material 30p and the second material 30n. Accordingly, characteristics of the photoelectric conversion layer 30 including the first material 30p, the second material 30n, and the third material 30v may be different from those of the thin film formed of the first material 30p and the second material 30n, without the third material 30v. In some example embodiments, the photoelectric conversion layer 30 including the first material 30p, the second material 30n, and the third material 30v may have improved electrical, optical, and heat-resistance properties compared with a thin film formed of the first material 30p and the second material 30n.

In some example embodiments, according to a quantum calculation based on such a morphology, the aforementioned third material 30v having the electron withdrawing group may modify the distributions of energy levels of the first material 30p and/or the second material 30n. In some example embodiments, the aforementioned third material 30v having the electron withdrawing group may modify a distribution of the HOMO energy level or a distribution of the LUMO energy level of the first material 30p or the second material 30n. Accordingly, the distribution of the HOMO energy level or the distribution of the LUMO energy level of the photoelectric conversion layer 30 including the first material 30p, the second material 30n, and the third material 30v may be different from the distribution of the HOMO energy level or the distribution of the LUMO energy level of a thin film composed of the first material 30p and the second material 30n (without the third material 30v).

As such, the photoelectric conversion layer 30 includes the third material 30v as a dopant and thus may be adjusted, so that the first material 30p or the second material 30n may have the distributions of HOMO or LUMO energy levels in a desired region or may not have the distributions of the HOMO or LUMO energy levels in an undesired region.

In some example embodiments, when the first material 30p is a p-type material and the second material 30n is an n-type material, the third material 30v may be a p-type material that modifies the distribution of HOMO energy levels of the first material 30p. In some example embodiments, the distribution of the HOMO energy levels of the first material 30p modified by the third material 30v may be shifted in a deeper HOMO energy level direction compared with the original distribution of the HOMO energy levels of the first material 30p.

In this way, as the distribution of the HOMO energy levels of the first material 30p of the p-type semiconductor is shifted, the desired region of the distribution of the HOMO energy levels may be increased, or the undesired region of the distribution of the HOMO energy levels may be reduced or excluded. In some example embodiments, regions of shallow HOMO energy levels of the p-type material in which relatively more trap sites of charge carriers (e.g., holes) are present among the regions of the distribution of the HOMO energy levels thereof may be reduced or excluded. In some example embodiments, regions of shallower HOMO energy levels than about 5.2 eV in the distribution of the HOMO energy levels of the p-type semiconductor may be reduced or excluded.

In some example embodiments, the distribution of the HOMO energy levels of the first material 30p modified by the third material 30v may be shifted toward a deeper HOMO energy level direction. In some example embodiments, the HOMO energy level of the first material 30p modified by the third material 30v may be deeper within the range of about 0.0001 eV to about 1.2 eV than the original HOMO energy level of the first material 30p. The HOMO energy level of the third material 30v may be deeper than the original HOMO energy level of the first material 30p. In some example embodiments, the original HOMO energy level of the first material 30p may be about 5.0 eV to about 5.8 eV and the HOMO energy level of the third material 30v may be from about 5.1 eV to about 6.5 eV.

In some example embodiments, the HOMO energy level of the second material 30n, which is an n-type material, may be deeper than the HOMO energy levels of the first material 30p and the third material 30v and in some example embodiments, the HOMO energy level of the third material 30v may be between the HOMO energy level of the first material 30p and the HOMO energy level of the second material 30n. In some example embodiments, a difference between the HOMO energy level of the third material 30v and the HOMO energy level of the second material 30n may be smaller than a difference between the HOMO energy level of the first material 30p and the HOMO energy level of the second material 30n. Within the range, the HOMO energy level of the first material 30p may be for example about 5.0 eV to about 5.8 eV, the HOMO energy level of the second material 30n may be for example about 6.2 eV to about 7.2 eV, and the HOMO energy level of the third material 30v may be for example about 5.1 eV to about 6.5 eV.

Accordingly, the HOMO energy level of the photoelectric conversion layer 30 including the first, second, and third materials 30p, 30n, and 30v may be deeper than that of a thin film formed of the first and second materials 30p and 30n (without the third material 30v), in some example embodiments, greater than or equal to about 0.001 eV deeper, in some example embodiments, about 0.001 eV to about 1.2 eV deeper than that of a thin film formed of the first and second materials 30p and 30n (without the third material 30v).

As such, the distribution of the energy levels of the first material 30p or the second material 30n may be adjusted, so that regions of energy levels in which relatively more trap sites of charge carriers are present in the photoelectric conversion layer 30 (e.g., regions of shallow HOMO energy levels) may be reduced or excluded, and thus remaining charge carriers may be reduced or prevented from staying in the trap sites among charge carriers moving from the photoelectric conversion layer 30 to the first electrode 10 and/or the second electrode 20. Accordingly, an after-image (image-sticking) due to the remaining charge carriers accumulated in the photoelectric conversion layer 30 may be reduced or prevented, resultantly, improving electrical performance of the photoelectric conversion device 100.

In some example embodiments, the third material 30v may change an absorption spectrum of the photoelectric conversion layer 30. In some example embodiments, the wavelength selectivity of the photoelectric conversion layer 30 including the first material 30p, the second material 30n, and the third material 30v may be higher than the wavelength selectivity of the thin film of the first material 30p and the second material 30n (without the third material 30v). In some example embodiments, the full width at half maximum (FWHM) of the absorption spectrum of the photoelectric conversion layer 30 including the first material 30p, the second material 30n and the third material 30v may be narrower than the half width of the absorption spectrum (e.g., a FWHM of the absorption spectrum) of a thin film composed of (e.g., formed of) the first material 30p and the second material 30n (without the third material 30v). Herein, the full width at half maximum (FWHM) is the width of the wavelength range corresponding to half the peak absorption point (maximum absorption wavelength). Small FWHM means high wavelength selectivity by absorbing light in a narrow wavelength spectrum. In some example embodiments, the FWHM of the absorption spectrum of the photoelectric conversion layer 30 including the first material 30p, the second material 30n, and the third material 30v may be about 2 nm to about 30 nm, within the range, about 3 nm to about 30 nm, about 5 nm to about 30 nm, about 5 nm to about 25 nm, or about 5 nm to about 20 nm narrower than the FWHM of the absorption spectrum of the thin film of the first material 30p and the second material 30n (without the third material 30v).

In some example embodiments, the third material 30v may change heat resistance characteristics of the photoelectric conversion layer 30. In some example embodiments, the heat resistance of the photoelectric conversion layer 30 including the first material 30p, the second material 30n and the third material 30v may be improved over the heat resistance of the thin film composed of the first material 30p and the second material 30n (without the third material 30v). In some example embodiments, the photoelectric conversion layer 30 including the first material 30p, the second material 30n, and the third material 30v may substantially maintain the optical and electrical properties even at a high temperature subsequent process of about 180° C., about 190° C., or about 200° C.

As shown in FIG. 1B, the photoelectric conversion layer 30 may be an intrinsic layer 30i in which the aforementioned first material 30p, second material 30n, and third material 30v are blended in a form of a bulk heterojunction.

The first material 30p and the second material 30n may be blended in a volume ratio of about 1:9 to about 9:1, for example about 2:8 to about 8:2, about 3:7 to about 7:3, about 4:6 to about 6:4, or about 5:5.

In some example embodiments, the photoelectric conversion layer 30 may be a ternary system of the first material 30p, the second material 30n, and the third material 30v.

As shown in FIG. 1C, the photoelectric conversion layer 30 may include at least two separate thin film layers (e.g., thin film layers) 32-1 and 32-2 that include different combinations of the first to third materials 30p, 30n, and 30v. For example, in some example embodiments, the first thin film layer 32-1 includes at least one material of the aforementioned first material 30p, second material 30n, and third material 30v and excludes at least another material of the aforementioned first material 30p, second material 30n, and third material 30v, and the separate, second thin film layer 32-2 on the thin film layer 32-1 includes at least the other material of the aforementioned first material 30p, second material 30n, and third material 30v and excludes at least the one material of the aforementioned first material 30p, second material 30n, and third material 30v. In FIG. 1C, the one material is the first material 30p, and the other material is the second material 30n, and both the first and second thin film layers 32-1 and 32-2 include the third material 30v, but example embodiments are not limited thereto.

In some example embodiments, the first thin film layer 32-1 may include both the first and second materials 30p and 30n (where either the first or second material 30p or 30n is the one material) and excludes the third material 30v, while the second thin film layer 32-2 may include the third material 30v and excludes both the first and second materials 30p and 30n.

In some example embodiments, the first thin film layer 32-1 may include the aforementioned first material 30p and third material 30v (e.g., a mixture thereof), either of the first or third materials 30p or 30v being the one material, and the other material in the second thin film layer 32-2 may include the aforementioned second material 30n. In some example embodiments, the first thin film layer 32-1 may include the aforementioned second material 30n and third material 30v (e.g., a mixture thereof), either of the second or third materials 30n or 30v being the one material, and the other material in the second thin film layer 32-2 may include the aforementioned first material 30p.

In some example embodiments, the photoelectric conversion layer 30 may include an additional, third thin film layer (not shown in FIG. 1C), and the first, second and third thin film layers of the photoelectric conversion layer may include separate, different materials of the first material 30p, second material 30n, or third material 30v.

As shown in FIG. 1C, the second thin film layer 32-2 is in direct contact with the first thin film layer 32-1, but example embodiments are not limited thereto, and the first and second thin film layers 32-1 and 32-2 may be isolated from direct contact with each other by one or more interposing layers (e.g., an auxiliary layer according to any example embodiments as described herein).

As shown in FIG. 1C, the first thin film layer 32-1 may be between the second thin film layer 32-2 and the first electrode 10 (e.g., in contact with the first electrode 10), and the second thin film layer 32-2 may be between the first thin film layer 32-1 and the second electrode 20 (e.g., in contact with the second electrode 20), but example embodiments are not limited thereto, and in some example embodiments the respective positions of the first and second thin film layers 32-1 and 32-2 may be swapped, such that the second thin film layer 32-2 may be between the first thin film layer 32-1 and the first electrode 10 (e.g., in contact with the first electrode 10), and the first thin film layer 32-1 may be between the second thin film layer 32-2 and the second electrode 20 (e.g., in contact with the second electrode 20).

In some example embodiments, the photoelectric conversion layer 30 may be provided independently of the other elements of the photoelectric conversion device 100.

The photoelectric conversion device 100 may further include an anti-reflection layer (not shown) on one surface of the first electrode 10 or the second electrode 20. The anti-reflection layer may be disposed at a light incidence side and lower reflectance of light of incident light and thereby light absorbance is further improved. In some example embodiments, when light is incident to the first electrode 10, the anti-reflection layer may be disposed on the first electrode 10, and when light is incident to the second electrode 20, anti-reflection layer may be disposed under the second electrode 20.

The anti-reflection layer may include, for example a material having a refractive index of about 1.6 to about 2.5, and may include for example at least one of metal oxide, metal sulfide, or an organic material having a refractive index within the ranges. The anti-reflection layer may include, for example a metal oxide such as aluminum-containing oxide, molybdenum-containing oxide, tungsten-containing oxide, vanadium-containing oxide, rhenium-containing oxide, niobium-containing oxide, tantalum-containing oxide, titanium-containing oxide, nickel-containing oxide, copper-containing oxide, cobalt-containing oxide, manganese-containing oxide, chromium-containing oxide, tellurium-containing oxide, or a combination thereof; metal sulfide such as zinc sulfide; or an organic material such as an amine derivative, but is not limited thereto.

In the photoelectric conversion device 100, when light enters from the first electrode 10 or the second electrode 20 and the photoelectric conversion layer 30 may be configured to absorb light in a particular (or, alternatively, predetermined) wavelength spectrum, excitons may be produced thereinside. The excitons are separated into holes and electrons in the photoelectric conversion layer 30, and the separated holes are transported to an anode that is one of the first electrode 10 or the second electrode 20 and the separated electrons are transported to the cathode that is the other of the first electrode 10 and the second electrode 20 so as to flow a current.

Figure 2:
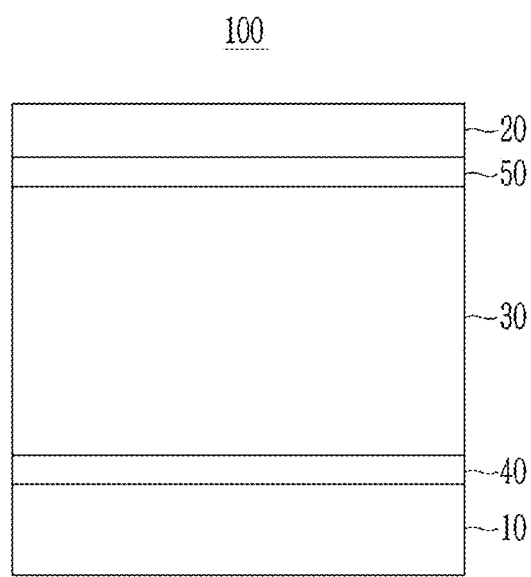
FIG. 2 is a cross-sectional view showing an example of a photoelectric conversion device according to some example embodiments.

FIG. 2 is a cross-sectional view showing an example of a photoelectric conversion device according to some example embodiments.

Referring to FIG. 2, a photoelectric conversion device 100 according to some example embodiments includes a first electrode 10, a second electrode 20, and a photoelectric conversion layer 30, like some example embodiments. However, the photoelectric conversion device 100 according to some example embodiments may further include auxiliary layers 40 and 50 formed between the first electrode 10 and the photoelectric conversion layer 30 and between the second electrode 20 and the photoelectric conversion layer 30, unlike some example embodiments.

The auxiliary layers 40 and 50 may include a hole injecting layer (HIL) to facilitate the injection of holes, a hole transporting layer (HTL) to facilitate the transport of holes, an electron blocking layer (EBL) to block movement of electrons, electron injecting layer (EIL) to facilitate electron injection, electron transporting layer (ETL) to facilitate electron transport, and/or a hole blocking layer (HBL) to block movement of holes, but are not limited thereto.

The auxiliary layers 40 and 50 may independently include an organic material, an inorganic material and/or organic/inorganic material.

In some example embodiments, one of the auxiliary layers 40 and 50 may include an inorganic auxiliary layer. The inorganic auxiliary layer may include, in some example embodiments, a lanthanide element, calcium (Ca), potassium (K), aluminum (Al), or an alloy thereof. The lanthanide element may include, in some example embodiments, ytterbium (Yb). The inorganic auxiliary layer may have a thickness of less than or equal to about 5 nm.

In some example embodiments, one of the auxiliary layers 40 and 50 may include an organic auxiliary layer. The organic auxiliary layer may include, in some example embodiments, a compound represented by Chemical Formula 2A or 2B, but is not limited thereto.

[Chemical Formula 2A]

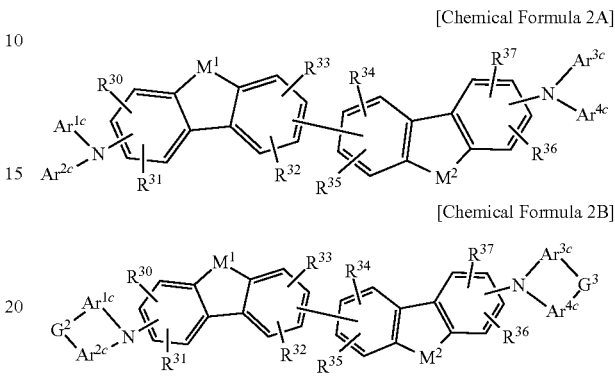

[Chemical Formula 2B]

In Chemical Formula 2A or 2B, $M^1$ and $M^2$ may independently be O, S, Se, Te, $CR^qR^r$, $SiR^sR^t$, or $NR^u$, $Ar^{1c}$, $Ar^{2c}$, $Ar^{3c}$, and $Ar^{4c}$ may independently be a substituted or unsubstituted C6 to C30 aryl group or a substituted or unsubstituted C3 to C30 heteroaryl group, $G^2$ and $G^3$ may independently be a single bond, $-(CR^vR^w)_{n3}-$, $-O-$, $-S-$, $-Se-$, $-N=$, $-NR^x-$, or $-SiR^yR^z-$, wherein n3 is 1 or 2, and $R^{30}$ to $R^{37}$ and $R^q$ to $R^z$ may independently be hydrogen, deuterium, a substituted or unsubstituted C1 to C30 alkyl group, a substituted or unsubstituted C1 to C30 alkoxy group, a substituted or unsubstituted C6 to C30 aryl group, a substituted or unsubstituted C3 to C30 heterocyclic group, a halogen, a cyano group, or a nitro group.

In some example embodiments, the organic auxiliary layer may include a compound represented by Chemical Formula 2A-1 or 2B-1, but is not limited thereto.

[Chemical Formula 2A-1]

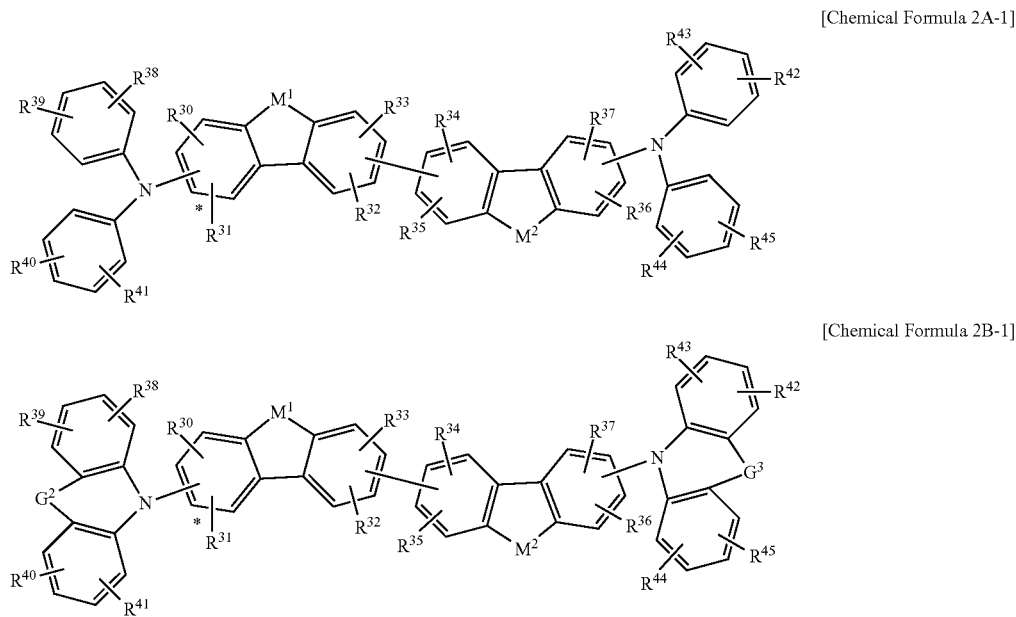

[Chemical Formula 2B-1]

In Chemical Formula 2A-1 or 2B-1, $M^1$, $M^2$, $G^2$, $G^3$, and $R^{30}$ to $R^{37}$ are the same as described above, $R^{38}$ to $R^{45}$ may independently be hydrogen, deuterium, a substituted or unsubstituted C1 to C30 alkyl group, a substituted or unsubstituted C1 to C30 alkoxy group, a substituted or unsubstituted C6 to C30 aryl group, a substituted or unsubstituted C3 to C30 heteroaryl group, a halogen, a cyano group, or a nitro group.

In some example embodiments, the organic auxiliary layer may include a compound represented by Chemical Formula 2A-1a or 2B-1a, but is not limited thereto.

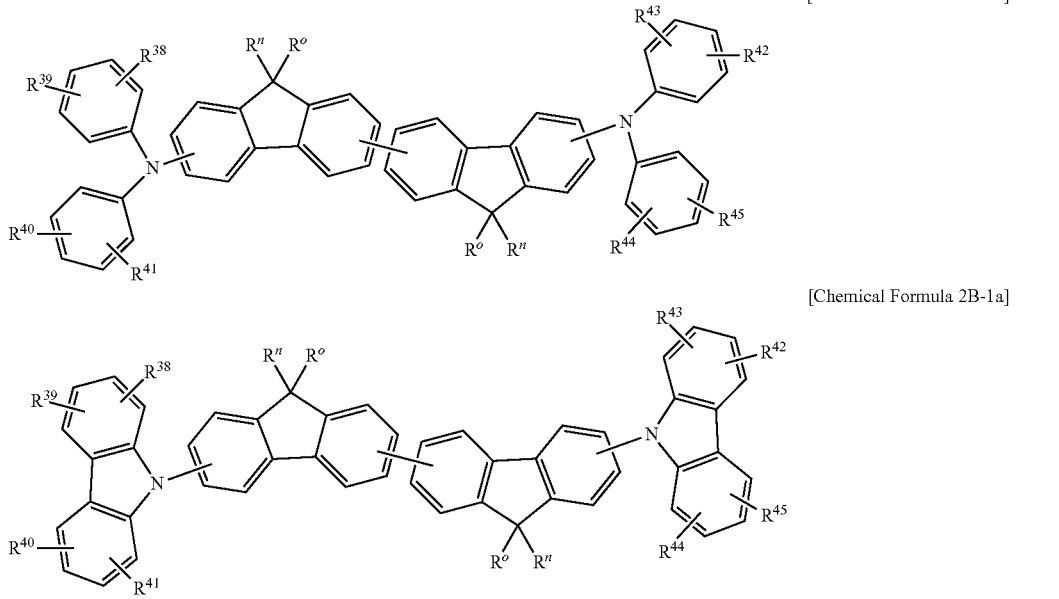

[Chemical Formula 2A-1a]

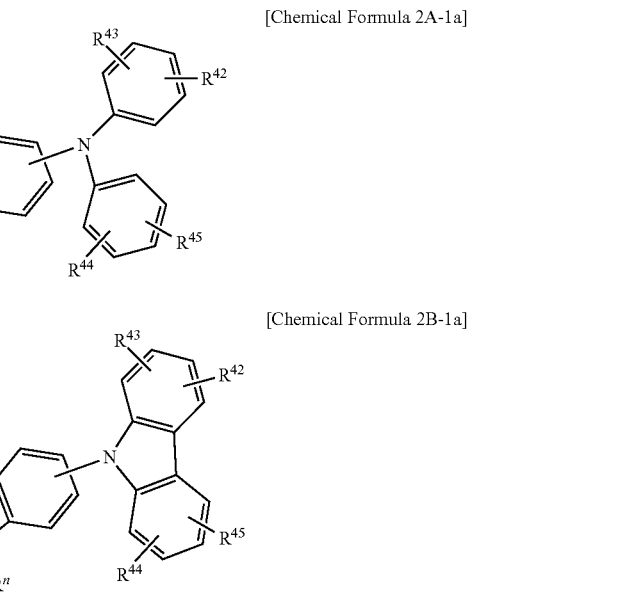

[Chemical Formula 2B-1a]

In some example embodiments, one of the auxiliary layers 40 and 50 may be an inorganic auxiliary layer, and the other of the auxiliary layers 40 and 50 may be an organic auxiliary layer.

In some example embodiments, one of the auxiliary layers 40 and 50 may be omitted.

The aforementioned photoelectric conversion device 100 may be applied to (e.g., included in), in some example embodiments, a sensor, and the sensor may be, in some example embodiments, an image sensor. The image sensor to which the aforementioned photoelectric conversion device 100 is applied may have improved optical electrical characteristics as described above and may be suitable for high speed photographing by reducing an after-image due to remaining charge carriers.

Hereinafter, an example of an image sensor to which the aforementioned device is applied is described with reference to the drawings. An organic CMOS image sensor is described as an example of the image sensor.

Figure 3:
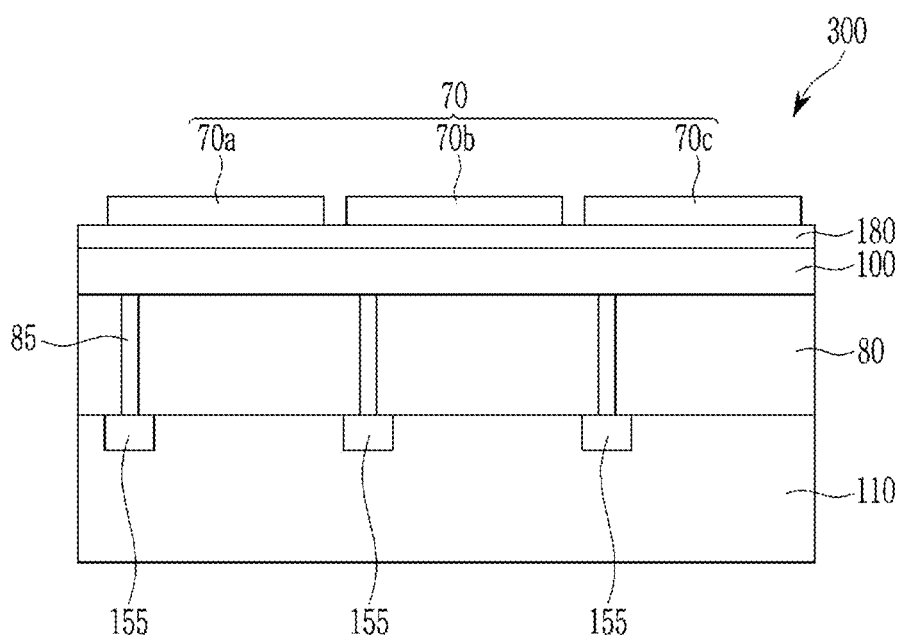
FIG. 3 is a cross-sectional view showing an example of an image sensor according to some example embodiments.

FIG. 3 is a cross-sectional view showing an example of an image sensor according to some example embodiments.

Referring to FIG. 3, an image sensor 300 according to some example embodiments includes a semiconductor substrate 110, an upper insulating layer 80, a photoelectric conversion device 100, and a color filter layer 70. The photoelectric conversion device 100 as shown in any of the drawings may be any of the example embodiments of the photoelectric conversion device, including the photoelectric conversion device 100 shown in FIG. 1A and/or FIG. 2.

The semiconductor substrate 110 may be a silicon substrate, and is integrated with the transmission transistor (not shown) and the charge storage 155. The transmission transistor and/or the charge storage 155 may be integrated in each pixel. The charge storage 155 is electrically connected to the photoelectric conversion device 100.

A metal wire (not shown) and a pad (not shown) are formed on the semiconductor substrate 110. In order to decrease signal delay, the metal wire and pad may be made of a metal having low resistivity, in some example embodiments, aluminum (Al), copper (Cu), silver (Ag), and alloys thereof, but are not limited thereto.

The upper insulation layer 80 is formed on the metal line and pad. The upper insulation layer 80 may be made of an inorganic insulating material such as a silicon oxide and/or a silicon nitride, or a low dielectric constant (low K) material such as SiC, SiCOH, SiCO, and SiOF. The upper insulation layer 80 has a trench 85 exposing the charge storage 155. The trench 85 may be filled with fillers.

The color filter layer 70 is formed on the photoelectric conversion device 100.

The color filter layer 70 is formed on the photoelectric conversion device 100. The color filter layer 70 includes a blue filter 70a formed in a blue pixel, a red filter 70b formed in a red pixel, and a green filter 70c formed in a green pixel. However, it may include a cyan filter, a magenta filter, and/or a yellow filter instead of the above filters or may further include them in addition to the above filters.

An insulation layer 180 is formed between the photoelectric conversion device 100 and the color filter layer 70. The insulation layer 180 may be omitted.

Focusing lens (not shown) may be further formed on the color filter layer 70. The focusing lens may control a direction of incident light and gather the light in one region. The focusing lens may have a shape of, in some example embodiments, a cylinder or a hemisphere, but is not limited thereto.

Figure 4:
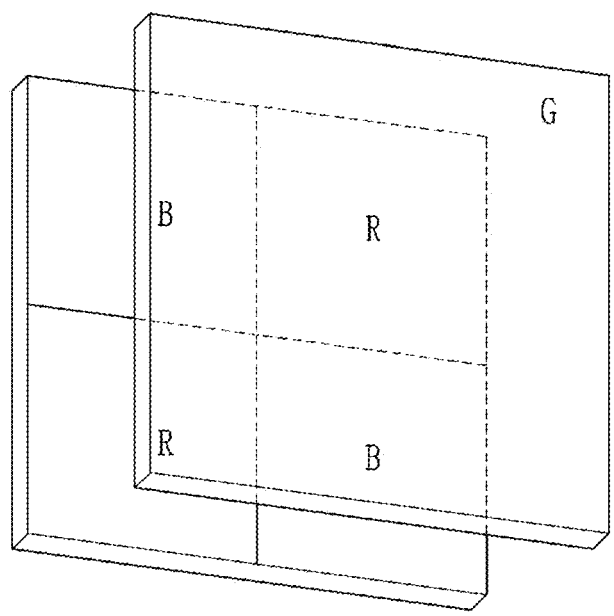
FIG. 4 is a plan view showing an example of an image sensor according to some example embodiments.
Figure 5:
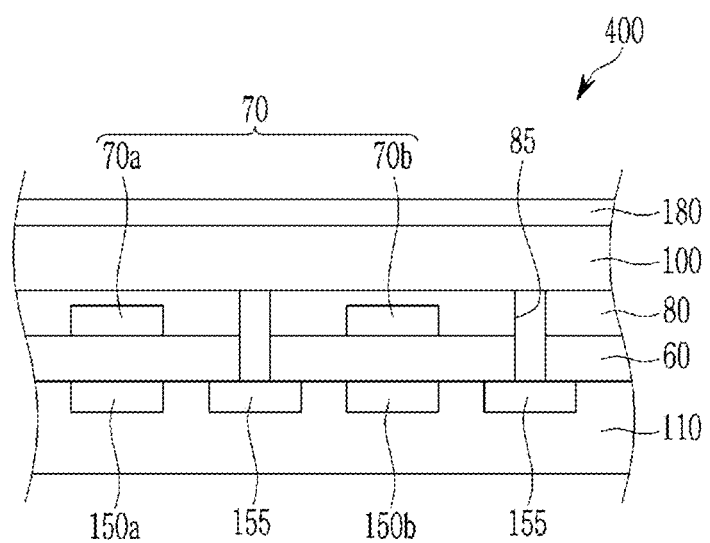
FIG. 5 is a cross-sectional view showing an example of the image sensor of FIG. 4.

FIG. 4 is a plan view showing an example of an image sensor according to some example embodiments, and FIG. 5 is a cross-sectional view showing an example of the image sensor of FIG. 4.

Referring to FIGS. 4 and 5, an image sensor 400 according to some example embodiments includes a semiconductor substrate 110 integrated with photo-sensing devices 150a and 150b, a transmission transistor (not shown), and a charge storage 155, a lower insulation layer 60, a color filter layer 70, an upper insulation layer 80, and the aforementioned photoelectric conversion device 100.

The semiconductor substrate 110 may be a silicon substrate, and is integrated with the photo-sensing devices 150a and 150b, the transmission transistor (not shown), and the charge storage 155. The photo-sensing devices 150a and 150b may be photodiodes.

The photo-sensing devices 150a and 150b, the transmission transistor, and/or the charge storage 155 may be integrated in each pixel, and as shown in the drawing, the photo-sensing devices 150a and 150b may be respectively included in a blue pixel and a red pixel and the charge storage 155 may be included in a green pixel.

The photo-sensing devices 150a and 150b sense light, the information sensed by the photo-sensing devices may be transferred by the transmission transistor, the charge storage 155 is electrically connected to the photoelectric conversion device 100 that are described above, and the information of the charge storage 155 may be transferred by the transmission transistor.

A metal wire (not shown) and a pad (not shown) are formed on the semiconductor substrate 110. In order to decrease signal delay, the metal wire and pad may be made of a metal having low resistivity, in some example embodiments, aluminum (Al), copper (Cu), silver (Ag), and alloys thereof, but are not limited thereto. However, it is not limited to the structure, and the metal wire and pad may be disposed under the photo-sensing devices 150a and 150b.

The lower insulation layer 60 is formed on the metal wire and the pad. The lower insulation layer 60 may be made of an inorganic insulating material such as a silicon oxide and/or a silicon nitride, or a low dielectric constant (low K) material such as SiC, SiCOH, SiCO, and SiOF. The lower insulation layer 60 has a trench 85 exposing the charge storage 155. The trench 85 may be filled with fillers.

A color filter layer 70 is formed on the lower insulation layer 60. The color filter layer 70 includes a blue filter 70a formed in a blue pixel and a red filter 70b in a red pixel. However, the present disclosure is not limited thereto and may include a cyan filter, a magenta filter and/or a yellow filter instead or additionally. In some example embodiments, a green filter is not included, but a green filter may be further included.

The upper insulation layer 80 is formed on the color filter layer 70. The upper insulation layer 80 eliminates a step caused by the color filter layer 70 and smoothens the surface. The upper insulation layer 80 and the lower insulation layer 60 may include a contact hole (not shown) exposing a pad, and a trench 85 exposing a charge storage 155 of a green pixel.

The aforementioned photoelectric conversion device 100 is formed on the upper insulating layer 80. The photoelectric conversion device 100 may have the structure shown in FIG. 1A or 2, and the detailed description thereof is the same as described above. One of the first electrode 10 or the second electrode 20 of the photoelectric conversion device 100 may be a light-receiving electrode, and the other of the first electrode 10 and the second electrode 20 of the photoelectric conversion device 100 may be connected to the charge storage 155.

Focusing lens (not shown) may be further formed on the photoelectric conversion device 100. The focusing lens may control a direction of incident light and gather the light in one region. The focusing lens may have a shape of, in some example embodiments, a cylinder or a hemisphere, but is not limited thereto.

Figure 6:
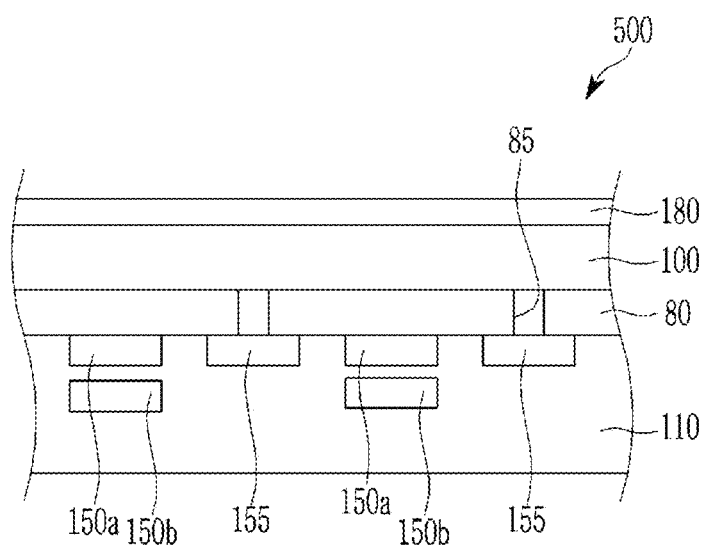
FIG. 6 is a cross-sectional view showing an example of the image sensor of FIG. 4.

FIG. 6 is a cross-sectional view showing another example of the image sensor of FIG. 4.

Referring to FIG. 6, an image sensor 500 according to some example embodiments includes a semiconductor substrate 110 integrated with photo-sensing devices 150a and 150b, a transmission transistor (not shown), and a charge storage 155, a lower insulation layer 60, an upper insulation layer 80, and a photoelectric conversion device 100.

However, in the image sensor 500 according to some example embodiments, unlike some example embodiments, the photo-sensing devices 150a and 150b are stacked in the vertical direction and the color filter layer 70 is omitted. The photo-sensing devices 150a and 150b are electrically connected to a charge storage (not shown) and may be transferred by a transfer transistor. The photo-sensing devices 150a and 150b may be selectively configured to absorb light in each wavelength spectrum according to the stacking depth.

The photoelectric conversion device 100 may have the structure shown in FIG. 1A or 2, and the detailed description thereof is the same as described above. One of the first electrode 10 or the second electrode 20 of the photoelectric conversion device 100 may be a light-receiving electrode, and the other of the first electrode 10 or the second electrode 20 of the photoelectric conversion device 100 may be connected to the charge storage 155.

Figure 7:
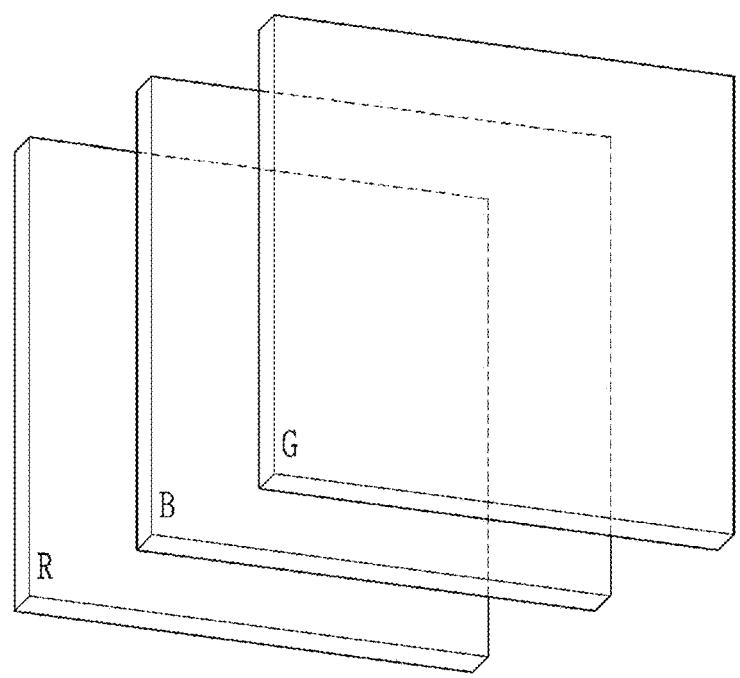
FIG. 7 is a plan view showing an example of an image sensor according to some example embodiments.
Figure 8:
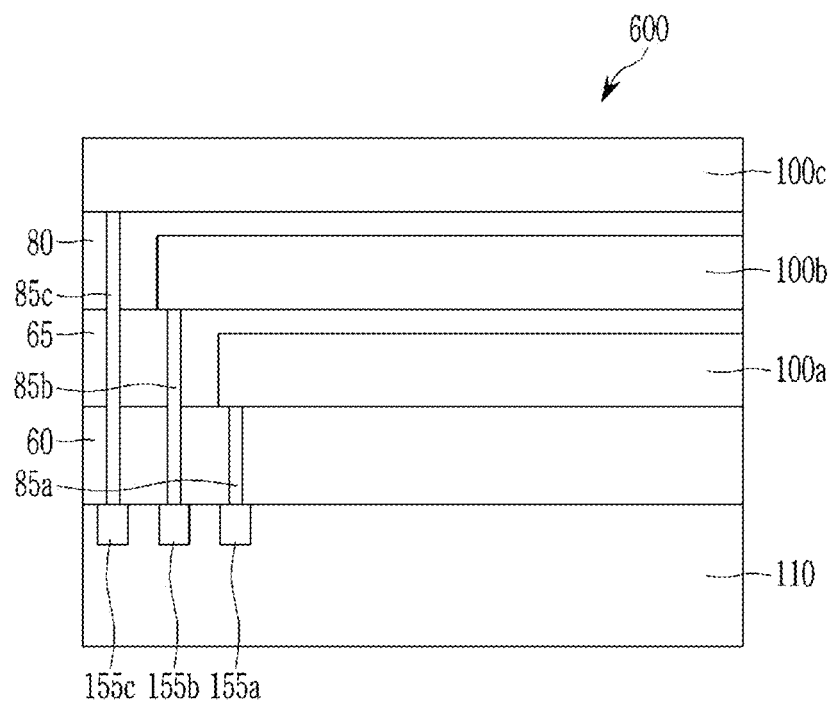
FIG. 8 is a cross-sectional view showing an example of the image sensor of FIG. 7.

FIG. 7 is a plan view showing another example of an image sensor according to some example embodiments, and FIG. 8 is a cross-sectional view showing an example of the image sensor of FIG. 7.

An image sensor 600 according to some example embodiments has a structure in which a green device configured to selectively absorb light in a green wavelength spectrum, a blue device configured to selectively absorb light in a blue wavelength spectrum, and a red device configured to selectively absorb light in a red wavelength spectrum are stacked.

The image sensor 600 according to some example embodiments includes a semiconductor substrate 110, a lower insulation layer 60, an intermediate insulation layer 65, an upper insulation layer 80, a first photoelectric conversion device 100a, a second photoelectric conversion device 100b, and a third photoelectric conversion device 100c.

The semiconductor substrate 110 may be a silicon substrate, and is integrated with the transmission transistor (not shown) and the charge storages 155a, 155b, and 155c.

A metal wire (not shown) and a pad (not shown) are formed on the semiconductor substrate 110, and the lower insulation layer 60 is formed on the metal wire and the pad.

The first photoelectric conversion device 100a, the second photoelectric conversion device 100b, and the third photoelectric conversion device 100c are sequentially formed on the lower insulation layer 60.

The first, second, and third photoelectric conversion devices 100a, 100b, and 100c may each independently have the structure shown in FIG. 1A or 2, and the detailed descriptions thereof are the same as described above. One of the first electrode 10 or the second electrode 20 of the first, second and third photoelectric conversion devices 100a, 100b, and 100c may be a light-receiving electrode, and the other of the first electrode 10 and the second electrode 20 of the first, second and third photoelectric conversion devices 100a, 100b, and 100c may be connected to the charge storages 155a, 155b, and 155c.

The first photoelectric conversion device 100a may be selectively configured to absorb light in one of red, blue, or green wavelength spectra and may photoelectrically convert it. In some example embodiments, the first photoelectric conversion device 100a may be a red photoelectric conversion device. The intermediate insulation layer 65 is formed on the first photoelectric conversion device 100a.

A second photoelectric conversion device 100b is formed on the intermediate insulation layer 65.

The second photoelectric conversion device 100b may be selectively configured to absorb light in one of red, blue, or green wavelength spectra and may photoelectrically convert it. In some example embodiments, the second photoelectric conversion device 100b may be a blue photoelectric conversion device.

The upper insulation layer 80 is formed on the second photoelectric conversion device 100b. The lower insulation layer 60, the intermediate insulation layer 65, and the upper insulation layer 80 have a plurality of trenches 85a, 85b, and 85c exposing charge storages 155a, 155b, and 155c.

The third photoelectric conversion device 100c is formed on the upper insulation layer 80. The third photoelectric conversion device 100c may be selectively configured to absorb light in one of red, blue, or green wavelength spectra and may photoelectrically convert it. In some example embodiments, the third photoelectric conversion device 100c may be a green photoelectric conversion device.

Focusing lens (not shown) may be further formed on the third photoelectric conversion device 100c. The focusing lens may control a direction of incident light and gather the light in one region. The focusing lens may have a shape of, in some example embodiments, a cylinder or a hemisphere, but is not limited thereto.

In the drawing, the first photoelectric conversion device 100a, the second photoelectric conversion device 100b, and the third photoelectric conversion device 100c are sequentially stacked, but the present disclosure is not limited thereto, and they may be stacked in various orders.

As described above, the first photoelectric conversion device 100a, the second photoelectric conversion device 100b, and the third photoelectric conversion device 100c are stacked, and thus the size of an image sensor may be reduced to realize a down-sized image sensor.

Figure 9:
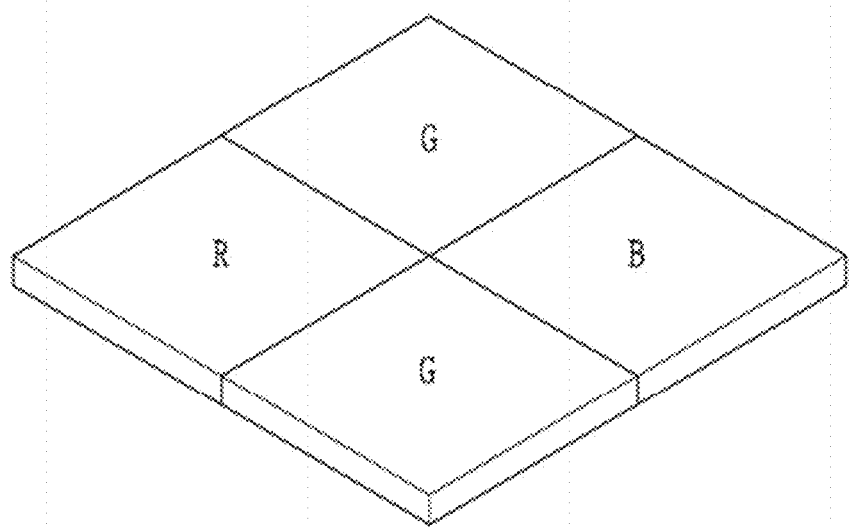
FIG. 9 is a plan view showing another example of an image sensor according to some example embodiments.
Figure 10:
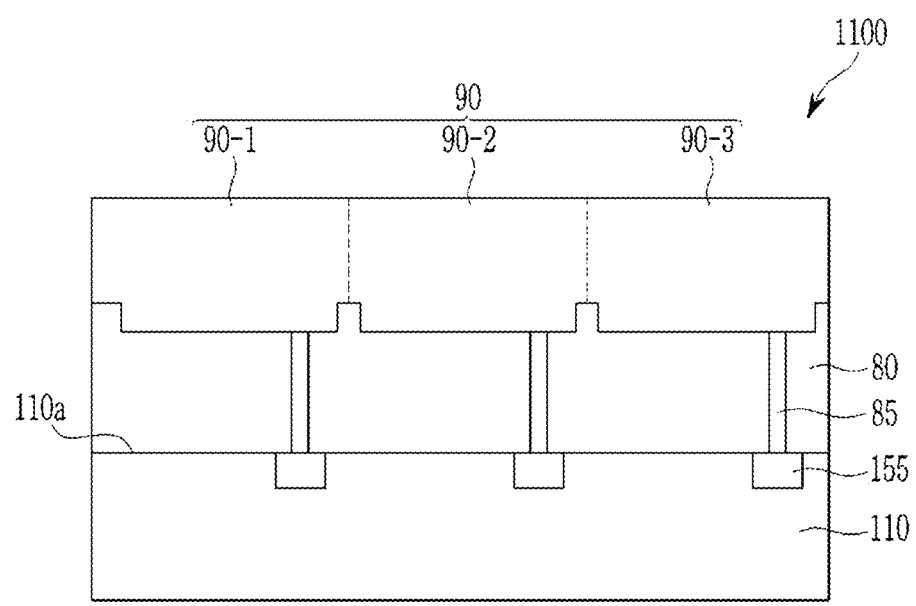
FIG. 10 is a cross-sectional view showing an example of the image sensor of FIG. 9.

FIG. 9 is a plan view showing another example of an image sensor according to some example embodiments, and FIG. 10 is a cross-sectional view showing an example of the image sensor of FIG. 9.

Referring to FIGS. 9 and 10, an image sensor 1100 includes a photoelectric conversion device 90 disposed on a semiconductor substrate 110, and the photoelectric conversion device 90 includes a plurality of photoelectric conversion devices 90-1, 90-2, and 90-3. The plurality of the photoelectric conversion devices 90-1, 90-2, and 90-3 may convert light (e.g., blue light, green light, or red light) in different wavelength spectra into an electrical signal. Referring to FIG. 10, a plurality of the photoelectric conversion devices 90-1, 90-2, and 90-3 may be arranged on the semiconductor substrate 110 in a horizontal direction such that the photoelectric conversion devices 90-1, 90-2, and 90-3 may be partially or entirely overlapped with each other in a direction extending in parallel with the surface 110a of the semiconductor substrate 110. Each photoelectric conversion device 90-1, 90-2, and 90-3 is connected to a charge storage 155 integrated in the semiconductor substrate 110 through a trench 85.

Each photoelectric conversion device 90-1, 90-2, and 90-3 may be one of the aforementioned photoelectric conversion device 100. In some example embodiments, two or more photoelectric conversion devices 90-1, 90-2, and 90-3 may include different portions of a common, continuous layer that extends continuously between the photoelectric conversion devices 90-1, 90-2, and 90-3. In some example embodiments, the plurality of photoelectric conversion devices 90-1, 90-2, and 90-3 may share a common first electrode 10 and/or a common second electrode 20. In some example embodiments, two or more of the photoelectric conversion devices 90-2, 90-2, and 90-3 may have different photoelectric conversion layer 30 configured to absorb different wavelength spectra of incident light. Other configurations of the image sensor 1100 may be the same as one or more of the image sensors described with reference to FIGS. 3 to 8.

Figure 11:
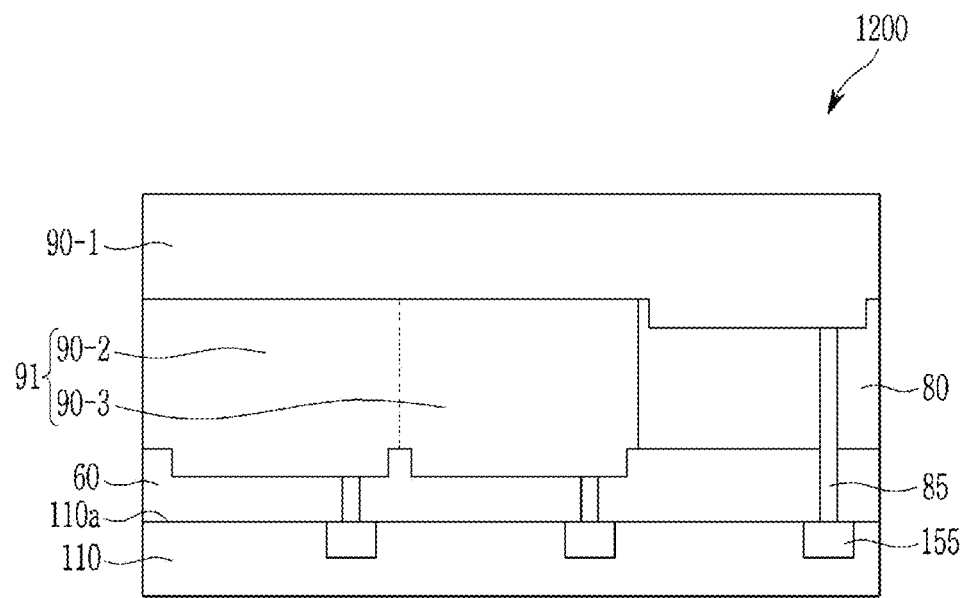
FIG. 11 is a cross-sectional view showing an example of an image sensor according to some example embodiments.

FIG. 11 is a cross-sectional view showing an example of an image sensor according to some example embodiments.

Referring to FIG. 11, an organic CMOS image sensor 1200 includes a semiconductor substrate 110 and photoelectric conversion devices 90-1 and 91 which are stacked on the semiconductor substrate 110. The photoelectric conversion device 91 includes a plurality of photoelectric conversion devices 90-2 and 90-3 and the plurality of photoelectric conversion devices 90-2 and 90-3 may be arranged to be overlapped with each other in a direction extending in parallel with the surface 110a of the semiconductor substrate 110. The plurality of the photoelectric conversion devices 90-1, 90-2, and 90-3 may convert light (e.g., blue light, green light, or red light) in different wavelength spectra into an electrical signal.

As an example, the photoelectric conversion device 90-1 may include horizontally-arranged, plurality of photoelectric conversion devices configured to absorb light in different wavelength spectra. As an example, the photoelectric conversion device 91 may photoelectrically convert light of one wavelength spectrum selected from blue light, green light, and red light. As an example, the photoelectric conversion device 91 may be partially or entirely overlapped with the photoelectric conversion device 90-1. Other configurations of the organic CMOS image sensor 1200 may be the same as one or more of the image sensors described with reference to FIGS. 3 to 8.

Figure 12:
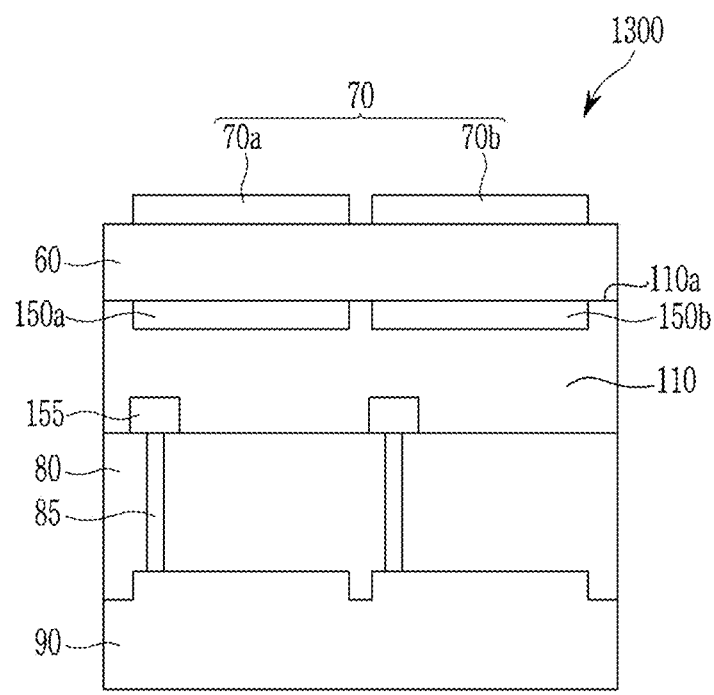
FIG. 12 is a cross-sectional view showing another example of an image sensor according to some example embodiments.

FIG. 12 is a cross-sectional view showing another example of an image sensor according to some example embodiments.

Referring to FIG. 12, an image sensor 1300 includes a semiconductor substrate 110 integrated with photo-sensing devices 150a and 150b, a transmission transistor (not shown), and a charge storage 155; an upper insulation layer 80 and a color filter layer 70 which are disposed on the semiconductor substrate 110; a lower insulation layer 60 and a photoelectric conversion device 90 which are disposed under the semiconductor substrate 110. The photoelectric conversion device 90 may be the aforementioned photoelectric conversion device 100. As shown in FIG. 12, the photoelectric conversion device 90 is disposed under the semiconductor substrate 110 and thereby the photoelectric conversion device 90 and the color filter layer 70 are separated with respect to the photo-sensing devices 150a and 150b. Other configurations of the image sensor 1300 may be the same as one or more of the image sensors described with reference to FIGS. 3 to 8.

The aforementioned photoelectric conversion device and sensor may be applied to various electronic devices, for example a mobile phone, a camera, a biometric device, and/or automotive electronic parts, but is not limited thereto.

Figure 13:
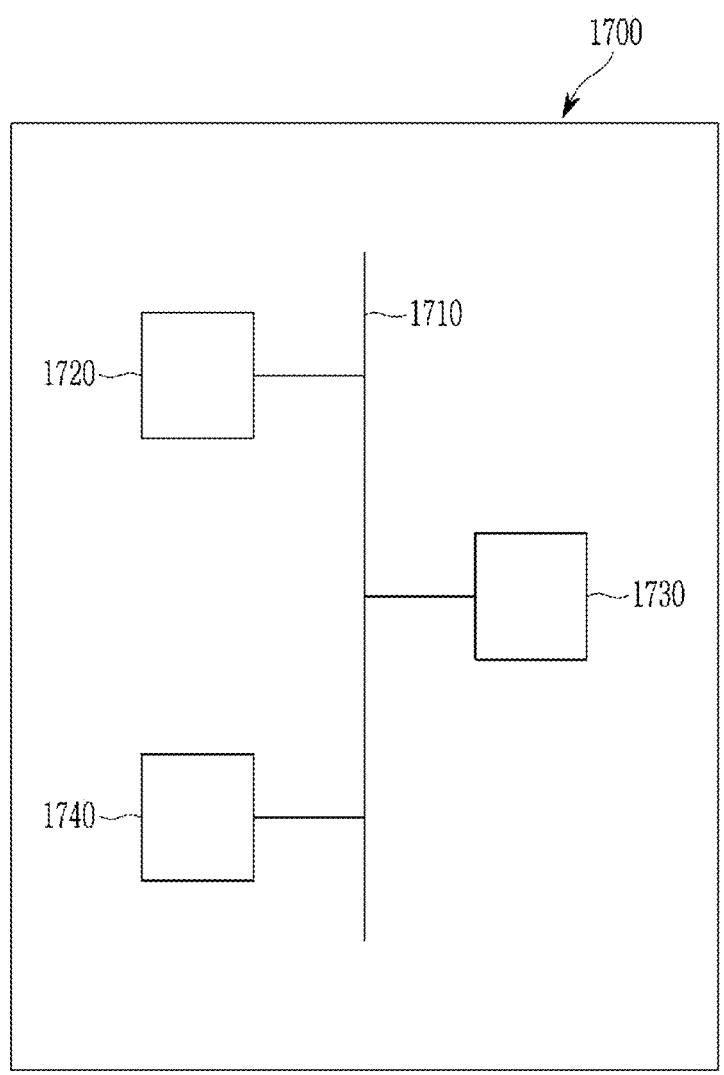
FIG. 13 is a schematic diagram showing an electronic device according to some example embodiments.

FIG. 13 is a schematic diagram showing an electronic device according to some example embodiments.

Referring to FIG. 13, an electronic device 1700 may include a processor 1720, a memory 1730, and a sensor 1740 that are electrically coupled together via a bus 1710. The sensor 1740 may be a sensor (e.g., an image sensor) according to any of the example embodiments. The memory 1730, which may be a non-transitory computer readable medium, may store a program of instructions. The processor 1720 may execute the stored program of instructions to perform one or more functions. In some example embodiments, the processor 1720 may be configured to process electrical signals generated by the sensor 1740. The processor 1720 may be configured to generate an output (e.g., an image to be displayed on a display interface) based on such as processing.

Hereinafter, some example embodiments are illustrated in more detail with reference to examples. However, the present scope is not limited to these examples.

SYNTHESIS EXAMPLES

Synthesis Example 1

[Compound 1]

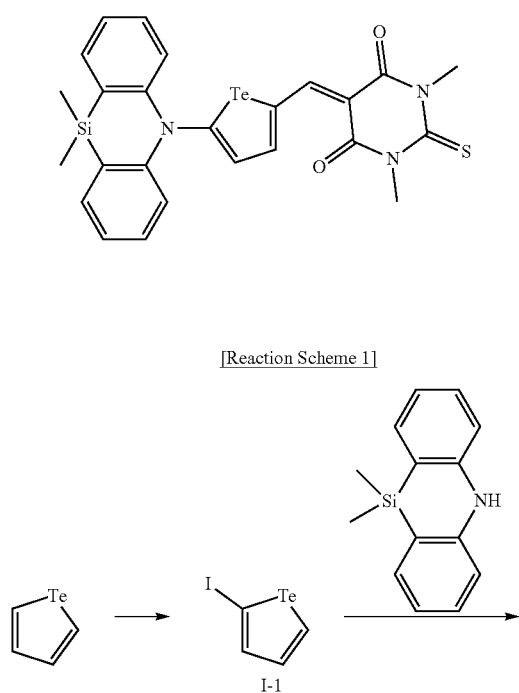

[Reaction Scheme 1]

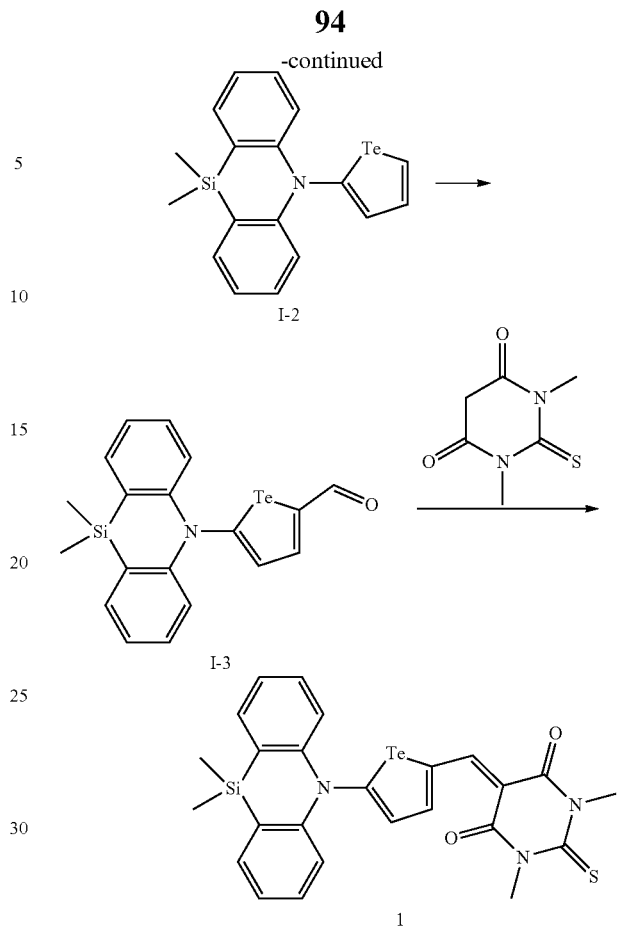

(i) Synthesis of Compound I-1

2-iodotellurophene (Compound I-1) is synthesized referring to the method disclosed in *Efficient Synthesis of 2-Iodo and 2-Dicyanomethyl Derivatives of Thiophene, Selenophene, Tellurophene and Thieno[3,2-b]thiophene*, K. Takahashi, S. Tarutani, *Heterocycles* 1996, 43, 1927-1935.

(ii) Synthesis of Compound I-2

15.0 g (49.1 mmol) of 2-iodotellurophene (Compound I-1) and 10.0 g (44.6 mmol) of 10,10-dimethyl-5,10-dihydrodibenzo[b,e][1,4]azasiline are heated and refluxed in 200 ml of anhydrous toluene under the presence of 5 mol % of bis(dibenzylideneacetone)palladium (0) (Pd(dba)$_2$), 5 mol % of tri-t-butylphosphine (P(tBu)$_3$), and 12.9 g (133.9 mmol) of sodium t-butoxide (NaOtBu) for 2 hours. A product therefrom is separated and purified through silica gel column chromatography (toluene:hexane=a volume ratio of 1:4) to obtain 6.8 g (a yield of 37.8%) of 10,10-dimethyl-5-(tellurophen-2-yl)-5,10-dihydrodibenzo[b,e][1,4]azasiline (Compound I-2).

(iii) Synthesis of Compound I-3

6.2 ml of phosphoryl chloride is added in a dropwise fashion to 30.0 ml of N,N-dimethylformamide at −15° C. and then, stirred at room temperature of 24° C. for 2 hours. The resultant is slowly added in a dropwise fashion to a mixture of 300 ml of dichloromethane and 6.8 g of Compound I-2 at −15° C. and then, stirred at room temperature for 30 minutes and concentrated under a reduced pressure. 300 ml of water is added thereto, and an aqueous sodium hydroxide solution is added thereto until pH becomes 14 and then, stirred at room temperature (24° C.) for 2 hours. An organic layer extracted with dichloromethane is washed with an aqueous sodium chloride solution and then, dried with anhydrous magnesium sulfate. A product therefrom is separated and purified through silica gel column chromatography (hexane:ethylacetate=a volume ratio of 4:1) to obtain 2.82 g (a yield of 38.8%) of 5-(10,10-dimethyldibenzo[b,e][1,4]azasilin-5(10H)-yl)tellurophene-2-carbaldehyde (Compound I-3).

(iv) Synthesis of Compound 1

2.82 g (6.54 mmol) of Compound I-3 is suspended in ethanol, and 1.35 g (7.85 mmol) of 1,3-dimethyl-2-thiobarbituric acid is added thereto and then, reacted therewith at 50° C. for 2 hours to obtain 2.98 g (a yield of 77.8%) of Compound 1 (5-((5-(10,10-dimethyldibenzo[b,e][1,4]azasilin-5(10H)-yl)tellurophen-2-yl)methylene)-1,3-dimethyl-2-thioxodihydropyrimidine-4,6(1H,5H)-dione). The obtained compound is sublimated and purified up to purity of 99.9%.

$^1$H-NMR (500 MHz, Methylene Chloride-d$_2$): δ 8.46 (s, 1H), 8.26 (d, 1H), 7.80 (d, 2H), 7.71 (d, 2H), 7.54 (t, 2H), 7.42 (t, 2H), 6.93 (d, 1H), 3.68 (d, 6H), 0.45 (s, 6H).

Synthesis Example 2

[Compound 2]

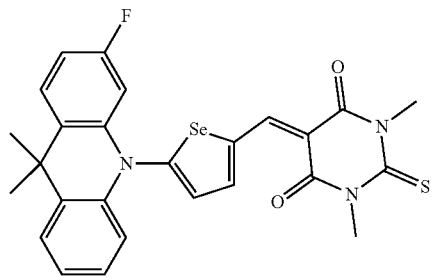

[Reaction Scheme 2]

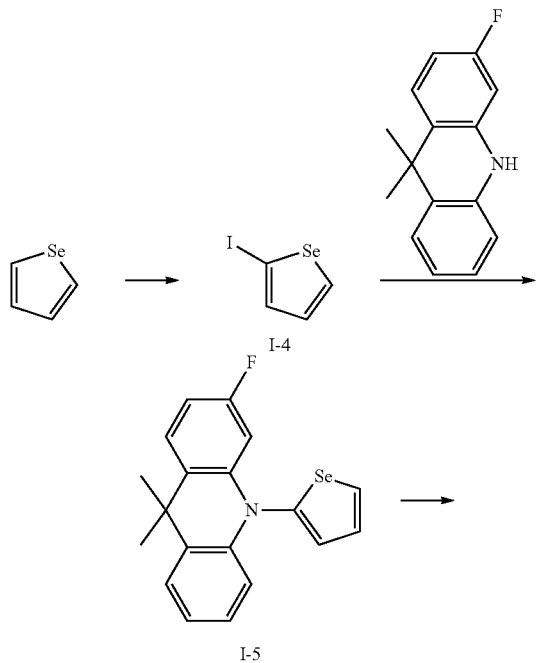

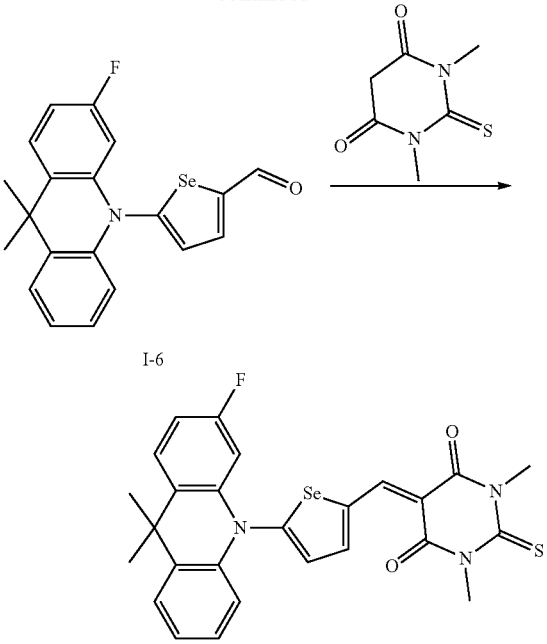

(i) Synthesis of Compound I-4

2-iodoselenophene (Compound I-4) is synthesized referring to a method disclosed in *Efficient Synthesis of 2-Iodo and 2-Dicyanomethyl Derivatives of Thiophene, Selenophene, Tellurophene and Thieno[3,2-b]thiophene*, K. Takahashi, S. Tarutani, *Heterocycles* 1996, 43, 1927-1935.

(ii) Synthesis of Compound I-5

10.0 g (38.9 mmol) of 2-iodoselenophene (Compound I-4) and 8.04 g (35.4 mmol) of 3-fluoro-9,9-dimethyl-9,10-dihydroacridine are heated and refluxed in 200 ml of anhydrous toluene under the presence of 5 mol % of Pd(dba)$_2$, 5 mol % of P(tBu)$_3$, and 10.2 g (106.2 mmol) of NaOtBu for 2 hours. 3-Fluoro-9,9-dimethyl-9,10-dihydroacridine is synthesized referring to a method described in *Preparation and Some Reactions of Phenoxazine and Phenoselenazine*, Paulette Muller, N. P. Buu-Hoï and R. RIPS, *J. Org. Chem.*, 1959, 24, 37-39. A product therefrom is separated and purified through silica gel column chromatography (toluene:hexane=a volume ratio of 1:4) to obtain 6.8 g (a yield of 53.9%) of 2-fluoro-9,9-dimethyl-10-(selenophen-2-yl)-9,10-dihydroacridine (Compound I-5).

(iii) Synthesis of Compound I-6

5.2 ml of phosphoryl chloride is added in a dropwise fashion to 10.0 ml of N,N-dimethylformamide at −15° C. and then, stirred at room temperature (24° C.) for 2 hours. The resultant is slowly added in a dropwise fashion to a mixture of 150 ml of dichloromethane and 5.0 g of Compound I-5 at −15° C. and then, stirred at room temperature for 30 minutes and concentrated under a reduced pressure. Subsequently, 300 ml of water is added thereto, and then, an aqueous sodium hydroxide solution is added thereto until pH becomes 14 and then, stirred at room temperature (24° C.) for 2 hours. An organic layer extracted with dichloromethane is washed with an aqueous sodium chloride solution and then, dried with anhydrous magnesium sulfate. A product therefrom is separated and purified through silica gel column chromatography (hexane:ethylacetate=a volume ratio of 4:1) to obtain 2.24 g (a yield of 39.9%) of 5-(2-fluoro-9,9-dimethylacridin-10(9H)-yl)selenophene-2-carbaldehyde (Compound I-6).

(iv) Synthesis of Compound 2

1.30 g (3.37 mmol) of Compound I-6 is suspended in ethanol, and 0.64 g (3.71 mmol) of 1,3-dimethyl-2-thiobarbituric acid is added thereto and then, reacted therewith at 50° C. for 2 hours to obtain 1.12 g (a yield of 83.8%) of Compound 2 (5-((5-(3-fluoro-9,9-dimethylacridin-10(9H)-yl)selenophen-2-yl)methylene)-1,3-dimethyl-2-thioxodihydropyrimidine-4,6(1H,5H)-dione). The obtained compound is sublimated and purified up to purity of 99.9%.

$^1$H-NMR (500 MHz, Methylene Chloride-$d_2$): δ 8.52 (s, 1H), 7.99 (d, 1H), 7.84 (d, 1H), 7.55 (m, 3H), 7.47 (t, 1H), 7.45 (t, 1H), 7.14 (d, 1H), 7.11 (t, 1H), 5.65 (d, 6H), 1.55 (s, 6H).

Synthesis Example 3

[Compound 3]

[Reaction Scheme 3]

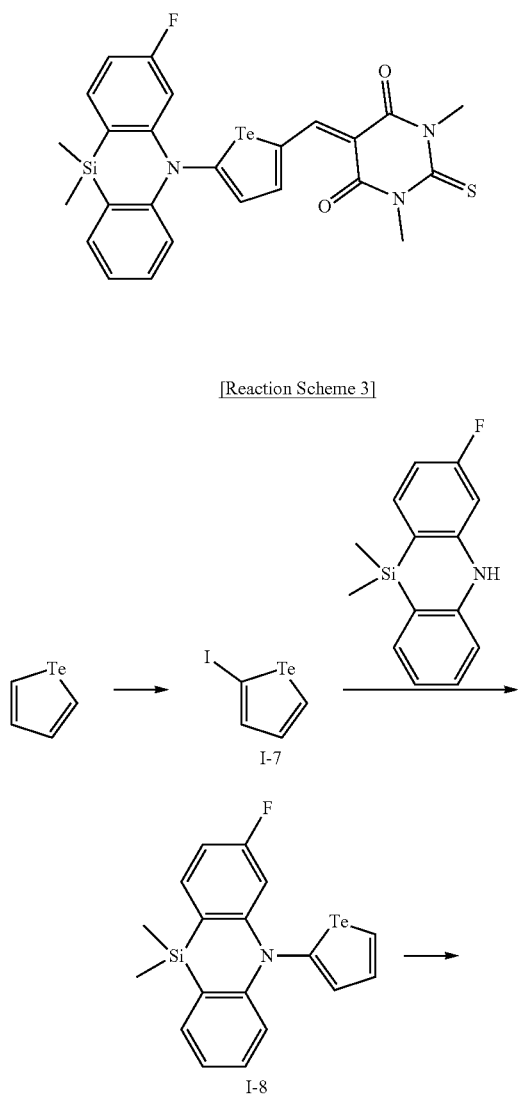

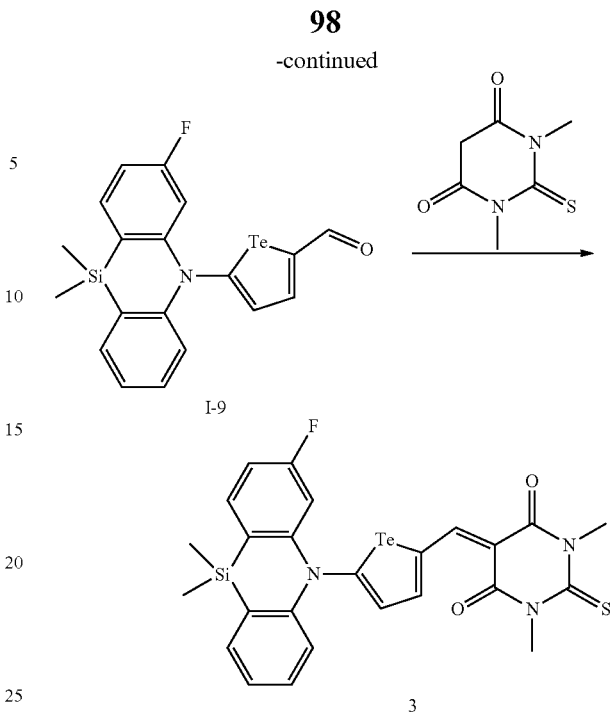

(i) Synthesis of Compound I-7

2-iodotellurophene (Compound I-7) is synthesized referring to the method disclosed in *Efficient Synthesis of 2-Iodo and 2-Dicyanomethyl Derivatives of Thiophene, Selenophene, Tellurophene and Thieno[3,2-b]thiophene*, Takahashi, K.; Tarutani, S. *Heterocycles* 1996, 43, 1927-1935.

(ii) Synthesis of Compound I-8

10.0 g (38.9 mmol) of 2-iodotellurophene (Compound I-7) and 8.62 g (35.38 mmol) of 3-fluoro-10,10-dimethyl-5,10-dihydrodibenzo[b,e][1,4]azasiline are heated and refluxed in 200 ml of anhydrous toluene under the presence of 5 mol % of Pd(dba)$_2$, 5 mol % of P(tBu)$_3$, and 10.2 g (106.2 mmol) of NaOtBu for 2 hours. 3-fluoro-10,10-dimethyl-5,10-dihydrodibenzo[b,e][1,4]azasiline is synthesized referring to a method disclosed in Y. Kitamoto, T. Namikawa, T. Suzuki, Y. Miyata, H. Kita, T. Sato, S. Oi. *Tetrahedron Letters*, 2016, 57, 4914-4917. A product obtained therefrom is separated and purified through silica gel column chromatography (toluene:hexane=a volume ratio of 1:4) to obtain 6.5 g (a yield of 49.5%) of 3-fluoro-10,10-dimethyl-5-(tellurophen-2-yl)-5,10-dihydrodibenzo[b,e][1,4]azasiline (Compound I-8).

(iii) Synthesis of Compound I-9

4.9 ml of phosphoryl chloride is added in a dropwise fashion to 8.4 ml of N,N-dimethylformamide at −15° C. and then, stirred at room temperature (24° C.) for 2 hours. The resultant is slowly added in a dropwise fashion to a mixture of 160 ml of dichloromethane and 5.0 g of Compound I-8 at −15° C. and then, stirred at room temperature for 30 minutes and concentrated under a reduced pressure. Subsequently, 300 ml of water is added thereto, and an aqueous sodium hydroxide solution is added thereto until pH becomes 14 and then, stirred at room temperature (24° C.) for 2 hours. An organic layer extracted with dichloromethane is washed with an aqueous sodium chloride solution and then, dried with anhydrous magnesium sulfate. A product obtained therefrom is separated and purified through silica gel column chromatography (hexane:ethylacetate=a volume ratio of 4:1) to obtain 2.30 g (a yield of 42.8%) of 5-(3-fluoro-10,10- dimethyldibenzo[b,e][1,4]azasilin-5(10H)-yl)tellurophene-2-carbaldehyde (Compound I-9).

(iv) Synthesis of Compound 3

1.2 g (2.28 mmol) of Compound I-9 is suspended in ethanol, and 0.33 g (2.51 mmol) of 1,3-dimethyl-2-thiobarbituric acid is added thereto and reacted therewith at 50° C. for 2 hours to obtain 0.92 g (a yield of 72.8%) of Compound 3 (5-((5-(3-fluoro-10,10-dimethyldibenzo[b,e][1,4]azasilin-5(10H)-yl)tellurophen-2-yl)methylene)-1,3-dimethyl-2-thioxodihydropyrimidine-4,6(1H,5H)-dione). The obtained compound is sublimated and purified up to purity of 99.9%.

¹H-NMR (500 MHz, Methylene Chloride-d₂): δ 8.46 (s, 1H), 8.26 (d, 1H), 7.78 (d, 2H), 7.70 (d, 2H), 7.56 (t, 1H), 7.42 (t, 2H), 6.93 (d, 1H), 3.68 (d, 6H), 0.45 (s, 6H).

Synthesis Example 4

[Compound 4]

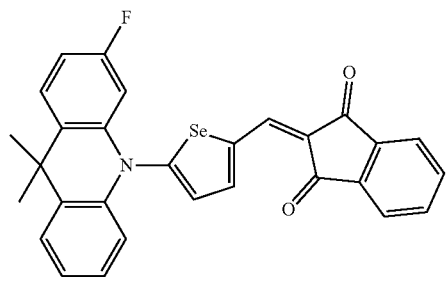

[Reaction Scheme 4]

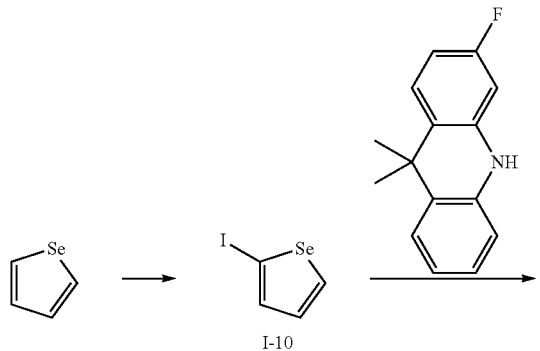

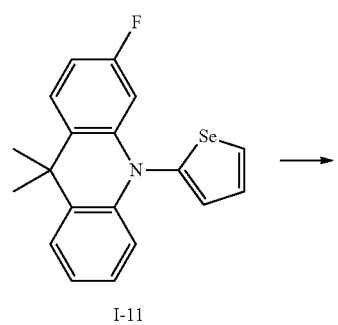

I-11

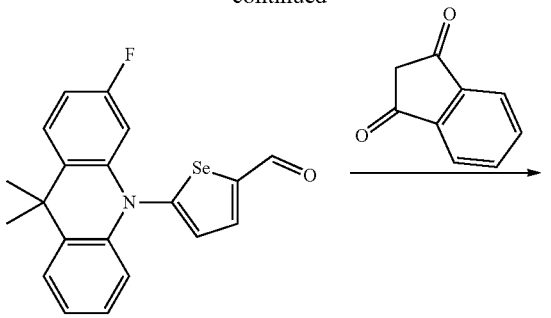

I-12

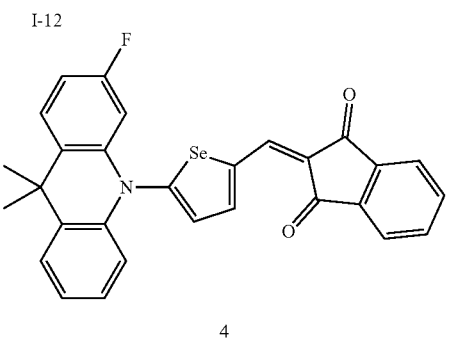

4

(i) Synthesis of Compound I-10

2-iodoselenophene (Compound I-10) is synthesized referring to a method disclosed in *Efficient Synthesis of 2-Iodo and 2-Dicyanomethyl Derivatives of Thiophene, Selenophene, Tellurophene and Thieno[3,2-b]thiophene*, K. Takahashi, S. Tarutani, *Heterocycles* 1996, 43, 1927-1935.

(ii) Synthesis of Compound I-11

10.0 g (38.9 mmol) of 2-iodoselenophene (Compound I-10) and 8.04 g (35.4 mmol) of 3-fluoro-9,9-dimethyl-9,10-dihydroacridine are heated and refluxed in 200 ml of anhydrous toluene under the presence of 5 mol % of Pd(dba)₂, 5 mol % of P(t-Bu)₃, and 10.2 g (106.2 mmol) of NaOtBu for 2 hours. 3-Fluoro-9,9-dimethyl-9,10-dihydroacridine is synthesized referring to a method described in *Preparation and Some Reactions of Phenoxazine and Phenoselenazine*, Paulette Muller, N. P. Buu-Hoï and R. RIPS, *J. Org. Chem.*, 1959, 24, 37-39. A product therefrom is separated and purified through silica gel column chromatography (toluene:hexane=a volume ratio of 1:4) to obtain 6.8 g (a yield of 53.9%) of 2-fluoro-9,9-dimethyl-10-(selenophen-2-yl)-9,10-dihydroacridine (Compound I-11).

(iii) Synthesis of Compound I-12

5.2 ml of phosphoryl chloride is added in a dropwise fashion to 10.0 ml of N,N-dimethylformamide at −15° C. and then, stirred at room temperature (24° C.) for 2 hours. The resultant is slowly added in a dropwise fashion to a mixture of 150 ml of dichloromethane and 5.0 g of Compound I-11 at −15° C. and then, stirred at room temperature for 30 minutes and concentrated under a reduced pressure. Subsequently, 300 ml of water is added thereto, and then, an aqueous sodium hydroxide solution is added thereto until pH becomes 14 and then, stirred at room temperature (24° C.) for 2 hours. An organic layer extracted with dichloromethane is washed with an aqueous sodium chloride solution and then, dried with anhydrous magnesium sulfate. A product therefrom is separated and purified through silica gel column chromatography (hexane:ethylacetate=a volume ratio of 4:1) to obtain 2.24 g (a yield of 39.9%) of 5-(2-fluoro-9,9-dimethylacridin-10(9H)-yl)selenophene-2-carbaldehyde (Compound I-12).

(iv) Synthesis of Compound 4

0.94 g (2.44 mmol) of Compound I-12 is suspended in ethanol, and 0.37 g (2.56 mmol) of 1,3-indandione is added thereto and then, reacted therewith at 50° C. for 2 hours to obtain 1.02 g (a yield of 81.6%) of Compound 4 (2-((5-(3-fluoro-9,9-dimethylacridin-10(9H)-yl)selenophen-2-yl)methylene)-1H-indene-1,3(2H)-dione). The obtained compound is sublimated and purified up to purity of 99.9%.

$^1$H-NMR (500 MHz, Methylene Chloride-$d_2$): δ 8.48 (s, 1H), 7.74 (t, 4H), 7.42-7.34 (m, 4H), 7.24-7.19 (m, 4H), 6.82 (d, 1H), 0.48 (s, 6H).

Evaluation I

Energy levels of the compounds of synthesis examples are evaluated.

The energy levels are evaluated through a simulation by using a Gaussian software (Gaussian. Inc.).

TABLE 1

|  |  | HOMO (eV) | LUMO (eV) |
|---|---|---|---|
| First material | Compound 1 | 5.57 | 2.64 |
| Second material | C60 | 6.40 | 3.65 |
| Third material | Compound 2 | 5.75 | 2.77 |
|  | Compound 3 | 5.66 | 2.71 |
|  | Compound 4 | 5.55 | 2.58 |

Manufacture of Photoelectric Conversion Device

Example 1

A 150 nm-thick anode is formed by sputtering ITO on a glass substrate. Subsequently, a compound represented by Chemical Formula 2B-1aa is deposited on the anode to form a 5 nm-thick electron blocking layer. On the electron blocking layer, Compound 1 (first material 30$p$) ($\lambda_{max}$: 545 nm) obtained in Synthesis Example 1, fullerene (C$_{60}$, second material 30$n$), and Compound 2 (third material 30$v$) ($\lambda_{max}$: 530 nm) obtained in Synthesis Example 2 are co-deposited to form a 95 nm-thick photoelectric conversion layer. Herein, the first material 30$p$ and the second material 30$n$ are co-deposited in a volume ratio (a thickness ratio) of 1:1, and the third material 30$v$ is co-deposited in an amount of 3 volume % based on the total volume of the first material 30$p$ and the third material 30$v$. Then, on the photoelectric conversion layer, Yb is thermally deposited to form a 1.5 nm-thick electron auxiliary layer. Then, on the electron auxiliary layer, ITO is sputtered to form a 7 nm-thick cathode. Subsequently, on the cathode, aluminum oxide (Al$_2$O$_3$) is deposited to form a 50 nm-thick anti-reflection layer and then, sealed with a glass plate and thus manufacture a photoelectric conversion device.

Example 2

A photoelectric conversion device is manufactured according to the same method as Example 1, except that a 105 nm-thick photoelectric conversion layer is formed by co-depositing 5 volume % of the third material 30$v$ based on the total volume of the first material 30$p$ and the third material 30$v$.

Example 3

A photoelectric conversion device is manufactured according to the same method as Example 1, except that a 94 nm-thick photoelectric conversion layer is formed by co-depositing 10 volume % of the third material 30$v$ based on the total volume of the first material 30$p$ and the third material 30$v$.

Example 4

A photoelectric conversion device is manufactured according to the same method as Example 1, except that a 99 nm-thick photoelectric conversion layer is formed by co-depositing 33 volume % of the third material 30$v$ based on the total volume of the first material 30$p$ and the third material 30$v$.

Example 5

A photoelectric conversion device is manufactured according to the same method as Example 1, except that an 88 nm-thick photoelectric conversion layer is formed by co-depositing 50 volume % of the third material 30$v$ based on the total volume of the first material 30$p$ and the third material 30$v$.

Comparative Example 1

A photoelectric conversion device is manufactured according to the same method as Example 1, except that a 102 nm-thick photoelectric conversion layer is formed by co-depositing the first material 30$p$ and the third material 30$v$ without the second material 30$n$.

Comparative Example 2

A photoelectric conversion device is manufactured according to the same method as Example 1, except that a 102 nm-thick photoelectric conversion layer is formed by co-depositing the second material 30$n$ and the third material 30$v$ without the first material 30$p$.

[Chemical Formula 2B-1aa]

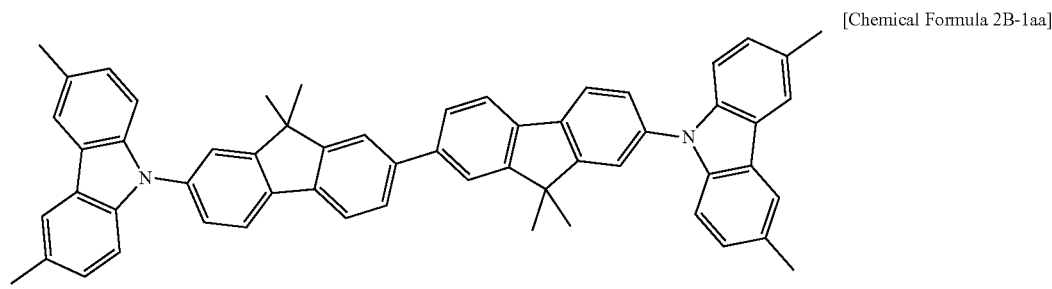

Evaluation II

Light absorption characteristics of the photoelectric conversion devices according to Examples and Comparative Examples are evaluated.

The light absorption characteristics are evaluated by using Cary 5000 UV spectroscopy (Varian Medical Systems Inc.) in a ultraviolet-visible (UV-Vis) spectrum.

The results are shown in Table 2.

TABLE 2

|  | $\lambda_{max}$ (nm) | FWHM (nm) |
| --- | --- | --- |
| Example 3 | 540 | 97.4 |
| Example 4 | 540 | 101 |
| Comparative Example 1 | 540 | 106 |
| Comparative Example 2 | 530 | 106 |

Referring to Table 2, the photoelectric conversion devices according to Examples exhibit improved wavelength selectivity without a maximum absorption wavelength change compared with the photoelectric conversion devices of comparative examples.

Evaluation III

Electrical characteristics of the photoelectric conversion devices according to Examples and Comparative Examples are evaluated.

Photoelectric conversion efficiency may be evaluated from external quantum efficiency (EQE) at a peak absorption wavelength ($\lambda_{max}$) in a wavelength spectrum of 400 nm to 720 nm in an Incident Photon to Current Efficiency (IPCE) method.

The results are shown in Table 3.

TABLE 3

|  | EQE ($\lambda_{max}$, %) |
| --- | --- |
| Example 1 | 70 |
| Example 2 | 71 |
| Example 3 | 69 |
| Example 4 | 68 |
| Comparative Example 1 | 69 |
| Comparative Example 2 | 52 |

Referring to Table 3, the photoelectric conversion devices of Examples exhibit equal or improved external quantum efficiency compared with the photoelectric conversion devices of Comparative Examples.

Evaluation IV

Remaining charge carrier characteristics of the photoelectric conversion devices according to Examples and Comparative Examples are evaluated.

The remaining charge carrier characteristics indicate an amount of charges photoelectrically converted in one frame but not used and remaining in the next frame and are evaluated by irradiating photoelectrically convertible light of a green wavelength spectrum to the devices of examples and comparative examples and turning the light off and then, obtaining a current amount measured by a $10^{-6}$ second unit with a Keithley 2400 equipment. An amount of remaining electrons is evaluated at 5000 lux by a h+/s/μm² unit.

The results are shown in Table 4.

TABLE 4

|  | Remaining electrons (h+/s/μm²) |
| --- | --- |
| Example 1 | 487 |
| Example 2 | 472 |
| Example 3 | 489 |
| Example 4 | 489 |
| Example 5 | 406 |
| Comparative Example 1 | 547 |

Referring to Table 4, the photoelectric conversion devices according to Examples exhibit improved remaining charge characteristics compared with the photoelectric conversion devices according to Comparative Example.

Evaluation V

Heat resistance properties of the photoelectric conversion devices according to Examples and Comparative Examples are evaluated.

The heat resistance properties are evaluated by examining each change of external quantum efficiency and remaining charges after annealing the photoelectric conversion devices according to Examples and Comparative Examples at 180° C. for 3 hours, at 190° C. for 1 hour, and at 200° C. for 1 hour.

The results are shown in Tables 5 and 6.

TABLE 5

|  | EQE (B/G/R, %) | | | |
| --- | --- | --- | --- | --- |
|  | Before annealing | 180 °C. (3 h) | 190 °C. (1 h) | 200 °C. (1 h) |
| Example 1 | 21/70/25 | 21/68/24 | 21/67/24 | 20/64/22 |
| Example 3 | 20/69/24 | 21/67/24 | 20/66/23 | 20/64/22 |
| Comparative Example 1 | 20/69/24 | 21/68/25 | 21/67/24 | Unmeasurable |
| Comparative Example 2 | 23/52/14 | 23/51/14 | 21/47/14 | Unmeasurable |

*unmeasurable: electrical characteristics are unmeasurable due to damages on thin films

TABLE 6

|  | Remaining electron (h+/s/μm²) | | | |
| --- | --- | --- | --- | --- |
|  | Before annealing | 180 °C. (3 h) | 190 °C. (1 h) | 200 °C. (1 h) |
| Example 1 | 487 | 106 | 75 | 67 |
| Example 3 | 489 | 100 | 71 | 57 |
| Example 4 | 489 | 93 | 70 | — |
| Example 5 | 406 | 78 | 59 | — |
| Comparative Example 1 | 547 | 112 | 80 | Unmeasurable |

* unmeasurable: electrical characteristics are unmeasurable due to damages on thin films Referring to Tables 5 and 6, the photoelectric conversion devices according to Examples exhibit high heat resistance and thus rather improved remaining charge characteristics as well as no large electrical characteristic change without damages on thin films after annealing them at a high temperature of about 200° C.

While this disclosure has been described in connection with what is presently considered to be practical example embodiments, it is to be understood that the inventive concepts are not limited to the disclosed embodiments. On the contrary, it is intended to cover various modifications and equivalent arrangements included within the spirit and scope of the appended claims.

What is claimed is:

1. A photoelectric conversion device, comprising:
a first electrode and a second electrode; and
a photoelectric conversion layer between the first electrode and the second electrode,
wherein the photoelectric conversion layer includes
a first material and a second material, the first material and the second material configured to collectively define a pn junction, and
a third material different from the first material and the second material, the third material including an electron withdrawing group,
wherein the third material is an organic material including an electron donating moiety, an electron accepting moiety, and a π-conjugated linking moiety, the π-conjugated linking moiety linking the electron donating moiety with the electron accepting moiety, and
wherein the electron donating moiety includes the electron withdrawing group.

2. The photoelectric conversion device of claim 1, wherein the electron withdrawing group includes a halogen; a cyano group; a nitro group; a C1 to C30 alkyl group substituted with a halogen, a cyano group, a nitro group, or a combination thereof; a C1 to C30 alkoxy group substituted with a halogen, a cyano group, a nitro group, or a combination thereof; a C3 to C30 cycloalkyl group substituted with a halogen, a cyano group, a nitro group, or a combination thereof; a C6 to C30 aryl group substituted with a halogen, a cyano group, a nitro group, or a combination thereof; or a C3 to C30 heteroaryl group substituted with a halogen, a cyano group, a nitro group, or a combination thereof.

3. The photoelectric conversion device of claim 1, wherein the electron withdrawing group includes fluorine, a cyano group, or a combination thereof.

4. The photoelectric conversion device of claim 1, wherein the third material is represented by Chemical Formula 1-1:

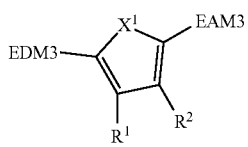

[Chemical Formula 1-1]

wherein, in Chemical Formula 1-1,
X1 is O, S, Se, Te, SO, SO2, CO, CR'R", NR'", SiRaRb, or GeRcRd,
EDM3 is the electron donating moiety,
EAM3 is the electron accepting moiety,
R1, R2, R', R", R'", and Ra, Rb, Rc, and Rd are independently hydrogen, deuterium, a substituted or unsubstituted C1 to C30 alkyl group, a substituted or unsubstituted C1 to C30 alkoxy group, a substituted or unsubstituted C6 to C30 aryl group, a substituted or unsubstituted C3 to C30 heteroaryl group, a halogen, a cyano group, or a nitro group, and R1 and R2, R' and R", Ra and Rb, and Rc and Rd are independently present or are linked with each other to form a ring, X1, EDM3, R1, R2, and EAM3 are independently present or adjacent two thereof are linked with each other to form a ring, and
EDM3 includes the electron withdrawing group.

5. The photoelectric conversion device of claim 4, wherein the third material is represented by one of Chemical Formulae 1-2 to 1-4:

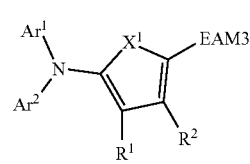

[Chemical Formula 1-2]

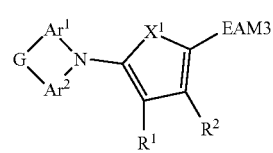

[Chemical Formula 1-3]

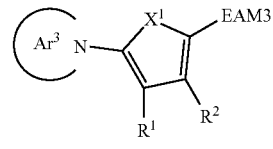

[Chemical Formula 1-4]

wherein, in Chemical Formulae 1-2 to 1-4,
$X^1$ is O, S, Se, Te, SO, SO$_2$, CO, CR'R", NR'", SiR$^a$R$^b$, or GeR$^c$R$^d$,
EAM3 is the electron accepting moiety,
Ar$^1$ and Ar$^2$ are independently hydrogen, deuterium, a substituted or unsubstituted C1 to C30 alkyl group, a substituted or unsubstituted C1 to C30 alkoxy group, a substituted or unsubstituted C3 to C30 cycloalkyl group, a substituted or unsubstituted C6 to C30 aryl group, or a substituted or unsubstituted C3 to C30 heteroaryl group,
at least one of Ar$^1$ or Ar$^2$ is a C1 to C30 alkyl group substituted with a halogen, a cyano group, a nitro group, or a combination thereof; a C1 to C30 alkoxy group substituted with a halogen, a cyano group, a nitro group, or a combination thereof; a C3 to C30 cycloalkyl group substituted with a halogen, a cyano group, a nitro group, or a combination thereof; a C6 to C30 aryl group substituted with a halogen, a cyano group, a nitro group, or a combination thereof; or a C3 to C30 heteroaryl group substituted with a halogen, a cyano group, a nitro group, or a combination thereof,
Ar$^3$ is a nitrogen-containing cyclic group substituted with a halogen, a cyano group, a nitro group, or a combination thereof,
G is a single bond, —O—, —S—, —Se—, —Te—, —N=, —NR$^e$—, —(CR$^f$R$^g$)$_{n2}$— (n2 is 1 or 2), —SiR$^h$R$^i$—, —GeR$^j$R$^k$—, —(C(R$^l$)=C(R$^m$))—, or SnR$^n$R$^o$, and
R$^1$, R$^2$, R', R", R'", R$^a$, R$^b$, R$^c$, R$^d$, R$^e$, R$^f$, R$^g$, R$^h$, R$^i$, R$^j$, R$^k$, R$^l$, R$^m$, R$^n$, and R$^o$ are independently hydrogen, deuterium, a substituted or unsubstituted C1 to C30 alkyl group, a substituted or unsubstituted C1 to C30 alkoxy group, a substituted or unsubstituted C6 to C30 aryl group, a substituted or unsubstituted C3 to C30 heteroaryl group, a halogen, a cyano group, or a nitro group, and R$^1$ and R$^2$, R' and R", R$^a$ and R$^b$, $R^c$ and $R^d$, $R^f$ and $R^g$, $R^h$ and $R^i$, $R^j$ and $R^k$, $R^l$ and $R^m$, and $R^n$ and $R^o$ are independently present or are linked with each other to form a ring.

6. The photoelectric conversion device of claim 5, wherein at least one of $Ar^1$ or $Ar^2$ of Chemical Formula 1-2 or 1-3 is a phenyl group substituted with a halogen, a cyano group, a nitro group, or a combination thereof; a naphthyl group substituted with a halogen, a cyano group, a nitro group, or a combination thereof; an anthracenyl group substituted with a halogen, a cyano group, a nitro group, or a combination thereof; a phenanthrenyl group substituted with a halogen, a cyano group, a nitro group, or a combination thereof; a pyridinyl group substituted with a halogen, a cyano group, a nitro group, or a combination thereof; a pyridazinyl group substituted with a halogen, a cyano group, a nitro group, or a combination thereof; a pyrimidinyl group substituted with a halogen, a cyano group, a nitro group, or a combination thereof; a pyrazinyl group substituted with a halogen, a cyano group, a nitro group, or a combination thereof; a quinolinyl group substituted with a halogen, a cyano group, a nitro group, or a combination thereof; an isoquinolinyl group substituted with a halogen, a cyano group, a nitro group, or a combination thereof; a naphthyridinyl group substituted with a halogen, a cyano group, a nitro group, or a combination thereof; a cinnolinyl group substituted with a halogen, a cyano group, a nitro group, or a combination thereof; a quinazolinyl group substituted with a halogen, a cyano group, a nitro group, or a combination thereof; a phthalazinyl group substituted with a halogen, a cyano group, a nitro group, or a combination thereof; a benzotriazinyl group substituted with a halogen, a cyano group, a nitro group, or a combination thereof; a pyridopyrazinyl group substituted with a halogen, a cyano group, a nitro group, or a combination thereof; a pyridopyrimidinyl group substituted with a halogen, a cyano group, a nitro group, or a combination thereof; or a pyridopyridazinyl group substituted with a halogen, a cyano group, a nitro group, or a combination thereof.

7. The photoelectric conversion device of claim 5, wherein at least one of $Ar^1$ or $Ar^2$ of Chemical Formula 1-2 or 1-3 is a fluorine-substituted phenyl group, a fluorine-substituted naphthyl group, a fluorine-substituted anthracenyl group, a fluorine-substituted phenanthrenyl group, a fluorine-substituted pyridinyl group, a fluorine-substituted pyridazinyl group, a fluorine-substituted pyrimidinyl group, a fluorine-substituted pyrazinyl group, a fluorine-substituted quinolinyl group, a fluorine-substituted isoquinolinyl group, a fluorine-substituted naphthyridinyl group, a fluorine-substituted cinnolinyl group, fluorine-substituted quinazolinyl group, a fluorine-substituted phthalazinyl group, a fluorine-substituted benzotriazinyl group, a fluorine-substituted pyridopyrazinyl group, a fluorine-substituted pyridopyrimidinyl group, or a fluorine-substituted pyridopyridazinyl group.

8. The photoelectric conversion device of claim 5, wherein the third material is represented by Chemical Formula 1-2a or 1-3a:

[Chemical Formula 1-2a]

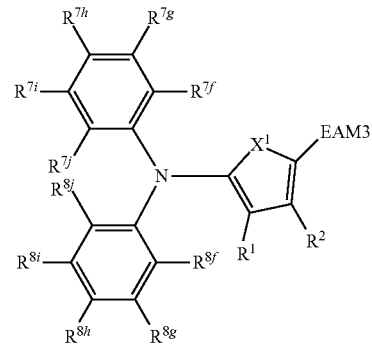

[Chemical Formula 1-3a]

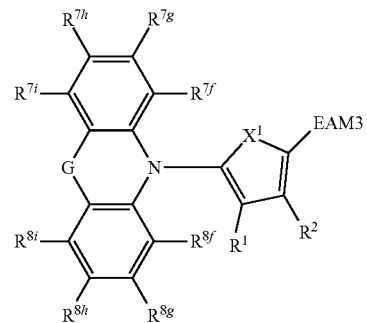

wherein, in Chemical Formula 1-2a or 1-3a,
$X^1$ is O, S, Se, Te, SO, $SO_2$, CO, CR'R'', NR''', $SiR^aR^b$, or $GeR^cR^d$,
EAM3 is the electron accepting moiety,
G is a single bond, —O—, —S—, —Se—, —Te—, —N=, —$NR^e$—, —$(CR^fR^g)_{n2}$— (n2 is 1 or 2), —$SiR^hR^i$—, —$GeR^jR^k$—, —$(C(R^l)=C(R^m))$—, or $SnR^nR^o$,
$R^1$, $R^2$, R', R'', R''', $R^a$, $R^b$, $R^c$, $R^d$, $R^e$, $R^f$, $R^g$, $R^h$, $R^i$, $R^j$, $R^k$, $R^l$, $R^m$, $R^n$, $R^o$, $R^{7f}$, $R^{7g}$, $R^{7h}$, $R^{7i}$, $R^{7j}$, $R^{8f}$, $R^{8g}$, $R^{8h}$, $R^{8i}$, or $R^{8j}$ are independently hydrogen, deuterium, a substituted or unsubstituted C1 to C30 alkyl group, a substituted or unsubstituted C1 to C30 alkoxy group, a substituted or unsubstituted C6 to C30 aryl group, a substituted or unsubstituted C3 to C30 heteroaryl group, a halogen, a cyano group, or a nitro group,
$R^{7f}$, $R^{7g}$, $R^{7h}$, $R^{7i}$, and $R^{7j}$ are independently present or adjacent two thereof are linked with each other to form a fused ring,
$R^{8f}$, $R^{8g}$, $R^{8h}$, $R^{8i}$, and $R^{8j}$ are independently present or adjacent two thereof are linked with each other to form a fused ring, and
at least one of $R^{7f}$, $R^{7g}$, $R^{7h}$, $R^{7i}$, $R^{7j}$, $R^{8f}$, $R^{8g}$, $R^{8h}$, $R^{8i}$, or $R^{8j}$ is an is the electron withdrawing group, the electron withdrawing group including
a halogen;
a cyano;
a nitro group;
a C1 to C30 alkyl group substituted with a halogen, a cyano group, a nitro group, or a combination thereof;
a C1 to C30 alkoxy group substituted with a halogen, a cyano group, a nitro group, or a combination thereof;

a C3 to C30 cycloalkyl group substituted with a halogen, a cyano group, a nitro group, or a combination thereof;

a C6 to C30 aryl group substituted with a halogen, a cyano group, a nitro group, or a combination thereof; or a C3 to C30 heteroaryl group substituted with a halogen, a cyano group, a nitro group, or a combination thereof.

9. The photoelectric conversion device of claim 5, wherein the EAM3 is one group of a set of groups listed in Group 1:

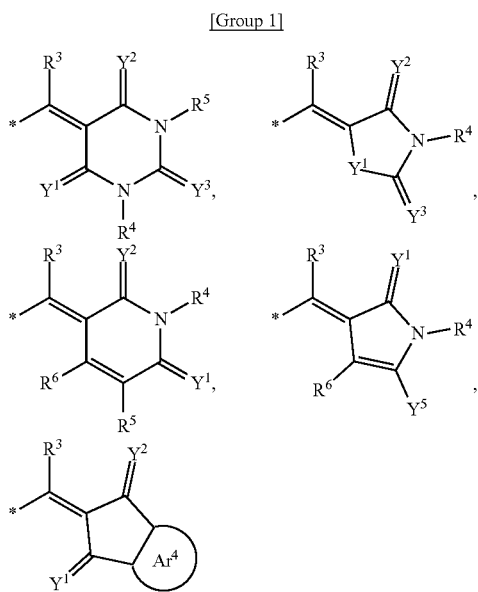

[Group 1]

wherein, in Group 1, $Y^1$, $Y^2$, and $Y^3$ are independently O, S, Se, Te, or $C(R^p)(CN)$, wherein $R^p$ is hydrogen, a cyano group, or a C1 to C10 alkyl group, $Ar^4$ is a substituted or unsubstituted C6 to C30 aromatic ring, a substituted or unsubstituted C3 to C30 heteroaromatic ring, or a fused ring of two or more of the substituted or unsubstituted C6 to C30 aromatic ring and the substituted or unsubstituted C3 to C30 heteroaromatic ring, $R^3$, $R^4$, $R^5$, and $R^6$ are independently hydrogen, deuterium, a substituted or unsubstituted C1 to C30 alkyl group, a substituted or unsubstituted C1 to C30 alkoxy group, a substituted or unsubstituted C6 to C30 aryl group, a substituted or unsubstituted C3 to C30 heteroaryl group, a halogen, a cyano group, or a nitro group, and

* is a linking point.

10. The photoelectric conversion device of claim 1, wherein at least one of the first material or the second material is an organic material.

11. The photoelectric conversion device of claim 1, wherein the first material is an organic material that does not include any electron withdrawing group.

12. The photoelectric conversion device of claim 1, wherein the first material is an organic material that does not include any fluorine.

13. The photoelectric conversion device of claim 1, wherein a highest occupied molecular orbital (HOMO) energy level of the third material is between a HOMO energy level of the first material and a HOMO energy level of the second material.

14. The photoelectric conversion device of claim 13, wherein the HOMO energy level of the first material is about 5.0 eV to about 5.8 eV, the HOMO energy level of the second material is about 6.2 eV to about 7.2 eV, and the HOMO energy level of the third material is about 5.1 eV to about 6.5 eV.

15. The photoelectric conversion device of claim 1, wherein the photoelectric conversion layer includes a mixture of the first material, the second material, and the third material.

16. The photoelectric conversion device of claim 1, wherein the photoelectric conversion layer comprises:

a first thin film layer, the first thin film layer including the first material and the third material, and a second thin film layer, the second thin film layer including the second material and the third material.

17. The photoelectric conversion device of claim 1, wherein the third material is included in an amount of less than or equal to about 50% by volume based on a total volume of the first material and the third material.

18. A photoelectric conversion device, comprising:

a first electrode and a second electrode; and a photoelectric conversion layer between the first electrode and the second electrode, wherein the photoelectric conversion layer includes a first material and a second material, the first material and the second material configured to collectively define a pn junction, and a third material different from the first material and the second material, the third material including an electron withdrawing group, wherein an absorption spectrum of the photoelectric conversion layer has a maximum absorption wavelength in a first wavelength spectrum which is one of a blue wavelength spectrum, a green wavelength spectrum, a red wavelength spectrum, or an infra-red wavelength spectrum, and wherein each of the first material and the third material is a light-absorbing material having a maximum absorption wavelength in the first wavelength spectrum.

19. The photoelectric conversion device of claim 18, wherein a full width at half maximum (FWHM) of the absorption spectrum of the photoelectric conversion layer is smaller than a FWHM of the absorption spectrum of a thin film formed of the first material and the second material.

20. The photoelectric conversion device of claim 1, wherein the photoelectric conversion layer is a ternary system of the first material, the second material, and the third material.

21. A sensor comprising the photoelectric conversion device of claim 1.

22. The sensor of claim 21, wherein the sensor is an image sensor, and the image sensor further comprises a semiconductor substrate stacked on the photoelectric conversion device.

23. An electronic device comprising the sensor of claim 21.

24. An electronic device comprising the photoelectric conversion device of claim 1.

25. A photoelectric conversion device, comprising:
a first material and a second material, the first material and the second material configured to collectively define a pn junction, and
a third material different from the first material and the second material, the third material including an electron withdrawing group,
wherein the third material is represented by Chemical Formula 1-1:

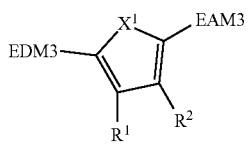

[Chemical Formula 1-1]

wherein, in Chemical Formula 1-1,
$X^1$ is O, S, Se, Te, SO, $SO_2$, CO, CR'R", NR''', $SiR^aR^b$, or $GeR^cR^d$,
EDM3 is an electron donating moiety,
EAM3 is an electron accepting moiety,
$R^1$, $R^2$, R', R", R''', and $R^a$, $R^b$, $R^c$, and $R^d$ are independently hydrogen, deuterium, a substituted or unsubstituted C1 to C30 alkyl group, a substituted or unsubstituted C1 to C30 alkoxy group, a substituted or unsubstituted C6 to C30 aryl group, a substituted or unsubstituted C3 to C30 heteroaryl group, a halogen, a cyano group, or a nitro group, and $R^1$ and $R^2$, R' and R", $R^a$ and $R^b$, and $R^c$ and $R^d$ are independently present or are linked with each other to form a ring,
$X^1$, EDM3, $R^1$, $R^2$, and EAM3 are independently present or adjacent two thereof are linked with each other to form a ring, and
at least one of EDM3, EAM3, $R^1$, $R^2$, R', R", R''', $R^a$, $R^b$, $R^c$, or $R^d$ includes the electron withdrawing group.

26. The photoelectric conversion device of claim 25, further comprising:
a first thin film layer, the first thin film layer including one material of the first material, the second material, or the third material and excluding another material of the first material, the second material, or the third material, and
a second thin film layer on the first thin film layer, the second thin film layer including the other material of the first material, the second material, or the third material and excluding the one material of the first material, the second material, or the third material.

27. The photoelectric conversion device of claim 26, wherein
the one material is the first material, and
the other material is the second material.

28. The photoelectric conversion device of claim 26, wherein
the first thin film layer includes both the first and second materials and excludes the third material, and
the second thin film layer includes the third material and excludes the first and second materials.

29. The photoelectric conversion device of claim 27, wherein
the first and second thin film layers both include the third material.

30. The photoelectric conversion device of claim 26, wherein
the second thin film layer is in direct contact with the first thin film layer.

31. The photoelectric conversion device of claim 25, further comprising:
separate first, second and third thin film layers, each separate thin film layer of the first, second, and third thin film layers including a different material of the first material, the second material, or the third material.

* * * * *